(12) United States Patent
Nishi et al.

(10) Patent No.: US 6,414,743 B1
(45) Date of Patent: Jul. 2, 2002

(54) EXPOSURE APPARATUS, EXPOSURE METHOD USING THE SAME AND METHOD OF MANUFACTURE OF CIRCUIT DEVICE

(75) Inventors: Kenji Nishi; Toru Kiuchi, both of Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/420,000

(22) Filed: Oct. 18, 1999

Related U.S. Application Data

(63) Continuation of application No. PCT/JP98/01776, filed on Apr. 17, 1998.

(30) Foreign Application Priority Data

Apr. 18, 1997 (JP) .............................. 9-101954
Apr. 22, 1997 (JP) .............................. 9-104978
Aug. 28, 1997 (JP) .............................. 9-233109

(51) Int. Cl.⁷ .......................................... G03B 27/72
(52) U.S. Cl. ............................. 355/69; 355/30; 355/53
(58) Field of Search ............................. 355/30, 53, 55, 355/68–71, 77; 250/548; 378/34–35

(56) References Cited

U.S. PATENT DOCUMENTS

| 4,701,606 | A |   | 10/1987 | Tanimoto et al. ........... 250/201 |
| 4,825,453 | A | * | 4/1989  | Kembo et al. ................ 378/34 |
| 5,172,403 | A | * | 12/1992 | Tanaka et al. ................ 378/34 |
| 5,424,552 | A | * | 6/1995  | Tsuji et al. .................. 250/548 |
| 5,610,684 | A | * | 3/1997  | Shiraishi ...................... 355/55 |
| 5,621,500 | A | * | 4/1997  | Shiraishi ...................... 355/71 |
| 5,677,757 | A | * | 10/1997 | Taniguchi et al. ............ 355/71 |
| 5,721,608 | A | * | 2/1998  | Taniguchi ..................... 355/53 |
| 5,892,573 | A |   | 4/1999  | Takahashi et al. ............ 355/69 |
| 5,894,341 | A | * | 4/1999  | Nishi et al. ................... 355/68 |
| 5,898,477 | A |   | 4/1999  | Yoshimura et al. ........... 355/53 |

FOREIGN PATENT DOCUMENTS

| JP | 2-106917 A  | 4/1990  |
| JP | 5-335208 A  | 12/1993 |
| JP | 5-343288 A  | 12/1993 |
| JP | 6-77107 A   | 3/1994  |
| JP | 6-204113    | 7/1994  |
| JP | 7-29810 A   | 1/1995  |
| JP | 2765422     | 4/1998  |
| JP | 10-116766 A | 5/1998  |

\* cited by examiner

Primary Examiner—Russell Adams
Assistant Examiner—Hung Henry Nguyen
(74) Attorney, Agent, or Firm—Armstrong, Westerman, Hattori, McLeland & Naughton, LLP

(57) ABSTRACT

An exposure method for irradiating a mask with an illumination light through an illumination optical system and exposing photosensitive substrate to the illumination light through a projection optical system including the steps of supplying gas having less absorption of the illumination light to a light path of the illumination light, at least a portion of the illumination optical system and the projection optical system; and changing an exposing condition for the photosensitive substrate in accordance with a variation in transmittance or in reflectance of at least one of the illumination optical system and the projection optical system, resulting from irradiation of the illumination light and attenuation of the illumination light in the light path.

21 Claims, 33 Drawing Sheets

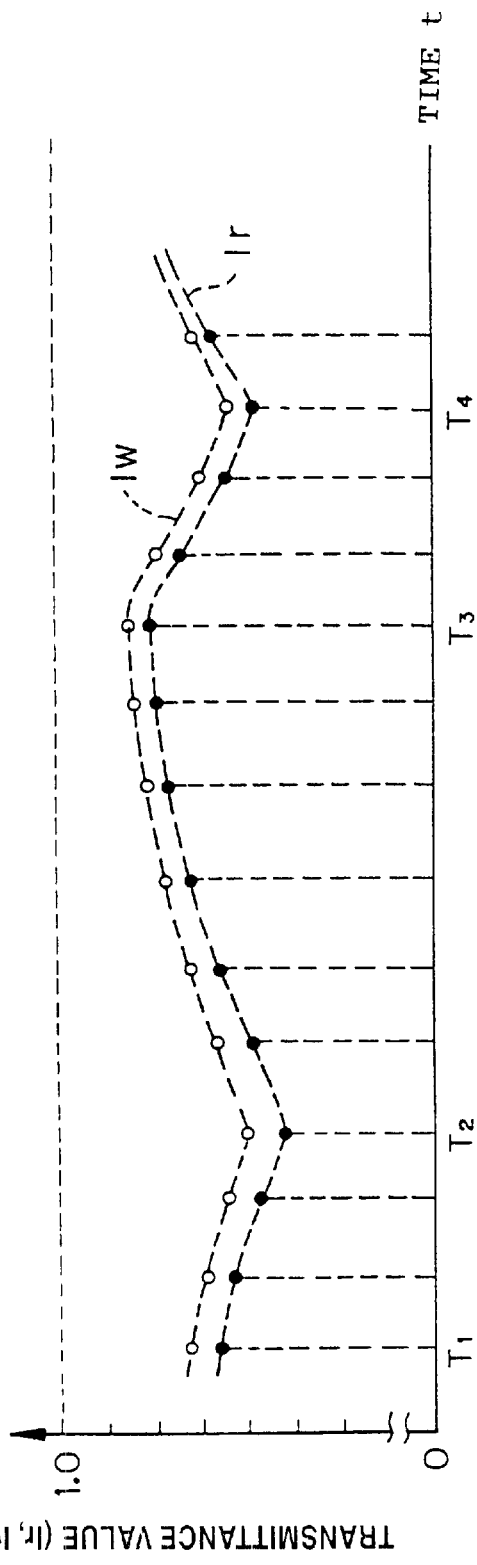
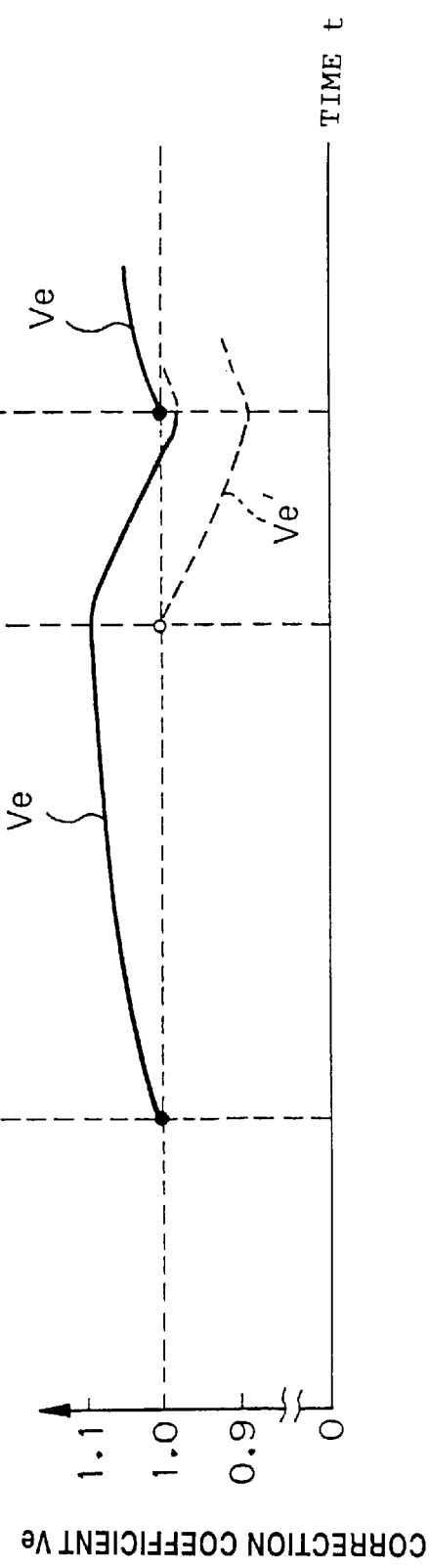
FIG.15A
FIG.15B

FIG.19A
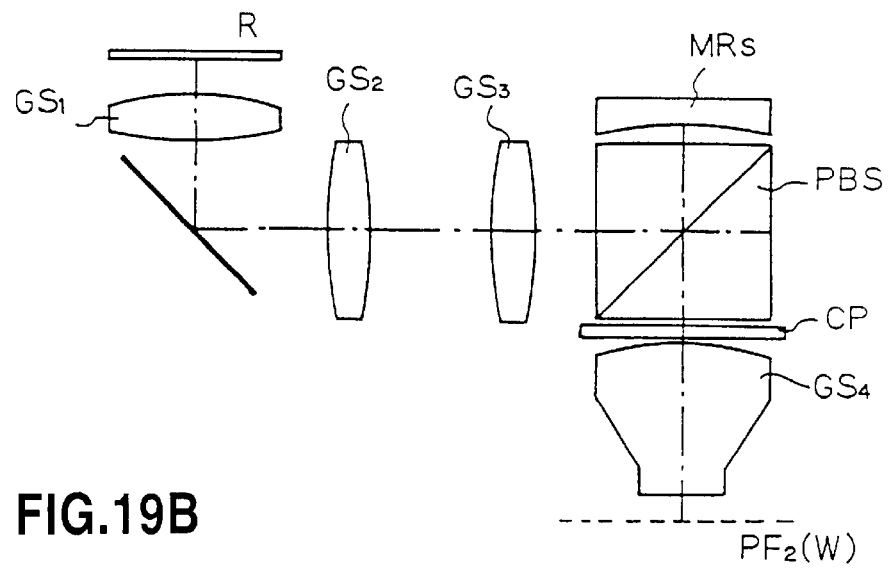
FIG.19B
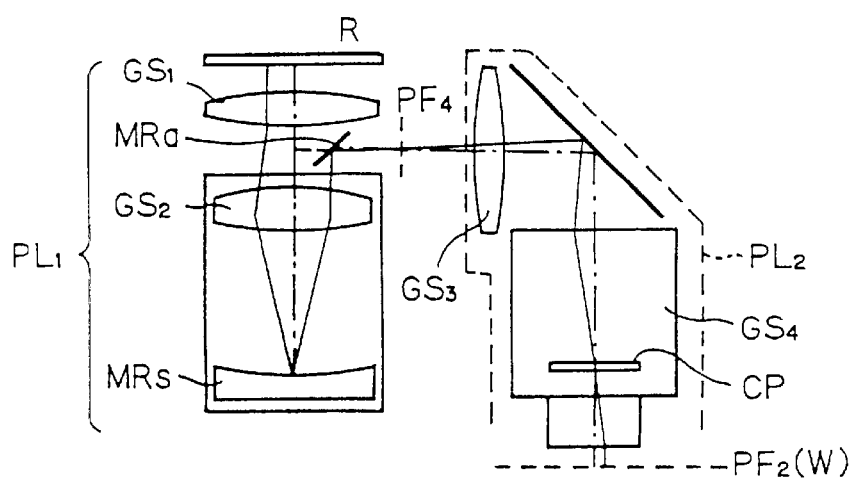
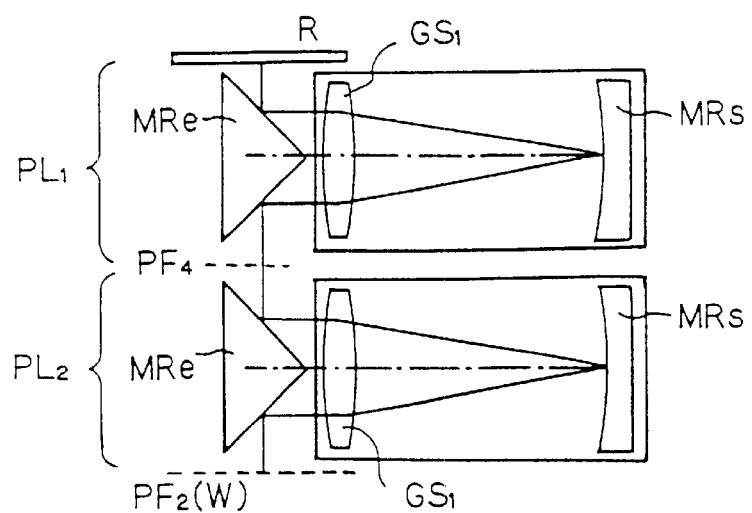
FIG.19C

FIG.31A
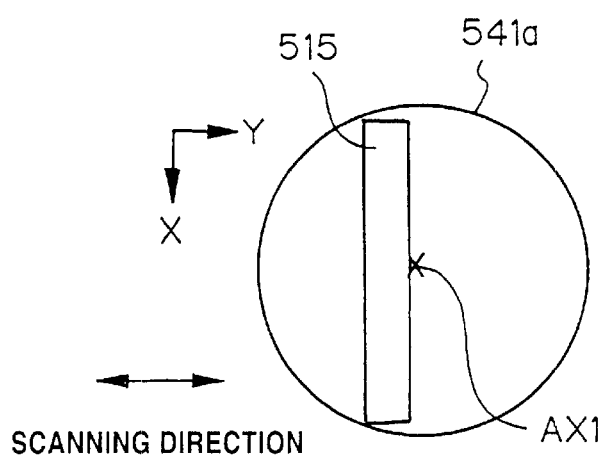
FIG.31B
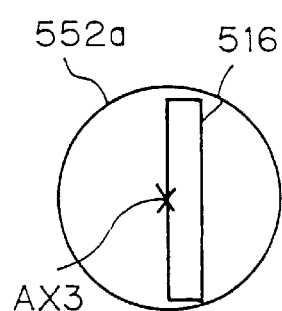
FIG.31C FIG.31D
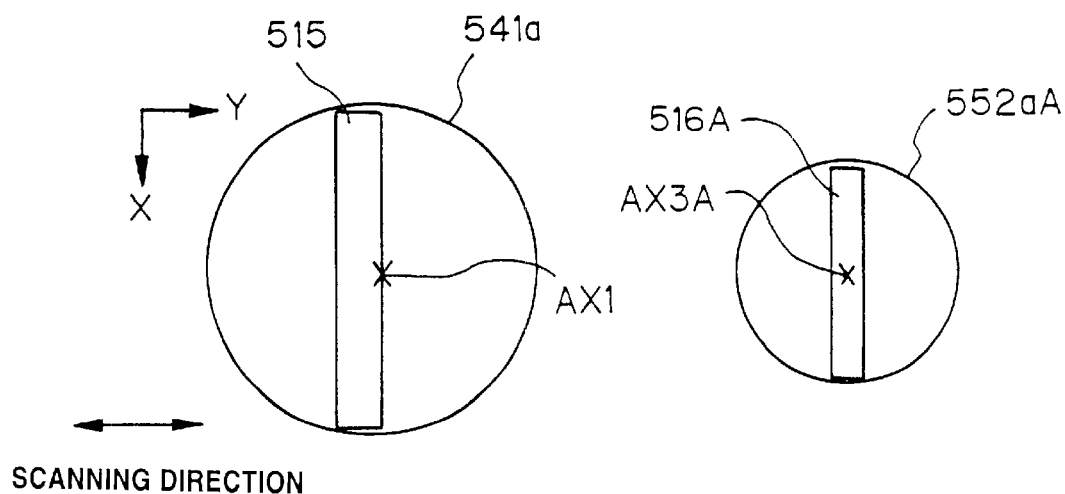

EXPOSURE APPARATUS, EXPOSURE METHOD USING THE SAME AND METHOD OF MANUFACTURE OF CIRCUIT DEVICE

This application is a continuation of international application PCT/JP98/01776 filed Apr. 17, 1998.

TECHNICAL FIELD

The present invention relates to an exposure apparatus for use in a lithography process in a production line for manufacturing semiconductor devices, liquid crystal display devices and an exposure method using such exposure apparatus. The present invention also relates to a method for manufacturing circuit devices for use in forming electronic circuit devices on a semiconductor substrate (wafer), glass substrate, and so on.

BACKGROUND TECHNOLOGY

Recently, at plants for manufacturing semiconductor devices such as super LSIs and so on, developments for mass-producing D-RAMs (memory chips), processor chips and the like, having a degree of integration and a fineness of a class of 256 Mbits on a large scale have been carried out extensively with great effort. As developments advance, exposure apparatuses for use in a next-generation lithography process (representatives being processes for coating a resist, exposing, developing resist, etc.) are also required to have a higher precision of alignment, a high resolution and a higher throughput.

At current times, at plants for manufacturing semiconductor devices, a reduced projection exposure apparatus of a step-and-repeat type has been used extensively, which uses i-rays having a wavelength of 365 nm, among emission line mainly from a mercury discharge lamp as illumination light for exposing. The projection exposure apparatus of this type is configured such that i-rays are irradiated as illumination light onto a reticle (a mask substrate) disposed on the object plane side of a projection optical system having a ⅕-fold reduction rate and a circuit pattern formed on the reticle is transcribed on a resist layer on a semiconductor wafer by means of a projection optical system. Further, the projection exposure apparatus of a step-and-repeat type is configured such that a stage with the wafer loaded thereon is transferred in a stepwise and two-dimensional manner in order to allow a sequential transcription of an image of a circuit pattern of the reticle in plural positions (shot regions) on the wafer.

Further, as a trend in these years, in order to avoid that a vision field of the projection optical system should become extremely large attendant upon enlarging a size (a chip size) of a circuit device to be formed on the wafer, a reduced projection exposure apparatus of a step-and-scan type draws attention, which step-and-scan type is to scan and expose an entire image of the circuit pattern of the reticle to the wafer by scanning the reticle in the vision field on the object plane side of the reduced projection optical system in a one-dimensional direction at an equal velocity and at the same time scanning the wafer in the vision field on the image plane side of the reduced projection optical system in a one-dimensional direction at an equal velocity.

Moreover, projection exposure apparatuses of a step-and-repeat type or of a step-and-scan type have been developed, which use ultraviolet pulse light having a wavelength of 248 nm from a KrF excimer laser light source as an exposing illumination light, and they have been begun being launched into production lines on a large scale. As such an excimer laser light source, an ArF excimer laser light source having a shorter wavelength (having a central wavelength of 193 nm) is now being developed, and it is promising in the future as an exposing light source.

In particular, in the case where such an ArF excimer laser light source is used for exposuring, it is required to narrow wavelength characteristics of pulse light to a wavelength that can avoid several absorption bands of oxygen that exist within the wavelength band in a naturally oscillating state of the pulse light. Further, it is required to replenish a majority of an illumination light path extending from the light source to the reticle and a projection light path extending from the reticle to the wafer with inert gases (such as nitrogen gas, helium gas, etc.), in order to provide an environment where oxygen is contained in the least possible amount in both of the such illumination light path and projection light path. An example of the projection exposure apparatus using such an ArF excimer laser light source is disclosed, for example, in U.S. Pat. No. 5,559,584 (Japanese Patent Application Laid-Open Nos. 6-260,385 and 6-260,386).

As an optical glass material for practical use having a desired transmittance for ultraviolet pulse light (wavelength of 250 nm or less) from the such excimer laser light source, there are currently known only two, one being quartz ($SiO_2$) and the other being fluorite ($CaF_2$). As a matter of course, although there are known other optical glass materials such as magnesium fluoride, lithium fluoride, and so on, they require to solve various problems with processing, durability, and so on before they are applied practically as an optical glass material for use with the projection exposure apparatus.

Moreover, in the case of use of quartz and fluorite for the projection exposure apparatus, achromatism in the projection optical system becomes difficult upon using illumination light. Therefore, a narrow-banded laser light source is preferred from the point of view of easiness of performing achromatism in the projection optical system.

It should be noted herein, however, that a band of such an excimer laser light is originally a broad band, so that a narrow-banded laser light source has its oscillating spectrum narrowed by injection locking, etc. From these reasons, the narrow-banded laser light source suffers from the disadvantages that a laser output is lowered as compared with a broad-band laser light source, and its life is shorter and its costs of production is more expensive than the broad-band laser light source. Therefore, the broad-banded laser light source is more favored in terms of the laser output, life and costs of production than the narrow-banded laser light source. Recently, attempts have been made to use a broad-banded laser light source for a projection optical system having a structure in which achromatism can be done easily.

There are known several types of projection optical systems to be mounted on the projection exposure apparatus. Among them, the types of the projection optical systems for exposure apparatuses which are used for large-scale commercial production lines can be divided into two major types, one being a dioptric type that is composed of a plurality of refractive optical elements (lens elements) only and the other being a catadioptric type that is composed of a combination of such refractive optical elements with reflective optical elements (particularly a concave mirror).

In the case of using a reflection-refraction optical system as of a catadioptric type, the concave mirror is free from chromatic aberration, so that achromatism can be effected easily by locating the concave mirror in a group of refractive lenses. As a result, a broad-banded laser light source can be used which is advantageous in terms of the laser output, life, etc. On the other hand, in the case of using a refractive optical system only as of a dioptric type, too, a broad-banded laser light source can be used because a range of achromatism can be widened by making a rate of fluorite contained in the entire refractive lenses larger.

In a current situation, however, even which type of the projection optical system is adopted, the refractive optical elements (light-transmitting optical elements) have to be used. Therefore, at this point of time, there is no way but using two kinds of glass materials, i.e. quartz and fluorite, for the refractive optical elements. Further, each of the refractive optical elements and the reflective optical elements is produced so as to achieve a desired performance as a single optical element by forming a multi-layer membrane such as a reflection preventive layer, a protective layer, etc. by deposition etc. on a surface of each element. The performance to which attention should be paid herein is how large an absolute value of transmittance or transmissivity of the single lens element or an absolute value of reflectance or reflectivity of the single reflective optical element can be set.

For instance, in the case of the single lens element, it is arranged so as to make transmittance as high as possible by coating a reflection preventive layer, etc. on both surfaces of the element, i.e. the incident surface to which the light is entered and the leaving surface from which the light leaves. In a high-precision imaging optical element of this kind, as much as 20–30 sheets of lens elements are to be used for achieving a high correction of various aberration characteristics. In such a case, a transmittance of the entire projection optical elements is reduced to a large extent even if a slight reduction in transmittance would occur in each lens element. In addition, it is required to make a reflectance of each reflective element larger even for the projection optical system containing a large number of reflective optical elements in a similar manner.

For instance, suppose that an imaging light path of the projection optical system is composed of 25 sheets of the lens elements and the transmittance is set to be 96% for each lens element, the transmittance e for the entire projection optical system becomes approximately 36% (0.96 to the 25th power). If it is assumed that a transmittance of each single lens element would be decreased by 1%, the transmittance e of the entire projection optical system is reduced to approximately 27.7% (0.95 to the 25th power).

In the case where the transmittance of the projection optical system is low, this can be improved by increasing the intensity (energy) of illumination light for exposing a circuit pattern image of a reticle onto a semiconductor wafer (a photosensitive substrate) and developing a photoresist for ultraviolet rays having a higher degree of photosensitivity. If such improvements could not be made, a throughput will be decreased due to an increase in a longer period of time for exposure. A decrease in throughput is unacceptable, because it results in higher costs for the production of devices. Therefore, it may be a one of possible solution to prepare an excimer laser light source having a higher output.

As a result of experiments for various exposure by a projection exposure apparatus having a relatively large field size using an excimer laser light source, however, a new phenomenon has been discovered in that a transmittance of an optical element or a coating material (for example, a thin membrane, such as a reflection preventive membrane, etc.) for the optical element in the projection optical system fluctuates in a dynamic mode by irradiation of illumination light of an ultraviolet wavelength region (a KrF excimer laser having a wavelength of 248 nm, an ArF excimer laser having a wavelength of 193 nm, etc.). This phenomenon has been found to occur for an optical element in an illumination optical system for illuminating a reticle and a reticle (a quartz plate) itself, too, in the same manner as described above, as well as for the optical element in the projection optical system.

It is considered that such phenomenon is caused by, for instance, attachment or penetration (floating) of impurities contained in gases (air, nitrogen gas, etc.) present in a space within the projection light path or the illumination light path, gaseous molecules of organic substances to be caused to generate from adhesive or the like to be used for fixing the optical element to the barrel, or impurities (for example, water molecules, hydrocarbon molecules or other substances for dispersing the illumination light) to be caused to generate from the inner wall of the barrel (for example, a coated wall surface for prevention of reflection, etc.) to the surface of the optical element or in the illumination light path.

As a consequence, severe problems may occur that the transmittance of the projection optical system or the transmittance of the illumination optical system may fluctuate to a great extent for a relatively short period of time. Such a great fluctuation of the transmittance results in a decrease in a precision for controlling the exposure amount to be provided on the photosensitive substrate, thereby deteriorating a fidelity of transcription of a fine pattern having a design line width of 0.25 to 0.12 micron to be transcribed on the substrate.

The projection exposure apparatus of a conventional type as disclosed, for example, in Japanese Patent Application Laid-Open No. 2-135,723 (U.S. Pat. No. 5,191,374) is configured such that the optical intensity of illumination light is detected at an appropriate portion in a light path in the illumination optical system and the intensity (energy per one pulse) of the pulse light from an excimer laser light source is adjusted so as to achieve an optimal exposure amount on the basis of the detected optical intensity. Therefore, the such conventional projection exposure apparatus suffers from the disadvantage in that no accurate control of the exposure amount can be performed because no fluctuation in the transmittance of the illumination optical system and the projection optical system behind the portion in the illumination light path is added thereto whatsoever, the portion in the illumination light path being the place where the intensity of the illumination light has been detected for controlling the exposure amount.

In addition, for the causes as described above, there is no assurance that the fluctuation in the transmittance of the projection optical system and the illumination optical system occurs in a uniform manner in the vision field on the image plane side of the projection optical system, so that there is the risk that irregularities of illuminance (or irregularities of the exposure amount) will occur against the projection optical system within the projection region of the pattern image conjugated with the illumination region of the illumination light on the reticle. Furthermore, there is the concern about an occurrence of the disadvantage that imaging characteristics (e.g., distortion, spherical aberration, astigmatism, coma aberration, etc.) of the projection optical system may vary to a subtle extent, attendant upon an occurrence of such irregularities of illuminance or otherwise.

SUMMARY OF THE INVENTION

Therefore, the present invention has the object to provide an exposure apparatus that can reduce deterioration in precision for controlling the exposure amount resulting from a fluctuation of illuminance or irregularities of illuminance on a photosensitive substrate or on a mask (reticle) which may occur due to a variation in transmittance or transmissivity of the projection optical system or the illumination optical system. The present invention has another object to provide an exposure apparatus can detect a variation in transmittance of the projection optical system or the illumination optical system at a semi-real time, even during a period of time of operations of exposure to the photosensitive substrate.

In another aspect, the present invention has a further object to provide an improved measurement method for measuring a transmittance in an image projection region of the projection optical system or measuring an average illuminance or an irregularity of illuminance in the image projection region of the projection optical system. In a further aspect, the present invention has a still further object to provide a method for manufacturing a circuit device that can form a pattern image of a circuit device on the substrate always at an appropriate amount of exposing light and in a favorable imaging state.

In a still further aspect, the present invention has an object to provide an exposure apparatus of a scanning type and an exposure method using the same, which can always provide the photosensitive substrate with an appropriate amount of exposing light, even if transmittance of the projection light path or the illumination light path would fluctuate during scanning the mask (reticle) and the photosensitive substrate in synchronism with the projection optical system.

A first mode of the present invention can be applied to an exposure apparatus comprising an irradiation means (a laser light source, a condenser lens system, etc.) for irradiating a pattern formed on a mask (reticle) with an exposing energy (excimer laser, fluorine laser, SOR rays having a wavelength of 50 nm or less, etc.) and a projection optical system for projecting an image of the pattern on the mask at a given position on a photosensitive substrate (wafer). The exposure apparatus is characterized by a reflecting member disposed in a Fourier transform plane or in at least a part of a plane in the vicinity thereof between an object plane and an image plane of the projection optical system, and which reflects the exposing energy incident from the object plane side of the projection optical system or an exposing energy incident from the image plane side of the projection optical system; a beam irradiation means which irradiates the exposing energy as measuring beams in a nearly collimated state from the object plane side or the image plane side of the projection optical system toward the reflecting member; a detection means which detects the energy reflected by the reflecting member and outputs a detection signal in accordance with the reflected energy; and an exposure control means (a processor, a light source control system, a main control system, etc.) which sets an exposing condition for the photosensitive substrate based on the detection signal from the detection means in order to reduce deterioration in a control precision for an amount of exposing light resulting from a variation in an attenuation factor (a variation in transmittance or in reflectance) of the projection optical system.

In another mode, the present invention is applied to a method for scanning-exposing an entire image of the pattern of a mask or reticle (R) on a substrate (wafer) to be exposed, which is carried by scanning the mask (reticle) and the substrate relative to the vision field of the projection optical system, while irradiating a portion of the pattern of the mask (reticle) with an exposing energy (ultraviolet laser light, etc.) having a wavelength of 250 nm or less and projecting a partial image of the pattern onto the substrate (a wafer) through a projection optical system. The method is characterized by the steps of; irradiating the exposing energy onto the reflecting member disposed in a Fourier transform plane formed between the object plane and the image plane of the projection optical system or at least at a portion in a plane in the vicinity of the Fourier transform plane prior to starting scanning exposure, and then detecting the intensity of an energy reflected from the reflecting member; and setting an exposing condition (updating database at step 328) for transcribing the entire image of the pattern of the mask on the substrate at a predetermined exposure amount in accordance with the intensity detected.

Further, the present invention is applied to a manufacturing method for forming a circuit device on the substrate by practicing a lithography process in which the circuit pattern of the mask (reticle) is irradiated with an exposing energy having a wavelength of 250 nm or less and then exposing the circuit pattern to each of plural positions on the substrate (wafer) one after another through the projection optical system while projecting the exposing energy. The method is characterized by the steps of; detecting the intensity of the exposing energy passing through a projection light path, including a portion of a variation by a transmittance of the projection optical system, through a reflecting member disposed in a Fourier transform plane formed in the projection light path of the projection optical system or at least at a portion in a plane in the vicinity of the Fourier transform plane; and setting an exposing condition (updating database at step 328) for exposing the substrate at a target exposure amount in order to reduce deterioration in precision for controlling the exposure amount resulting from a variation in an attenuation factor (a variation in transmittance or a variation in reflectance) of the projection optical system in accordance with the energy intensity detected.

In the first mode of the present invention, the exposure can be controlled so as to provide the photosensitive substrate always with an optimal exposure amount with a variation added thereto, even if the transmittance of the refractive (light-passing) optical elements constituting the irradiation system and the projection optical system would vary with time during the exposure operation.

Moreover, the present invention is configured such that the exposing energy reflected at the Fourier transform plane (pupil plane) of the projection optical system for projecting the pattern of the mask onto the photosensitive substrate can be detected in a photoelectric mode, so that, upon exposing a plurality of shot regions on the photosensitive substrate one after another, a portion of the exposing energy (monitoring beams for measuring) which underwent a variation in an attenuation factor (a variation in transmittance or a variation in reflectance) can be detected in a photoelectric mode in a short time during subsequent exposure of the shot regions.

The variation in the attenuation factor (the variation in transmittance or in reflectance) of the illumination optical system and the projection optical system can appear in a remarkable way, in particular when an ultraviolet light having a wavelength of 200 nm or less is used. It is also known that an ArF excimer laser light source, $F_2$ (fluorine) laser light source, etc. can be included in that category of the light. Therefore, in a projection exposure apparatus using such a laser light source, an error in controlling the exposure amount may occur due to a variation in the transmittance of the illumination optical system and the projection optical system. In the present invention, however, the reflecting member is disposed at a portion of the Fourier transform plane of the projection optical system, and a portion of the exposing energy passed through the projection optical system is allowed to be detected in a photoelectric mode at a nearly real time, thereby enabling reduction of an error due to the variation in the transmittance upon controlling the exposure amount.

One of the causes of an occurrence of a variation in the attenuation factor (a variation in transmittance or in reflectance) in the ultraviolet region below a wavelength of 200 nm or less is because of the physical properties of an optical glass material itself. Another cause is considered to be due to molecules of impurities to be attached to (or deposited on) such an optical glass material. Among those causes, in particular, the molecules of the impurities to be attached to the surface of the optical glass material may cause a decrease in an attenuation factor (transmittance or reflectance) in a monotonous way, if they are left non-removed and stayed as they are. However, once the exposing energy is irradiated, they would be caused to be decomposed chemically and to disperse in a space. As a consequence, the attenuation factor (transmittance or reflectance) is allowed to rise to its original value.

This means to cause the entire attenuation factor (transmittance or reflectance) of the projection optical system and the illumination optical system to fluctuate, each being incorporated with a number of optical elements, and it is difficult to monitor a history of irradiation and the like and to predict characteristics of a variation in the attenuation factor (transmittance or reflectance). In accordance with the present invention, however, the variation in transmittance can be detected in an accurate way without effecting complicated computation processing for conducting such a prediction. Therefore, the control of the exposure amount can be conducted in a precise manner on the basis of the detection.

Moreover, the exposing energy reaching the Fourier transform plane of the projection optical system from the illumination optical system through the projection optical system can be detected, so that the variation in the attenuation factor (the variation in transmittance or the variation in reflectance) of the entire system including both of the illumination optical system and the projection optical system can be detected in an accurate mode, thereby enabling the accurate control of the exposure amount.

A second mode of the present invention can be applied to a projection exposure apparatus comprising the irradiation means for irradiating the pattern formed on the mask (reticle) with the exposing energy (pulse light from the excimer laser light source) having a wavelength in an ultraviolet range; and the projection optical system for projecting an image of the pattern of the mask to a predetermined positions on the photosensitive substrate (wafer). The projection exposure apparatus is characterized by a first detection means which is disposed in the vision field of the projection optical system outside the image projection region (illumination region) on which the image of the pattern of the mask is projected, and which receives at least a portion of the exposing energy (a monitoring light) directed to the side of the photosensitive substrate through the projection optical system and outputs a detection signal in accordance with the intensity thereof; a second detection means which detects the intensity of the exposing energy in the predetermined positions in a light path extending from the light source disposed in the irradiation means and outputs detection signal in accordance with the intensity thereof; a variation detection means (a control processor) which detects a variation in an attenuation factor (transmittance or reflectance) for the exposing energy on the basis of the detection signal from each of the first detection means and the second detection means, the variation occurring at a light path in the irradiation means or at a light path in the projection optical system (PL); and an exposure control means (an exposure control unit containing a processor) which corrects an exposing condition so as to provide the photosensitive substrate with a desired exposure amount, when the variation in the attenuation factor (transmittance or reflectance) is detected by the variation detection means.

Further, a second mode of the present invention can be applied to a projection exposure apparatus for subjecting an entire image of the pattern of the mask on a photosensitive substrate by exposing and scanning them relative to each other, which is comprised of the irradiation means for irradiating the exposing energy (e.g., pulse light from the excimer laser light source) having a wavelength in an ultraviolet region, the projection optical system for projecting a partial image of the pattern onto the photosensitive substrate (wafer) by irradiating a portion of the pattern formed on the mask (reticle) with the exposing energy from the irradiation means, and the scanning mechanism (a stage, a drive control unit) for scanning the mask and the photosensitive substrate relative to the vision field of the projection optical system. The projection exposure apparatus is characterized by a restriction means (a reticle blind mechanism) which restricts an image pattern region (within an illumination region) where a partial image of the pattern of the mask is projected to a polygonal or arc-shaped region extending in a direction intersecting with a relative scanning direction in the vision field of the projection optical system; a detection means which is disposed in the vision field of the projection optical system and in a region outside the image projection region (illumination region) relating to the relatively scanning direction and which receives at least a portion of the exposing energy (a monitoring light) directed to the photosensitive substrate side through the projection optical system and outputs a detection signal in accordance with the intensity thereof; and an exposure control means (a main control system, an exposure control unit) which sets an exposing condition (an intensity of illumination light, a scanning velocity, an opening width of a blind, etc.) and controls the scanning exposure in accordance with the exposing condition.

The present invention further provides the exposing and scanning method which is characterized by the steps of: restricting the image projection region (defined by the illumination region) on which a partial image of the pattern is projected, upon scanning exposure, to a polygonal or arc-shaped region (set by the reticle blind mechanism) extending in a direction intersecting with the relative scanning direction within the vision field of the projection optical system; detecting the intensity of at least a portion of the exposing energy passing through a region outside the image projection region (corresponding to the illumination region) relating to the relative scanning direction in the vision field of the projection optical system prior to the start of the scanning exposure; and setting the exposing condition (the intensity of the illumination light, the scanning velocity, the opening width of the blind, etc.) for transcribing an entire image of the pattern on the substrate to be exposed at a desired exposure amount (an operation by the exposure control unit) prior to the start of the scanning exposure on the basis of the detected intensity thereof.

Furthermore, another mode of the present invention is applied to a manufacturing method for forming the circuit device on the substrate by practicing the lithography process involving projection exposing the circuit pattern formed on the mask (reticle) to each of plural positions (shot regions) on the substrate (wafer) one after another through the projection optical system by irradiating the circuit pattern with the exposing energy (for example, ultraviolet pulse laser) of an ultraviolet region having a wavelength of 250 nm or less; in which an deterioration in a precision of controlling the exposure amount by a variation in the attenuation factor (a variation in transmittance or a variation in reflectance) of the projection optical system, which may occur during projection exposing the image of the circuit pattern on the substrate one after another, can be reduced by carrying out the step for detecting a variation in the intensity of the exposing energy resulting from the variation in the attenuation factor (the variation in transmittance or the variation in reflectance) of the projection optical system, by detecting at least a portion of the exposing energy (a monitoring light) travelling toward the substrate side through an outer region of the image projection region (defined by the illumination region) in which the image of the circuit pattern of the mask to be formed within the vision field of the projection optical system, and the step (the operation processing by the exposure control unit) for setting the exposing condition (an intensity of illumination light, a scanning velocity, an opening width of a blind, etc.) for transcribing the circuit pattern onto the substrate at a given exposure amount on the basis of the variation in the detected intensity thereof.

In the second embodiment of the present invention, even if the attenuation factor (transmittance or reflectance) of a number of the light-transmitting optical elements and reflecting optical elements constituting the illumination system and the projection optical system would fluctuate during the exposing operation, the exposure can be controlled so as to provide the photosensitive substrate always with an optimal exposure amount, with the such fluctuation added thereto. Further, in this embodiment, the exposing energy can be detected in a photoelectric mode outside the image projection region on which the pattern of the mask is to be projected. With this configuration, the present invention can potoelectrically detect the portion of the exposing energy (the monitoring light) which is subjected influences from the variation of the attenuation factor (variation in transmittance or variation in reflectance) during a short period of time during which the plural shot regions on the photosensitive substrate are being exposed one after another.

It is known that the variation in the attenuation factor (variation in transmittance or variation in reflectance) of the illumination system and the projection optical system occurs to a remarkable extent, particularly when ultraviolet light having a wavelength of 200 nm or less is used, and that an ArF excimer laser light source is one of such light sources having such a wavelength region. Therefore, a conventional projection exposure apparatus using such an ArF laser light source has an error which may occur in controlling the exposure amount due to a variation in the attenuation factor (variation in transmittance or variation in reflectance) of the illumination system and the projection optical system. In the embodiment of the present invention, however, it is modified so as to reduce an error that may be caused by such a variation in the attenuation factor (variation in transmittance or variation in reflectance) by photoelectrically detecting the exposing energy passed through the projection optical system at a nearly real time.

With those configuration, like the first embodiment as described above, the second embodiment of the present invention can detect the variation in the attenuation factor (variation in transmittance or variation in reflectance) in a precise mode and perform an accurate control of the exposure amount even without conducting a complex prediction computation.

In the third embodiment of the present invention, the projection exposure apparatus for transcribing a transcribing pattern on a mask onto a photosensitive substrate by irradiating the transcribing pattern with an illumination light in an ultraviolet wavelength region and projecting the transcribing pattern onto the photosensitive substrate through the projection optical system, which is characterized by a sensing means for sensing a variation in an attenuation factor (variation in transmittance or variation in reflectance) of the projection optical system, which depends upon irradiation of the illumination light of an ultraviolet wavelength region, and by a control unit that can maintain an illuminance of the illumination light on the photosensitive substrate at a nearly constant level during exposure on the basis of an output from the sensor.

In this embodiment, a sensor (604A) for sensing the variation in the attenuation factor (variation in transmittance or variation in reflectance) of the projection optical system as the sensing means is disposed, so that an occurrence of a variation in illuminance or irregularity of illuminance on the photosensitive substrate due to the variation in the transmittance can be prevented.

Further, such a sensor for sensing the variation in the attenuation factor (variation in transmittance or variation in reflectance) is preferably configured such that it can receive a portion of light reflected from the photosensitive substrate. The sensor of such a type can sense a variation in illuminance of the illumination light on the photosensitive substrate during exposure.

Moreover, it is preferred to provide a light receipt element for receiving a portion of the illumination light having an ultraviolet wavelength region incident to the mask, and to use an output from each of the light receipt element and the sensor (604A) for the control unit. This configuration can correct an error in the exposure amount on the photosensitive substrate which may occur due to the variation in the attenuation factor (variation in transmittance or variation in reflectance) as described above, based on the output of the sensor (604A), upon controlling the accumulated light quantity on the photosensitive substrate to an optimal dose amount on the basis of the output from the light receipt element.

Moreover, in this embodiment of the present invention, it is desired to measure an average illuminance (i.e., an accumulated exposure amount) at least in the exposure region of the projection optical system or an irregularity of illuminance values in the exposure region of the projection optical system as an illuminance of the illumination light on the photosensitive substrate. This allows an appropriate control of the exposure amount in the exposure region on the projection optical system to an optimal value.

In another mode of this embodiment of the present invention, the projection exposure apparatus for transcribing a transcribing pattern on a mask onto a photosensitive substrate by irradiating the transcribing pattern on the mask with the illumination light of the ultraviolet wavelength region, and for projecting the transcribing pattern onto the photosensitive substrate through the projection optical system, which is characterized by a sensor (604A) for sensing a variation in an imaging characteristic (for example, a magnification of projection, a focal position and at least one of five aberrations of Seidel) of the projection optical system on the basis of the variation in the attenuation factor (variation in transmittance or variation in reflectance) of the projection optical system, which depends upon the irradiation of the illumination light of the ultraviolet wavelength region, and by a control unit for controlling the imaging characteristic of the projection optical system on the basis of an output from the sensor.

With the configuration of the sensor (604A) for sensing the variation in the imaging characteristics of the projection optical system in the manner as described above, the present invention can prevent a variation in the imaging characteristics of the projection optical system to be caused due to the variation in the attenuation factor (variation in transmittance or variation in reflectance) as described above.

In a further mode of this embodiment of the present invention, the projection exposure apparatus for transcribing a transcribing pattern on a mask sequentially onto a photosensitive substrate by irradiating the transcribing pattern with the illumination light of an ultraviolet wavelength region and by transferring the mask and the photosensitive substrate in synchronization with the projection optical system, which is characterized by an adjustment device for adjusting at least one of an intensity of the illumination light on the photosensitive substrate, a scanning velocity for scanning the photosensitive substrate, and a width of the illumination region of the illumination light involved in the scanning direction of the photosensitive substrate, on the basis of the variation in the attenuation factor (variation in transmittance or variation in reflectance) of the projection optical system depending upon the irradiation of the illumination light of the ultraviolet wavelength region.

With the configuration as described above, the present invention can always provide the photosensitive substrate with an optimal exposure amount even if the attenuation factor (variation in transmittance or variation in reflectance) of the projection optical system would fluctuate during the movement of the mask and the photosensitive substrate in synchronism with each other.

In this embodiment of the present invention, when the illumination light of the ultraviolet wavelength region is pulse light, it is preferred to adjust at least one of a frequency of oscillation of the pulse light, the intensity of the illumination light, the scanning velocity for scanning the photosensitive substrate, and the width of the illumination region.

In another embodiment of the present invention, the method for the production of micro devices (for example, semiconductor elements, image pickup elements (CCDs, etc.), liquid crystal display elements, or thin film magnetic heads) is carried out by a method for the production of the micro devices, including a photolithography process in which a device pattern is irradiated with an illumination light of an ultraviolet wavelength region and an image of the device pattern to be projected by the projection optical system is exposed to a substrate, which is characterized by detecting an illuminance of the illumination light on the substrate, and an irregularity of illuminance and an image characteristic of the device pattern (for example, a magnification, focal position and at least one of the five aberrations of Seidel) on the basis of the variation in the attenuation factor (variation in transmittance or variation in reflectance) of the projection optical system which may be caused by the irradiation of the illumination light of the ultraviolet wavelength region during exposure.

With the configurations as described above, the present invention can expose the image of the device pattern to the substrate always at an optimal exposure amount and in a good imaging state, thereby enabling the production of the micro devices without reducing a yield rate of production, even if the transmittance of the projection optical system would vary.

BRIEF DESCRIPTION OF THE DRAWINGS

FIGS. 15a an 15b is each a graph showing an example of a variation characteristic between a value corresponding to the transmittance measured and a correction coefficient for correcting an exposing condition.

FIGS. 19A–C is each a view showing a brief configuration of various projection optical systems loadable on a projection exposure apparatus to which the present invention is applicable.

FIGS. 31a–b is each a view for explaining the relationship between an illumination region and an exposure region of the projection optical system PL as shown in FIG. 30 and a variation in the exposure region.

BEST MODES FOR CARRYING OUT THE INVENTION

Figure 1:
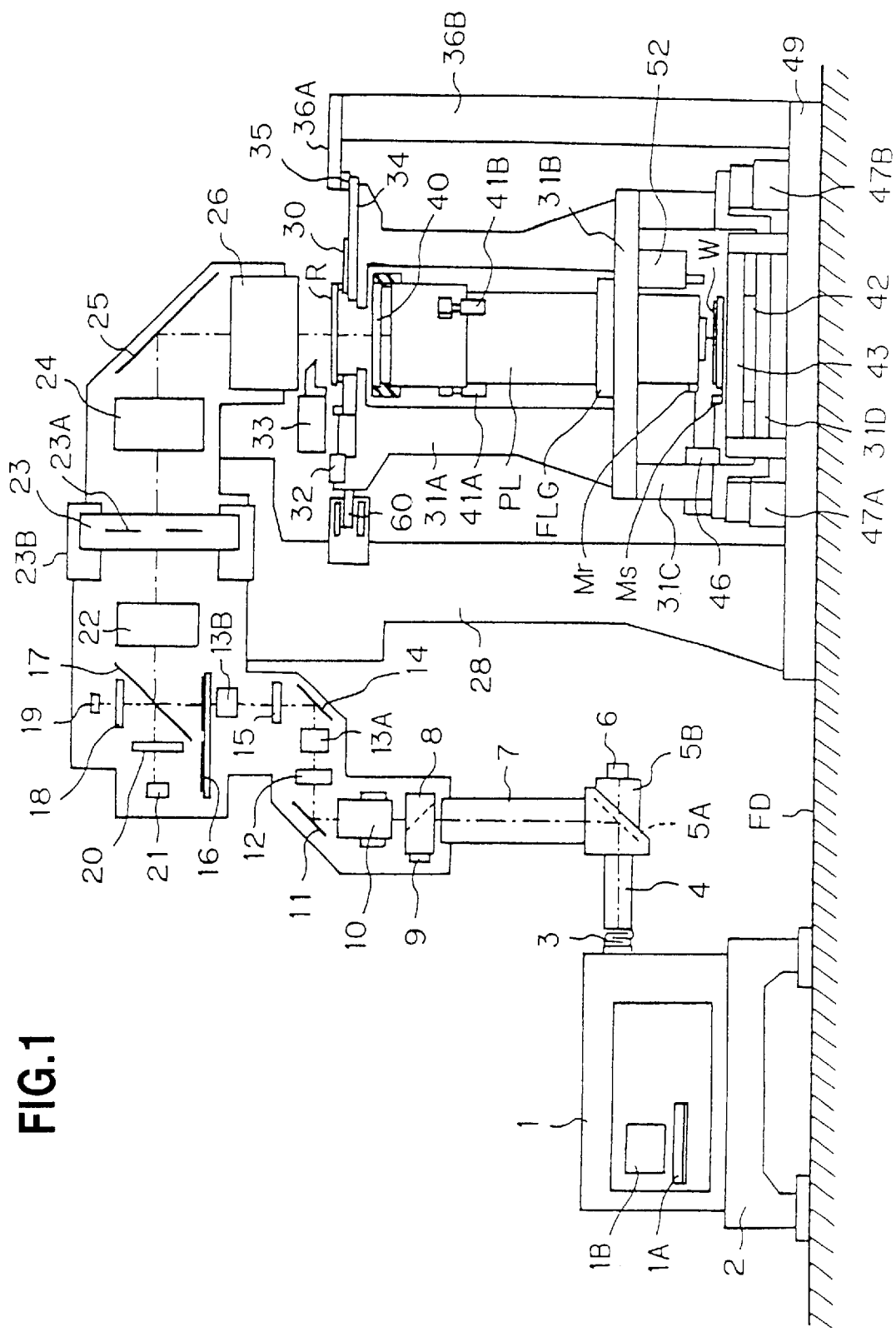
FIG. 1 is a view showing an entire construction of a projection exposure apparatus suitable for use in practicing the first embodiment of the present invention.

A description will be made of the overall construction of a projection exposure apparatus suitable for practicing the first embodiment of the present invention with reference to FIG. 1. FIG. 1 shows a projection exposure apparatus of a step-and-scan type which is so adapted as to scan a semiconductor wafer W relative to a reticle R while projecting a circuit pattern of the reticle R onto the semiconductor wafer W through an projection optical system PL using an ArF excimer laser light source 1 which is narrowed so as to avoid an absorption band of oxygen between ranges of wavelengths of 192 nm to 194 nm.

As shown in FIG. 1, the main body of the ArF excimer laser light source 1 is equipped through a vibration proofing table 2 on a floor portion FD inside a clean room, or outside the clean room in some cases, of a semiconductor manufacture plant. The main body of the ArF excimer laser light source 1 is provided with a light source control system 1A for exclusive use, including an input unit such as, for example, a keyboard, a touch panel and so on, and a display 1B. The light source control system 1A is so designed as to automatically control the central wavelength of oscillation of pulse light rays generated from the excimer laser light source 1, the trigger of pulse oscillation, gases in a laser chamber, and so on.

Ultraviolet pulse light rays narrowed to be generated from the ArF excimer laser light source 1 is transmitted through a light shielding bellows 3 and a pipe 4 to a movable mirror 5A disposed inside a beam matching unit (BMU) that matches the position of a light path with the main body of the exposure apparatus, and the ultraviolet pulse light rays are reflected by the movable mirror 5A and then transmitted through a light shielding pipe 7 to a beam splitter 8 for use in detecting the quantity of light. The beam splitter 8 allows a majority of the quantity of light to pass therethrough and a slight portion of the light (for example, about 1%) to be reflected toward a light quantity detector 9.

The ultraviolet pulse light rays passed through the beam splitter 8 are then incident to a variable light extinction system 10 that can adjust the intensity of the ultraviolet pulse light rays as well as arrange for the sectional shape of the beam. The variable light extinction system 10 is so configured as to contain a drive motor and adjust a light extinction rate of the ultraviolet pulse light rays in a stepwise or non-stepwise mode in accordance with an instruction from a main control system, although not shown in FIG. 1.

The movable mirror 5A is so arranged as to adjust a direction of a reflective plane in a two-dimensional manner by an actuator 5B. In this embodiment, the actuator 5B is subjected to a feed-back or feed-forward control on the basis of a signal from a detector 6 that receives beams for monitoring the position of the beams in which the beams are generated coaxially with the ultraviolet pulse light rays emitted from a visible laser light source (e.g., semiconductor laser, He—Ne laser, or the like) built in the excimer laser light source 1.

In order to adapt the movable mirror 5A to the situation as described above, the movable mirror 5A is configured such that it has a high transmittance or transmissivity with respect to the wavelength of the beam for use in monitoring the position of the beams and a high reflectance with respect to the wavelength of the ultraviolet pulse light rays. On the other hand, the detector 6 may comprise a four-part split sensor, CCD image pickup element or the like, which can photoelectrically detect a variation in the position of receiving the beams for monitoring the position which has passed through the movable mirror 5A. The actuator 5B for inclining the movable mirror 5A may be driven in response to a signal from an acceleration sensor or a position sensor, each being so adapted as to detect the vibration of the main body of the exposure apparatus with respect to the floor portion FD, in place of the signal from the detector 6.

The ultraviolet pulse light rays passed through the variable light extinction system 10 may be irradiated on the reticle R through an illumination optical system. The illumination optical system may comprise a fixed mirror 11 disposed along a predetermined light axis AX, a condenser lens 12, a first fly-eye lens 13A acting as an optical integrator (homogenizer), a vibration mirror 14 for decreasing coherency, a condenser lens 15, a second fly-eye lens 13B, an exchangeable space filter 16 for shifting a distribution of light source images, a beam splitter 17, a first imaging lens system 22, a reticle R blind mechanism 23 containing a vision field stop opening 23A for shaping an illumination area on the reticle R onto a rectangular slit, a second imaging lens system 24, a reflective mirror 25, and a main condenser lens system 26.

The ultraviolet pulse light rays emitted from the space filter 16 and passed through the beam splitter 17 may be received in the amount of approximately several percentage by a photoelectric detector 19 through an optical system 18 including a light condenser lens and a dispersing plate. In this embodiment, basically, a signal detected in a photoelectric mode by the photoelectric detector 19 is subjected to operation processing (a detailed description will be made with reference to FIG. 10) with a processing circuit for controls of the quality of exposure light, and conditions for exposure at the time of the scanning exposure will be determined on the basis of the results of the operation processing.

As shown in FIG. 1, a light condensing lens system 20 and a photoelectric detector 21, which are disposed on the left-hand side of the beam splitter 17, photoelectrically detect the reflected light of the illumination light for exposure irradiated onto the wafer W as the quality of light through the main condenser lens system 26 from the projection optical system PL. The reflectivity of the wafer W is detected on the basis of the photoelectric signal.

With the configuration as described above, the incident plane of the first fly-eye lens 13A, the incident plane of the second fly-eye lens 13B, the plane of the vision field stop opening 23A of the reticle R blind mechanism 23, and the pattern plane of the reticle R are conjugated optically with one another. The light source plane formed on the leaving plane side of the first fly-eye lens 13A, the light source plane formed on the leaving plane side of the second fly-eye lens 13B, and a Fourier transform plane (the leaving pupil plane) of the projection optical system PL are set so as to be conjugated optically with one another. These elements comprises a Koehler illumination system. Therefore, the ultraviolet pulse light rays are converted into an illumination light having a uniform intensity distribution by the plane of the vision field stop opening 23A in the reticle blind mechanism 23 and the pattern plane of the reticle R. At least one of the first fly-eye lens 13A and the second fly-eye lens 13B may be disposed to act as a rod integrator which has the incident plane set so as to be conjugated optically with the Fourier transform plane of the projection optical system PL or otherwise, and the leaving plane set so as to be conjugated optically with the pattern plane of the reticle R or otherwise.

The vision field stop opening 23A in the blind mechanism 23 in this embodiment is disclosed, for example, in Japanese Patent Application Laid-Open No. 4-196,513 (U.S. Pat. No. 5,473,410). The vision field stop opening is shown therein to extend in a linear slit form or a rectangular form in a direction perpendicular to the scanning exposure direction at a center of a circular vision field of the projection optical system PL. Further, the blind mechanism 23 is provided with a movable blind for making the width of the illumination region from the vision field stop opening 23A variable in the scanning exposure direction on the reticle R. The movable blind can serve as reducing strokes at the time of scaning-transferring the reticle R and decrease the width of a light shielding band on the reticle R, as disclosed in Japanese Patent Application Laid-Open No. 4-196,513.

The ultraviolet pulse illumination light rays, the intensity of which have been distributed in a uniform mode by the vision field stop opening 23A of the blind mechanism 23, is incident to the main condenser lens system 26 through the imaging lens system 24 and the reflective mirror 25. The ultraviolet pulse illumination light rays uniformly irradiate a portion of the circuit pattern region on the reticle R in a form that resembles the slit-shaped or rectangle-shaped opening section of the vision field stop opening 23A.

As shown in FIG. 1, the illumination optical system extending from the beam splitter 8 to the main condenser lens system 26 is disposed in an illumination system housing (not shown) in which the inside is set airtight against the air outside the housing. The illumination system housing is mounted on a support column 28 disposed standing on a portion of a base 49 for locating the main body of the exposure apparatus on the floor portion FD. The illumination system housing may be filled with clean and dried gases, such as nitrogen, helium, or the like, so as to reduce the concentration of the air (oxygen) to several percentages or less, preferably less than 1%.

On the other hand, the reticle R is adsorbed on a reticle R stage 30 and fixed thereto, and the reticle R stage 30 is disposed such that it is transferred by a drive unit 34 including a linear motor and so on in a one-dimensional way at a given velocity Vr in a light-and-right direction (a Y-direction) in FIG. 1 at the time of the scanning exposure, while the position of the reticle R stage 30 is measured on a real time basis by a laser interferometer 32. The laser interferometer 32 can measure a variation in position and rotation in a non-scanning direction (an X-direction) on a real-time basis, in addition to a variation in the position in the direction (Y-direction) of scanning the reticle R stage 30, and a drive motor (a linear motor, a voice coil motor, etc.) can drive the reticle R stage 30 so as to sustain the variation in the position and rotation in a given state, to be measured at the time of the scanning exposure.

The reticle R stage 30, the laser interferometer 32, and the drive unit 34 are each mounted above a support column 31A of the main body of the exposure apparatus. On a top end portion of the support column 31A to which the drive unit 34 (a stator of a linear motor) is to be fixed, an actuator is mounted. The actuator is so disposed as to absorb a reaction force in the scanning direction which may occur during the period of time for acceleration or during the period of time for deceleration at the time of transferring the scanning of the reticle R stage 30. The stator of the actuator 35 is fixed to a support column 36B standing on a portion of the base 49 through a mounting member 36A.

As the reticle R is irradiated with ultraviolet pulse illumination light rays, the light passed through an irradiation portion of the circuit pattern of the reticle R is incident to the projection optical system PL. An image of a portion of the circuit pattern is imaged on a center of the circular vision field on the image plane side of the projection optical system PL through the slit-shaped or rectangle-shaped (polygon-shaped) member whenever the ultraviolet pulse illumination light rays are irradiated on the circuit pattern of the reticle R. Such a projected partial image of the circuit pattern is then transcribed on a resist layer on the surface in a one shot region out of plural shot regions on the wafer W disposed on the imaging plane of the projection optical system PL.

An image distortion correction plate (quartz plate) 40 is disposed on the reticle R side of the projection optical system PL so as to reduce dynamic distortion aberration, particularly random distortion features, which may occur at the time of the scanning exposure. The surface of the correction plate 40 is polished locally in the order of wavelength so as to minutely deviate main light rays of a partially imaging light flux in a projection field.

The projection optical system PL is provided with actuators 41A and 41B which can automatically adjust imaging features (e.g., projection magnification or a certain kind of distortion) on the results of various detection by transferring a particular inner lens element in a direction parallel to the optical axis or inclining it at a very minute angle, such detection including detection of a distorted state of the shot region on the wafer W to be exposed, detection of a variation in temperature of a medium (an optical element or gases to be filled therein) present in a projection light path, and detection of a variation in an inner pressure in the projection optical system PL with a variation in atmospheric pressure.

Moreover, the projection optical system PL in this embodiment may comprise only a refractive optical element (quartz lens or fluorite lens), and the side of an object (reticle R) and the side of an image (wafer W) are both of a telecentric system.

The wafer W is adsorbed on and fixed to a wafer stage 42 that may be disposed so as to be transferred in a two-dimensional way along an X- and Y-plane parallel to an image plane of the projection optical system PL. The position of the wafer stage 42 is measured on a real-time basis by a laser interferometer 46 for measuring a variation in position of a moving mirror Ms fixed to a portion of the wafer stage 42 with respect to a reference mirror Mr fixed to the bottom end of a mirror cylinder of the projection optical system PL. The wafer stage 42 is transferred in a two-dimensional way on a stage base plate 31D on the basis of the results of measurement by a drive unit 43 including a plurality of linear motors.

The stator of the linear motor constituting the drive unit 43 is mounted on the base 49 through a support frame discrete from the base plate 31D so as to transmit a reaction force directly to the floor portion FD, rather not to the base plate 31D, which reaction force may occur during the period of time of acceleration or deceleration in transferring the wafer stage 42. Therefore, no reaction force is applied whatsoever to the main body of the exposure apparatus upon transferring the wafer stage 42 at the time of the scanning exposure, so that vibration or stress occurred in the main body of the exposure apparatus can be reduced to a greater extent.

It is to be noted herein that the wafer stage 42 is transferred at an equal velocity Vw in a right-and-left direction (Y-direction) in FIG. 1 during the period of time of the scanning exposure and transferred in a stepwise way in X- and Y-directions. On the other hand, the laser interferometer 46 measures the variation in position in the X-direction and a rotational direction of the wafer stage 42 on a real-time basis, in addition to the variation in position in the Y-direction of the wafer stage 42, and the drive motor (linear motor, etc.) of the drive unit 34 is operated so as to servo-drive the wafer stage 42 so as to bring the variation in the such positions to be measured during the period of time for scanning exposure into a given state.

Information on the variation in the rotation of the wafer stage 42 measured by the laser interferometer 46 may be transmitted to the drive unit 34 of the reticle R stage 30 through a main control system on a real-time basis. An error of the variation in the rotation on the wafer side can be controlled so as to compensate for controls of rotation on the reticle R side.

It is to be noted herein that four corners of the stage base plate 31D are supported on the base 49 through vibration-proofing tables 47A and 47B (neither 47C nor 47D being indicated in FIG. 1) each including an active actuator. A column 31C is disposed on each of the vibration-proofing tables 47A and 47B (47C and 47D), on which a column 31B is disposed in turn, which fixes a flange FLG fixed to an outer wall of the barrel of the projection optical system PL. Moreover, the support column 31A is mounted on the column 31B.

With the construction as described above, each of the vibration-proofing tables 47A and 47B (47C and 47D) can transfer the Z-directional positions of the stage base plate 31D and the support column 31C separately and discretely by the feed-back controls and the feed-forward controls in response to a signal from a posture detection sensor for monitoring a variation in the posture of the main body of the exposure apparatus with respect to the floor portion FD so as to make the posture of the main body of the exposure apparatus always stable regardless of a variation in gravity of the main body thereof in association with the movement of the reticle R stage 30 and the wafer stage 42.

Although not shown in FIG. 1, each of the drive units, actuators and so on of the main body of the exposure apparatus can be controlled in a collective mode by the main control system. In addition, an intermediate control unit system is equipped under the main control system in order to allow specific controls of the individual drive units and actuators. Representative examples of such intermediate control unit systems may include, among others, for example, a reticle R side control unit and a wafer side control unit. The reticle R side control unit can be arranged to manage various information on the position, the transferring velocity, the acceleration of movement, and the position offset of the reticle R stage 30, among others. Likewise, the wafer side control unit can be arranged to manage various information on the position, the transferring velocity, the acceleration of movement, and the position offset of the wafer stage 42, among others.

The main control system can make controls of the reticle R side control unit and the wafer side control unit in synchronization with each other so as to maintain the transferring velocity Vr of the Y-directional movement of the reticle R stage 30 and the transferring velocity Vw of the X-directional movement of the wafer stage 42 at a velocity ratio in accordance with a projection magnification (a ⅕-fold or ¼-fold) of the projection optical system PL, particularly at the time of the scanning exposure.

The main control system is further so arranged as to send an instruction to controlling the movement of each blade of the movable blind disposed in the blind mechanism 23 in synchronization with the movement of the reticle R stage 30 at the time of the scanning exposure. Moreover, the main control system is so arranged as to execute an optimal exposure sequence in association with an exposure control device for controlling the light source control system 1A of the excimer laser light source 1 and the variable light extinction system 10 thereof as well as to set various exposing conditions for scanning exposing the shot regions on the wafer W by an appropriate exposure amount (a target exposure amount).

In addition to the constructions as described above, a reticle alignment system 33 for alignment of the initial position of the reticle R in this embodiment is disposed outside an illumination light path between the reticle R and the main condenser lens system 26 to photoelectrically detect a mark formed outside a circuit pattern region enclosed by a light shield band on reticle R. A wafer alignment system 52 of an off-axis type for photoelectrically detecting an alignment mark formed in each of shot regions on the wafer W is disposed on the lower side of the column 31B.

An actuator 60 of a non-contact type for maintaining stability of the position between the light axis of the illumination optical system (the light axis of the main condenser lens system 26) and the light axis of the projection optical system PL is interposed between a support column 28 supporting the illumination system housing and the column 31A as a part of the main body of the exposure apparatus. The actuator 60 may comprise, for example, a voicex coil generating a Lorentz thrust, an E-core type electromagnet generating a thrust by magnetically repulsive force and attractive force, or the like, and be driven so as to allow a signal from a sensor for sensing a variation in distance between the support column 28 and the column 31A to become constant.

In the entire space (spaces among plural lens elements) inside a barrel of the projection optical system PL as shown in FIG. 1, there is filled an inert gas (e.g., dry nitrogen gas, helium gas, etc.) that has an oxygen content reduced to an extremely small amount, like the illumination system housing. The inert gas is supplied to the barrel thereof at a flow rate small enough to compensate for leakage therefrom. It is to be noted herein, however, that the supply of the inert gas is not required to be performed so often once the air inside the barrel has been replenished thoroughly with the inert gas, when air tightness is high inside the tube body of the irradiation system housing and the projection optical system PL.

It is required, however, to remove molecules of impurities composed of various materials (such as, for example, glass material, coating material, adhesive, paint, metal, ceramics material, etc.) present in the light path by means of a chemical filter or an electrostatic filter while forcing the inert gas whose temperature is controlled to flow in the light path, when a variation in transmittance is taken into consideration, which is caused by attachment of water molecules, hydrocarbon molecules or the like derived from the various substances present in the light path to the surface of the optical elements.

The entire construction as shown in FIG. 1 is made of a dioptric type in which the projection optical system PL is composed only of refractive optical elements, however, it is also possible to make the entire construction of a catadioptric type in which the refractive optical elements are combined with a concave mirror (or a convex mirror). In each type, it is preferred that each of the side of an object plane of the projection optical system PL and the side of an image plane be of a telecentric type.

The system for controlling the pulse emission in the case where the excimer laser light source is utilized for projection exposure of a scanning type is disclosed, for example, in Japanese Patent Application Laid-Open No. 6-132,195 (U.S. Pat. No. 5,477,304), Japanese Patent Application Laid-Open No. 7-142,354 (U.S. Pat. No. 5,534,970), or Japanese Patent Application Laid-Open No. 2-229,423. It is to be noted herein that the technology disclosed in these patents and patent publications may be utilized, if needed, as they are or as they are modified to some extent. Moreover, for example, Japanese Patent Application Laid-Open No. 2-135,723 (U.S. Pat. No. 5,307,207) discloses a type of controlling the exposure amount by adjusting energy of pulse illumination light from the excimer laser light source by means of the variable light extinction system 10 or adjusting the intensity (peak value) of oscillation itself of the excimer laser light source 1 to a minute extent. The technology disclosed in this patent and patent publication may also be applied to the embodiment of the present invention, if needed, as it is or as it is modified to some extent.

Furthermore, the illumination optical system as shown in FIG. 1 may be provided with the first fly-eye lens 13A and the second fly-eye lens 13B. The illumination system in which such two fly-eye lenses (an optical integrator) are disposed in tandem is disclosed, for example, in Japanese Patent Application Laid-Open No. 1-235,289, and the technology disclosed herein can be likewise applied to the embodiment of the present invention.

To the reticle R stage 30 as shown in FIG. 1 can be applied a type as disclosed in Japanese Patent Application Laid-Open No. 8-63,231, which adopts a construction in which the reaction force generating from the acceleration or deceleration at the time of the scanning exposure is offset on the basis of the law of conservation of momentum. To the wafer stage 42 can be applied a type as disclosed in Japanese Patent Application Laid-Open No. 8-233,964, which adopts a construction in which a stator of a linear motor is disposed in a following movable stage member in order to reduce the weight of the main body of the movable stage member that can move in a two-dimensional mode.

Although not shown in FIG. 1, the embodiment of the present invention includes a transmittance measurement means for detecting the intensity of reflected light in a photoelectric mode by irradiating measuring beams made from the ultraviolet pulse illumination light onto the reflecting member disposed on the Fourier transform plane of the projection optical system PL or a plane in the vicinity thereof, in order to measure the intensity of the ultraviolet pulse illumination light (exposing energy) at a substantially real time, with the variations in transmittance of both of the illumination optical system and the projection optical system PL added thereto. A detailed description will be made hereinafter of the transmittance measuring means.

Figure 2:
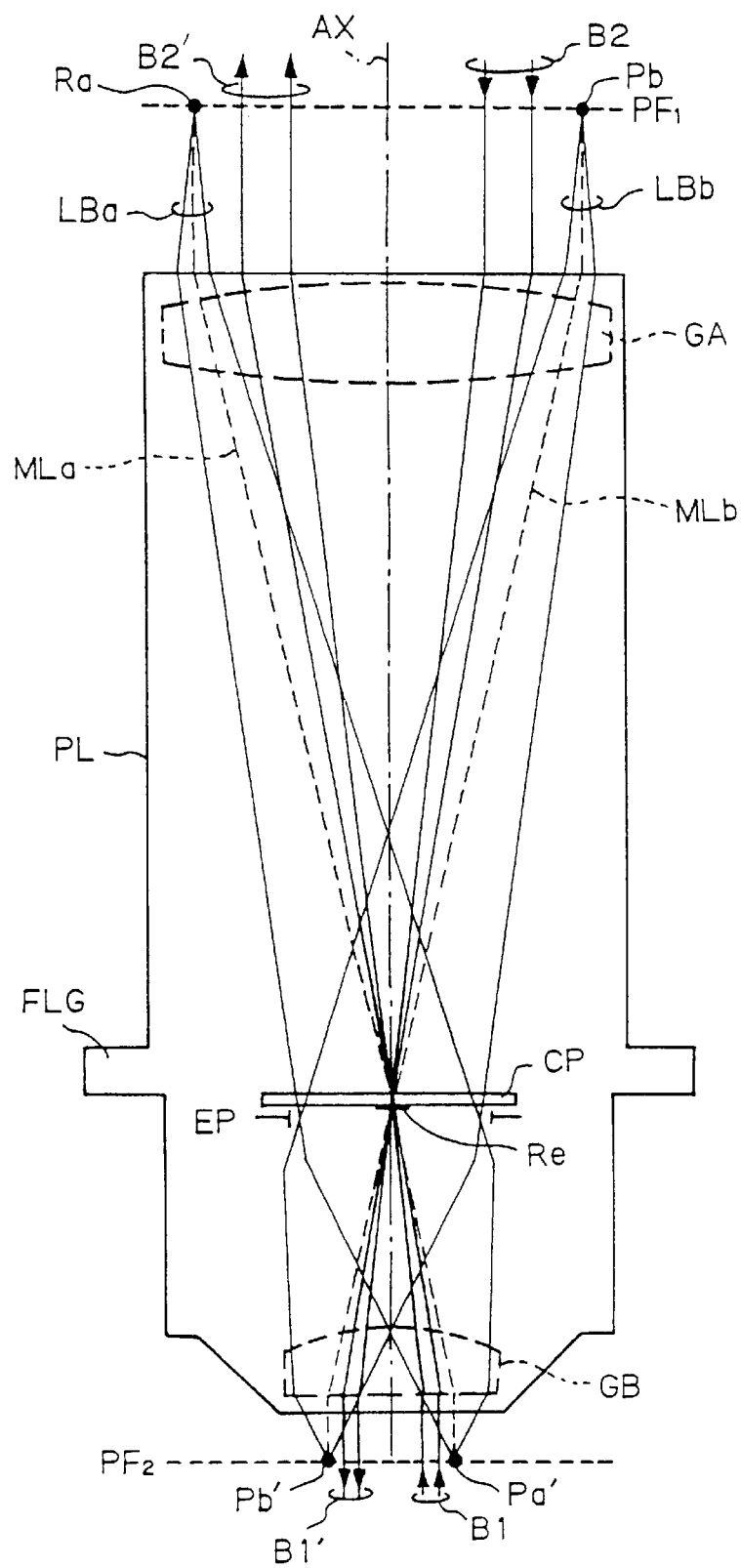
FIG. 2 is a view showing the principle for explaining a measuring light path in the projection optical system in an embodiment of the present invention, upon measuring a transmittance of the projection optical system.

In this embodiment of the present invention, as schematically shown in FIG. 2, a reflecting member Re is disposed at the center in the Fourier transform plane (hereinafter referred to also as "pupil plane") EP of the projection optical system PL, and measuring beams B1 or B2 are irradiated onto the reflecting member Re. The reflecting member Re is made of a thin metal film formed in a generally circular form at a central portion of a transparent quartz substrate CP disposed on the pupil plane EP by deposition, and has a high reflectance or reflectivity (for example, 80% or higher) for the measuring beams B1 or B2 (a portion of the ultraviolet pulse illumination light transmitted from the light source 1).

Plural sheets of lens elements are incorporated in the projection optical system PL having a flange FLG. FIG. 2 indicates only representative lens systems GA and GB among them. Further, FIG. 2 shows an object plane of the projection optical system PL on which the pattern plane of the reticle R is situated as reference symbol PF1 and an imaging plane of the projection optical system PL on which the surface of the wafer W is situated as reference symbol PF2.

Moreover, when the projection optical system PL is telecentric on both ends, each of main light rays MLa and MLb (as indicated by broken line) of imaging light fluxes LBa and LBb by the ultraviolet pulse illumination light from each of object points Pa and Pb on the object plane PF1 is incident to the projection optical system PL in a mode parallel to the light axis AX of the projection optical system PL, and then passes through a central point (a point passing through the light axis AX) inside the pupil plane EP of the projection optical system PL, thereafter advancing again from the projection optical system PL toward each of corresponding image points Pa' and Pb' on the imaging plane PF2 in parallel to the light axis AX.

A ratio of a number of openings NAr for the imaging light fluxes LBa and LBb on the side of the object plane PF1 to a number of openings NAw therefor on the side of the projection imaging plane PF2, i.e., a ratio (NAr/NAw), is equal to a magnification of projection of the projection optical system PL. When the number of the openings NAw therefor on the side of the projection imaging plane PF2 is supposed to be 0.8 and the magnification of projection thereof is supposed to be ¼, the number of the openings NAr therefor on the side of the object plane PF1 is 0.2. The numbers of the openings NAr and NAw are determined substantially on the basis of the effective size of the pupil plane EP of the projection optical system PL and the focal distance of the projection optical system PL. When the effective size of the pupil plane EP becomes larger, the numbers of the openings NAr and NAw increase and as a consequence improve a resolving power to that extent.

In the projection optical system PL, one space between the object plane PF1 and the pupil plane EP and other space between the pupil plane EP and the projection imaging plane PF2 constitute an extremely precise Fourier transform system (or an inverse Fourier transform system). With this configuration, when the measuring beams B2 (parallel light flux) collimated from the side of the object plane PF1 of the projection optical system PL are incident to the projection optical system PL in parallel to the light axis AX, the measuring beams B2 are converged at the central point of the pupil plane EP. Likewise, when the measuring beams B1 (parallel light flux) collimated from the side of the projection imaging plane PF2 of the projection optical system PL are incident to the projection optical system PL in parallel to the light axis AX, the measuring beams B1 are converged at the central point of the pupil plane EP.

In this embodiment, the reflecting member Re is disposed at the center of the pupil plane EP, so that the measuring beams B2 from the side of the object plane PF1 are reflected there at an angle symmetrical to the light axis AX to form reflected beams B2', returning to the side of the object plane PF1 as a parallel light flux. Likewise, the measuring beams B2 from the side of the projection imaging plane PF2 are reflected there at an angle symmetrical to the light axis AX to form reflected beams B1', which in turn are returned to the side of the projection imaging plane PF2 as a parallel light flux.

Therefore, when the intensity of the measuring beams B2 irradiating from the object plane PF1 side to the projection optical system PL is compared with the intensity of the reflected beams B2' reflected on the pupil plane EP of the reflecting member Re and returning to the object plane PF1 side, a transmittance in the light path extending between the object plane PF1 of the projection optical system PL and the pupil plane EP thereof and a variation thereof can be detected. On the other hand, when the intensity of the measuring beams B1 irradiating from the projection imaging plane PF2 side to the projection optical system PL is compared with the intensity of the reflected beams B1' reflected on the pupil plane EP of the reflecting member Re and returning to the projection imaging plane PF2 side, a transmittance in the light path extending between the projection imaging plane PF2 of the projection optical system PL and the pupil plane EP and a variation thereof can be detected.

The measuring beams B1 and B2 are separately from the irradiation of exposing illumination light (the ultraviolet pulse illumination light passing through the system ranging from the fly-eye lens system 13A to the main condenser lens system 26), and are formed from a portion of the excimer laser light emitted and divided from the excimer laser light source 1 of FIG. 1, for example, at a reflecting mirror 11 as shown in FIG. 1, respectively. A shutter or other appropriate means can be disposed in order to separate the irradiation of the exposing illumination light from the irradiation of the measuring beams B1 and B2.

Figure 3:
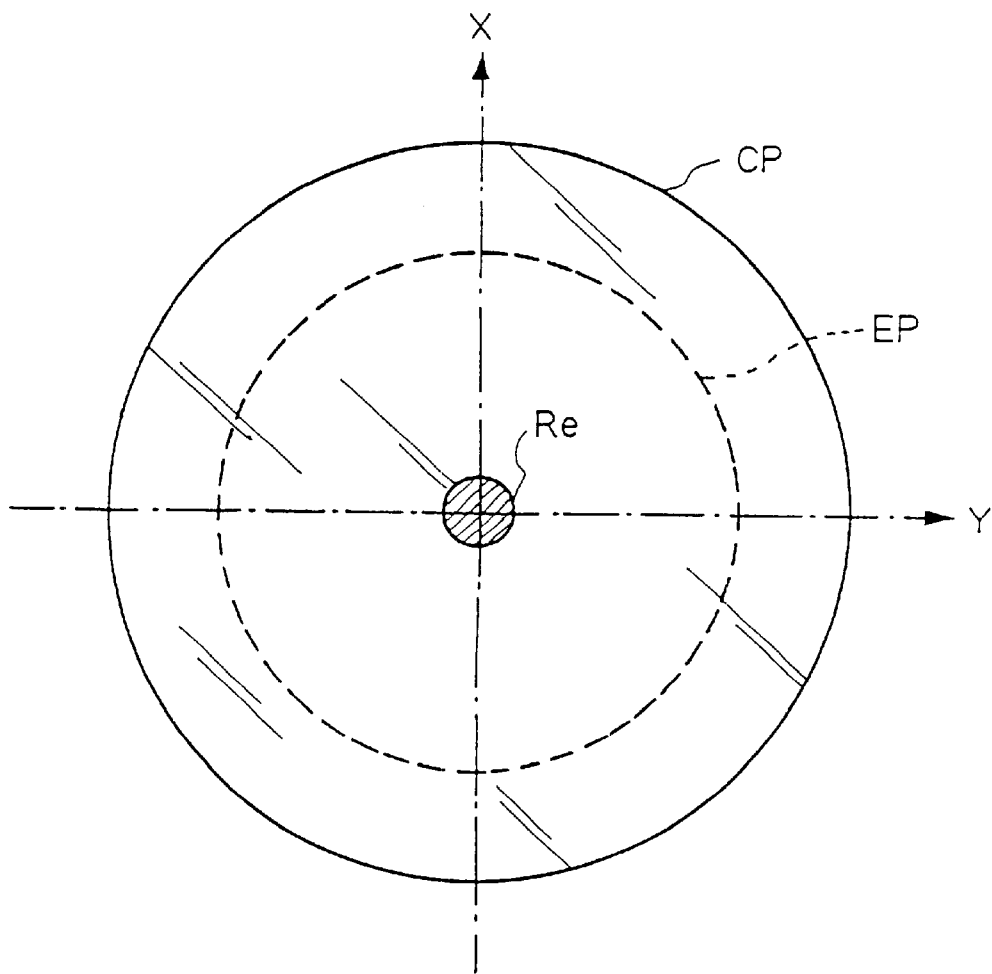
FIG. 3 is a plan view showing the structure of a transparent plate with a reflecting plate disposed in the vicinity of a pupil plane of the projection optical system.
Figure 4:
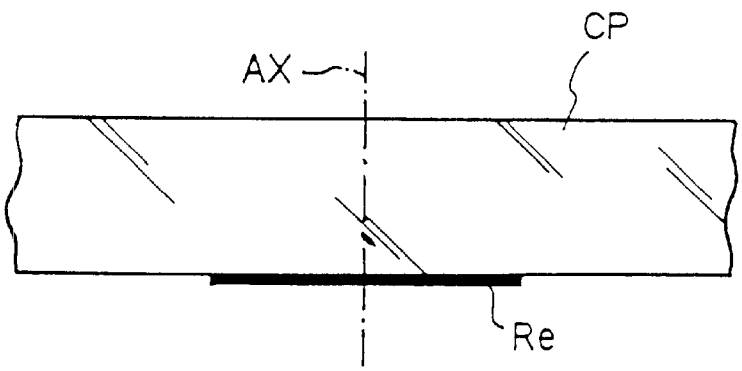
FIG. 4 is a view in section showing a central portion of the transparent plate as shown in FIG. 3.

The reflecting member Re may be configured in a specific manner as shown in FIGS. 3 and 4. FIG. 3 shows a flat plane of the quartz substrate (parallel flat plate) CP from which the reflecting member Re is formed, and FIG. 4 shows a partially sectional plane of the quartz substrate CP. The quartz substrate CP may be of a circular form having a diameter larger than the effective diameter (as indicated by broken line) of the pupil plane EP of the projection optical system PL, and the reflecting member Re is formed at a center of the quartz substrate CP by deposition in a circular form having a sufficiently smaller diameter.

In the case of this embodiment, the quartz substrate CP is disposed in the projection optical system PL in a fixed manner, so that the reflecting member Re acts as a shielding member against a pattern imaging light flux upon projecting a pattern of the reticle R onto the wafer W at the time of the scanning exposure. However, if the pattern imaging light flux distributing in the pupil plane EP of the projection optical system PL would have some diameter range to some extent at the central portion of the pupil plane EP, no big influence will be exerted on the resolving power and the quality of an image even if the such pattern imaging light flux would be shielded thereon.

In order to avoid the influence therefrom, the diameter of the reflecting member Re is set to amount to approximately ⅒ to ⅕ of the effective diameter of the pupil plane EP. It is preferred as a matter of course that the diameter of the reflecting member Re is extremely small in a region where a sufficient shielding area can be ensured with respect to the measuring beams B1 and B2. It is to be noted herein that FIGS. 3 and 4 show each a case where the reflecting member Re is formed only on one side of the quartz substrate CP, however, it can be formed on both sides thereof. Moreover, it is preferred that the reflecting member Re are not permeable to the measuring beams B1 and B2. In addition, the quartz substrate CP may be composed of a lens element located in the vicinity of the pupil plane EP of the projection optical system PL, although the quartz substrate CP is shown therein as being composed of such parallel flat plates. In this case, the reflecting member Re may be deposited at the center on the surface of the such lens element.

Figure 5:
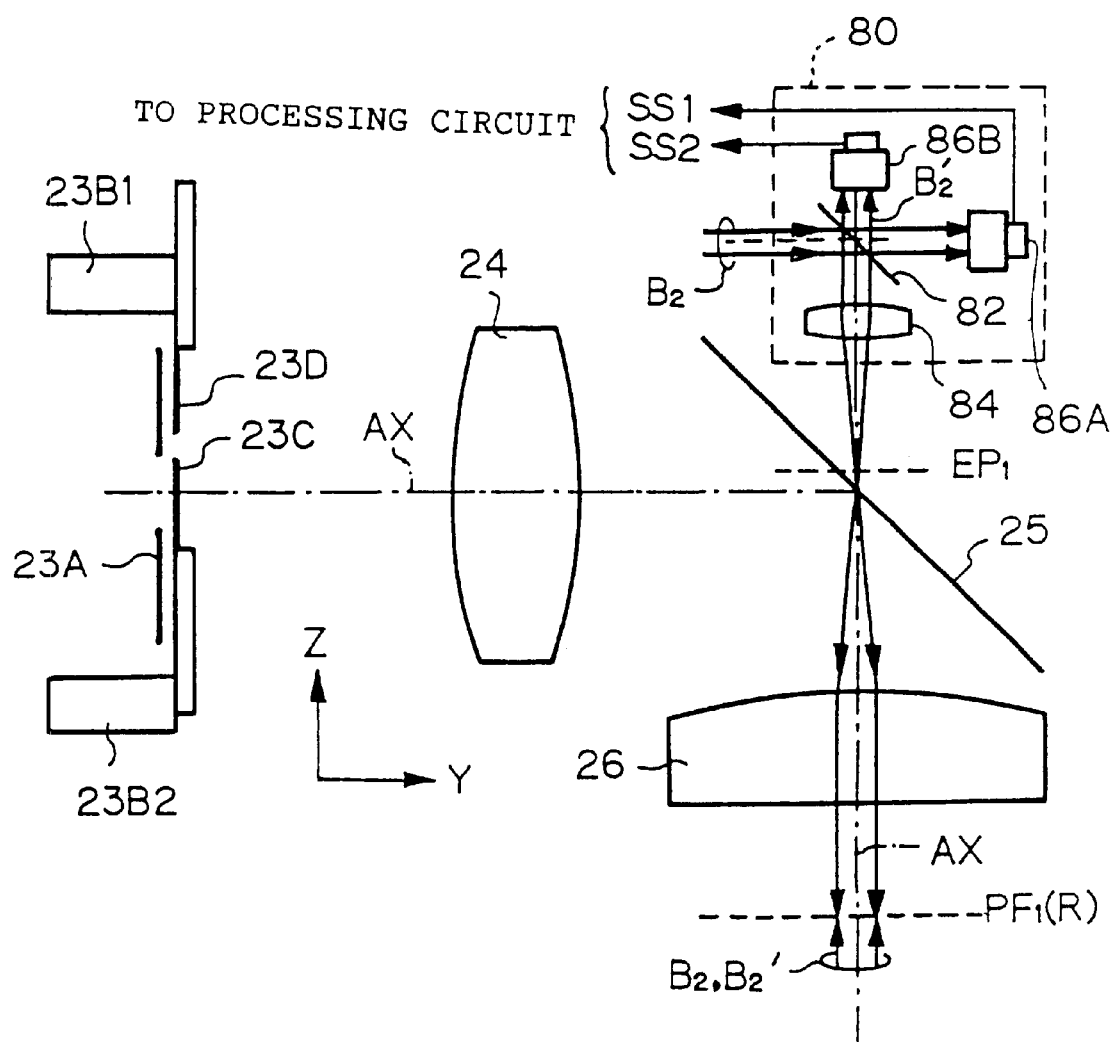
FIG. 5 is a view showing a specific configuration in the Y-Z plane of a transmittance measuring means to be applicable to the projection exposure apparatus of FIG. 1.

Now, a description will be made of an example of the specific construction of the transmittance measuring means applicable to the device of FIG. 1 with reference to FIGS. 5 and 6. FIG. 5 shows a system ranging from the blind mechanism 23 to the main condenser lens system 26 in the system of the illumination optical system of FIG. 1. A transmittance measuring means 80 is configured such that the measuring beams B2 is irradiated toward the main condenser lens system 26 and the projection optical system PL through a semi-permeable portion formed at a part of the mirror 25 disposed between the imaging lens system 24 and the main condenser lens system 26 and that the reflected beams B2' reflected on the reflecting member Re of the pupil plane EP and returning up to the main condenser lens system 26 are received through the semi-permeable portion of the mirror 25.

As previously described above, the reticle blind mechanism 23 is provided with the fixed blind 23A with a rectangle-shaped slit-like opening and with a pair of the movable blades 23C and 23D that can make variable the scanning-directional width of the rectangle-shaped slit-like illumination light to be irradiated onto the reticle R. The movable blades 23C and 23D are driven in association with the positions varying in scanning the reticle R in the Y-axial direction at the time of the scanning exposure by means of driving motors 23B1 and 23B2, respectively, as disclosed in Japanese Patent Application Laid-Open No. 4-196,513 (U.S. Pat. No. 5,473,410).

The fixed blind 23A and the movable blades 23C and 23D are disposed close to and along the light axis AX and set so as to become conjugated with the object plane PF1 (the pattern plane of the reticle R) of the projection optical system PL by means of the combination system with the imaging lens system 24 and the main condenser lens system 26 combined together. Therefore, a plane EP1 (a Fourier transform plane) conjugate with the pupil plane EP of the projection optical system PL is formed in the vicinity of the mirror 25 between the imaging lens system 24 and the main condenser lens system 26.

With the configuration as described above, parallel beams from the excimer laser light source 1 branched, for example, at the mirror (beam splitter) 11, as shown in FIG. 1, is incident to the transmittance measuring means 80 as the measuring beams B2. The measuring beams B2 are divided at the beam splitter 82 into two beams, one being referred to as permeated beams and the other being referred to as reflected beams. The permeated beams are received by a photoelectric detector 86A for measuring the beam intensity on the light transmission side. On the other hand, the reflected beams from the beam splitter 82 are converged at the plane EP1 through the lens system (a Fourier transform lens) 84, followed by permeating through the mirror 25 and reaching the condenser lens system 26 to convert again into the parallel beams B2 parallel to the light axis AX, thereafter passing the object plane PF1 of the projection optical system PL in a perpendicular direction.

It is to be noted herein that, FIG. 5 shows the measuring beams B2 leaving from the condenser lens system 26 in a form in which they are superimposed over the light axis AX of the projection optical system PL. They, however, are actually decentered from the light axis AX as shown in FIG. 6. FIG. 6 indicates the construction of the transmittance measuring means 80, the mirror 25 and the condenser lens system 26 of FIG. 5, when looked from the right side in FIG. 5. In FIG. 6, the measuring beams B2 reflected at the beam splitter 82 are set to be decentered and incident to the lens system 84.

Figure 6:
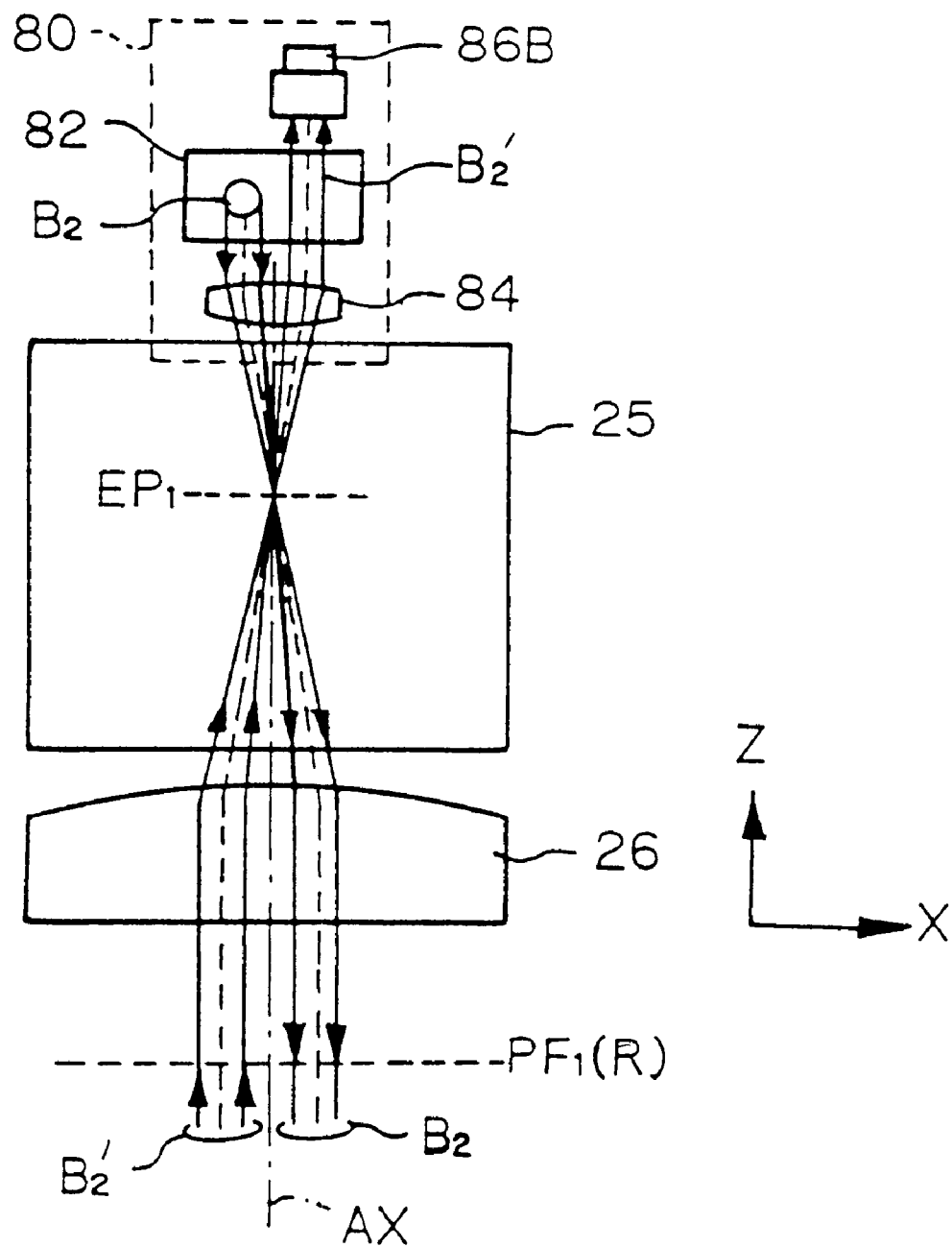
FIG. 6 is a view showing the configuration in the X-Z plane as shown in FIG. 5.

With this configuration, the measuring beams B2 leaving from the condenser lens system 26 advances eccentrically with its right side of the X-axial direction (a non-scanning direction) with respect to the light axis AX, when looked on a Z-X plane as shown in FIG. 6. Therefore, as described above in connection with FIG. 2, the measuring beams B2 are incident to the projection optical system PL in a collimated state, and the beams B2' reflected at the reflecting member Re disposed on the pupil plane EP of the projection optical system PL return to the object plane PF1 side of the projection optical system PL.

At this time, the reflected beams B2' travels along the light path symmetric to the measuring beams B2 with respect to the light axis AX from the condenser lens system 26, the mirror 25 and the lens system 84 in this order, and they are received by a photoelectric detector 86B after transmittance through the beam splitter 82. Detection signal SS2 from the photoelectric detector 86B is subjected to operation processing by a processing circuit (will be described in more detail with reference to FIG. 10), together with detection signal SS1 from the photoelectric detector 86A as a standard, and is used as measuring a transmittance between the object plane PF1 and the pupil plane EP of the projection optical system PL or a variation thereof.

The measurement of the transmittance by the photoelectric detectors 86A and 86B is basically effected by determining a ratio lr (SS2/SS1) of the intensity of the signal SS1 to the intensity of the signal SS2 output at the time of emitting one pulse from the excimer laser light source 1. On the other hand, a variation of the transmittance can be obtained by calculating a ratio (lr/lr') of the intensity ratio lr to the intensity ratio lr' saved before a predetermined period of time.

It is to be noted herein, however, that the transmittance (the intensity ratio lr) measured by the photoelectric detectors 86A and 86B is a relative value and does not represent an absolute value. Therefore, when an absolute value of the transmittance is to be determined, some calibration should be made. From the point of view of improvements in precision of control over the exposure amount, however, it is not so needed to determine the absolute transmittance, and it is rather significant to learn a periodical variation in the measured intensity ratio lr (a measured transmittance) or a variation characteristic of the measured transmittance occurring during a period of time, for example, when one sheet of wafer has been exposed to light or when a lot of wafers has been exposed to light, or a tendency thereof.

With the construction of the transmittance measuring means 80 as shown in FIGS. 5 and 6, the measuring beams B2 and the reflected beams B2' passing through the object plane PF1 are set so as to pass through a rectangle-shaped slit-like region of exposing illumination light defined in a vision field on the object plane PF1 side of the projection optical system PL, and the transmittance for the light path of the pattern imaging light flux from the reticle R passing actually inside the projection optical system PL can be accurately measured upon projection exposure.

In FIGS. 5 and 6, the measuring beams B2 and the reflected beams B2' are set so as to run in a state eccentric symmetrically to the light axis AX on the object plane PF1 side of the projection optical system PL. It is to be noted herein, however, that the setting of them is not restricted to such and that the measuring beams B2 and the reflected beams B2' can be set so as to travel coaxially with the light axis AX. In this case, the measuring beams B2 are set so as to pass through the center of the lens system 84 in FIG. 6, so that this construction can provide the feature that the lens system 84, the beam splitter 82 and other elements in the transmittance measuring means 80 can be made compact in size.

Further, when the measuring beams B2 and the reflected beams B2' are set so as to pass coaxially with the light axis AX, the diameter (a sectional area at a portion where a light flux is parallel) of the measuring beams B2 can be made as large as the size of the lens system 82 so that they can be allowed to pass through a larger light path inside the projection optical system PL and the measured transmittance can be averaged to a higher extent.

Figure 7:
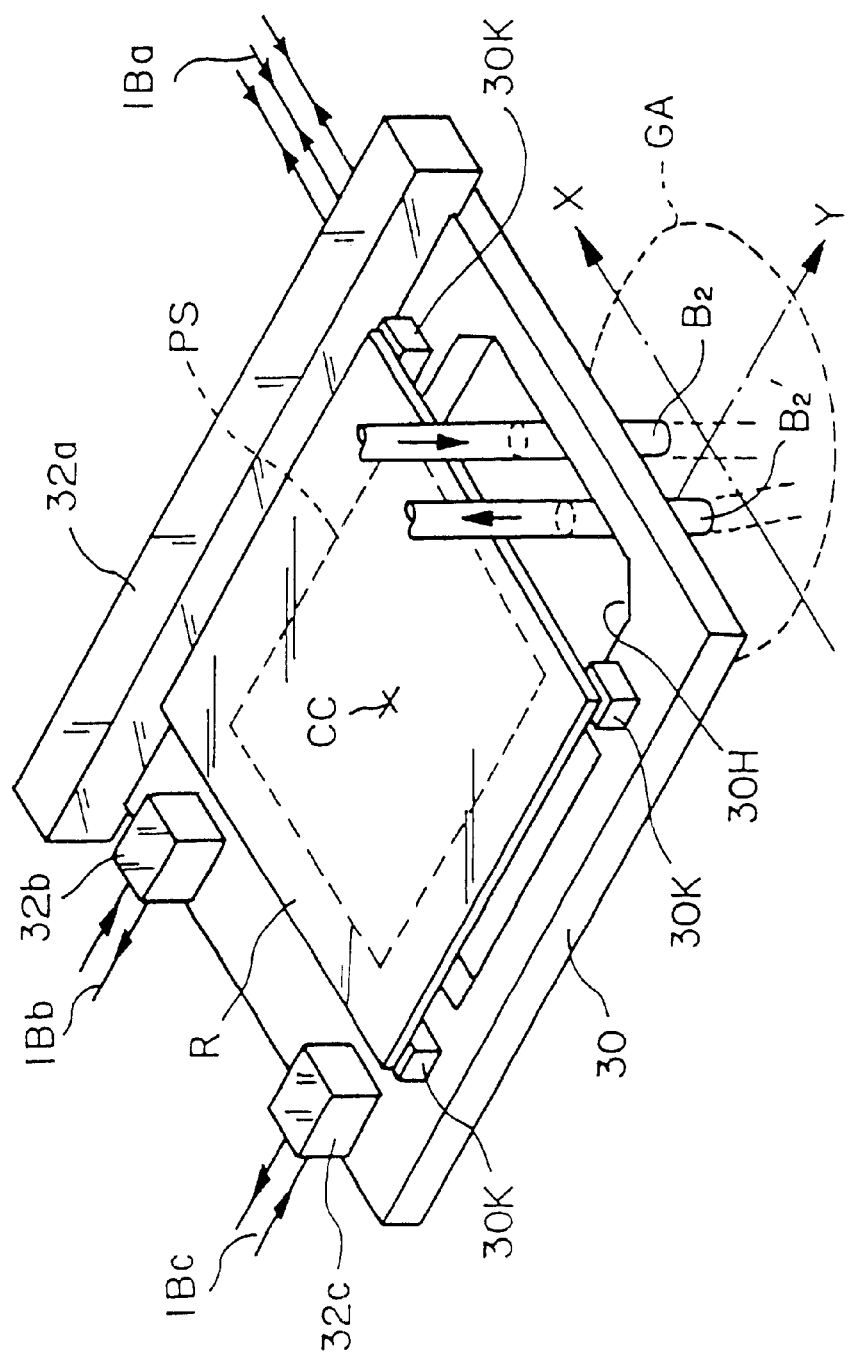
FIG. 7 is a perspective view showing details of a reticle stage, as shown in FIG. 1, and a state thereof during transmittance measurement.

It should be noted herein that the measuring beams B2 from the transmittance measuring means 80 as shown in FIGS. 5 and 6 and the reflected beams B2' from the reflecting member Re of the pupil plane EP of the projection optical system PL are set so as to pass through an opening portion 30H formed in the reticle R stage 30 without being blocked by the reticle R, for example, as shown in FIG. 7. FIG. 7 is a perspective view schematically showing the construction on the reticle R stage 30, and the reticle R is adsorbed and supported on four adsorbing members 30K disposed at the four corners of the reticle R stage 30.

A moving mirror 32a and corner mirrors 32b and 32c are mounted on the reticle R stage 30. The moving mirror 32a reflects beams IBa from an interferometer 32 for measuring the position of the stage in the non-scanning direction (the X-axial direction), which is disposed extending in the scanning direction (the Y-axial direction). The corner mirrors 32b and 32c reflect beams IBb and Ibc from the interferometer 32 for measuring the position of the stage in the scanning direction (the Y-axial direction) and the yawing (rotational) direction, respectively.

With this construction, the rectangle-shaped slit-like illumination light from the exposing illumination system is set so as to extend in the X-axial direction at the center of a lenses group GA defining the vision field on the object plane PF1 side of the projection optical system PL, during a period of time when a pattern region PS on the reticle R is subjected to scanning exposure on the wafer. Generally, the circuit pattern region PS on the reticle R is located in the position deviated by a predetermined approach-run distance in the Y-axial direction from an illumination region of the exposing illumination light before the start of a one-dimensional movement upon scanning exposure.

FIG. 7 shows the state in which the reticle R is set at the position of starting the approach run. The measuring beams B2 from the transmittance measuring means 80 in the approach-run start position are incident to the lenses group GA of the projection optical system PL through the opening portion 30H of the reticle R stage 30 without being blocked by the reticle R, and the reflected beams B2' from the projection optical system PL are returned to the transmittance measuring means 80 through the opening portion 30H.

Therefore, a precise measurement of the transmittance can be effected without undergoing an influence of partially shielding a pattern of the pattern region PS as well as an influence of light shielding at a pellicle frame on the reticle R. It should be noted herein, however, that when a relatively large space (a transparent portion) is provided in the scanning direction outside the circuit pattern region PS on the reticle R, the measuring beams B2 and the reflected beams B2' can be set so as to pass through the space portion. In this case, the transmittance of the portion of the reticle R including the transparent portion can be measured.

In the construction as shown in FIG. 7, the opening portion 30H of the reticle R stage 30 is formed only on one side in the scanning direction. When a stroke of transferring the reticle R stage 30 in the Y-axial direction can be ensured, however, an opening portion can also be likewise provided on the side of each of the corner mirrors 32b and 32c in FIG. 7. When the opening portion 30H is disposed on the both sides of the reticle R stage 30 in the scanning direction in the manner as described above, the transmittance can be measured even if the direction of starting the approach run of the reticle R stage 30 would be +Y-axial direction or −Y-axial direction, thereby presenting the advantage in that the freedom of measuring timing and the freedom of a measuring sequence can be improved.

Figure 8:
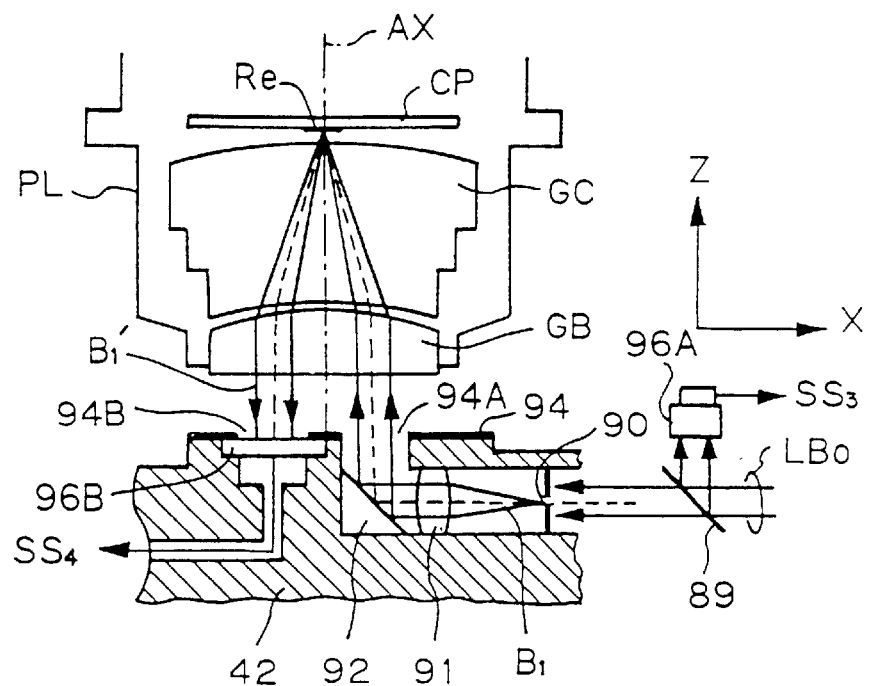
FIG. 8 is a partially sectional view of a wafer stage for explaining a specific configuration of a transmittance measuring means in accordance with the second embodiment of the present invention.

Then, a description will be made of means for measuring the transmittance within the light path extending from the pupil plane EP of the projection optical system PL to the projection imaging plane PF2 with reference to FIGS. 8 and 9. FIG. 8 shows a sectional structure of a part of the projection optical system PL and a part of the wafer stage 42, and FIG. 9 indicates an example of the relationship of a planar disposition of a vision field IF on the projection imaging plane PF2 side of the projection optical system PL with a light shielding member 94 on the wafer stage 42. It should be noted herein, however, that in FIG. 8 lenses groups GB and GC for subjecting the pattern imaging light flux from the reticle R to inverted Fourier transformation are located under the quartz substrate CP (the reflecting member Re) disposed on the pupil plane EP of the projection optical system PL.

Inside the wafer stage 42, there are provided a pinhole plate 90, a lens system 91, and a mirror 92, the pinhole plate 90 being disposed to horizontally receive beams LBO emitting from the excimer laser light source 1 in a parallel mode, the lens system 91 being disposed to receive divergent light rays from the pinhole plate 90 as the measuring beams B1 and collimate them into a parallel light flux, and the mirror 92 being disposed to bend the measuring beams B1 in the Z-axial direction (a perpendicular direction). On top of the wafer stage 42, a light shielding plate 94 is mounted, the light shielding plate 94 being provided with a window 94A through which the perpendicularly bent beams B1 are transmitted upwardly above the wafer stage 42.

Figure 9:
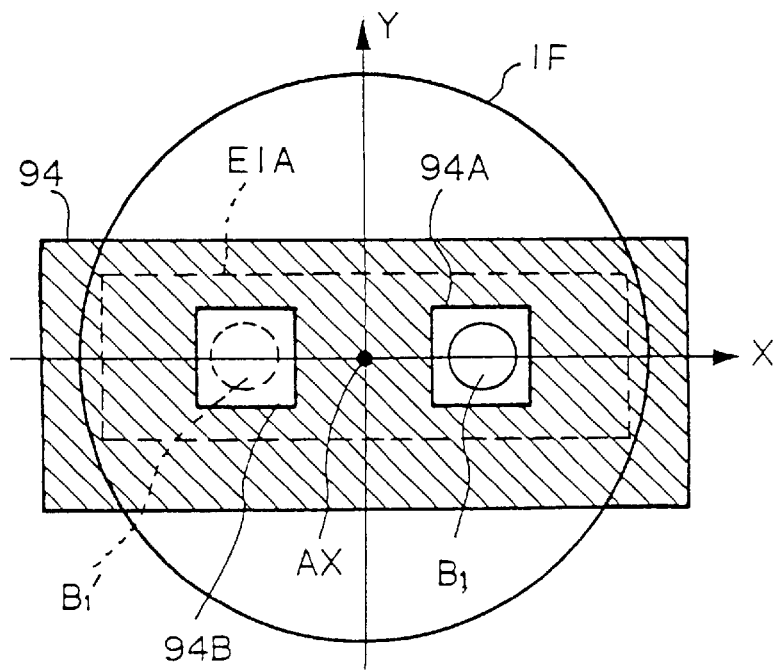
FIG. 9 is a plane view showing the construction of a light shielding plate to be disposed in the transmittance measuring means of FIG. 8 and an example of the disposition of the light shielding plate.

As shown in FIG. 9, the light shielding plate 94 is shaped in a rectangular form in which one pair of its parallel sides extends in the X-axial direction (the non-scanning direction). As the light shielding plate 94 is located in a predetermined measuring position (the state in FIG. 9) on the X-Y plane by transferring the wafer stage 42, the measuring beams B2 from the window 94A (in a sectionally circular form in this embodiment) are located at the position apart in the X-direction by a predetermined distance from the central point (the point through which the light axis AX passes) of the vision field IF, when looked on the X-Y plane. In FIG. 9, a rectangle-shaped region EIA extending in the X-direction (the non-scanning direction) within the vision field IF represents an effective projection region in a shape analogous to a distribution of intensity of the illumination light from the exposing illumination system.

The measuring beams B1 leaving in the direction perpendicularly from the window 94A of the light shielding plate 94 are converged toward the center of the pupil plane EP by the lenses groups GB and GC disposed inside the projection optical system PL as shown in FIG. 8 and then reflected by the reflecting member Re disposed therein. The reflected beams B1' are then returned as a parallel light flux through the lenses groups GC and GB to the light shielding plate 94. While they pass through the lenses groups GC and GB, the reflected beams B1' travel through the light path symmetrical with respect to the light axis AX to the light path through which the measuring beams B1 have traveled up to the reflecting member Re.

A window 94B as shown in FIG. 9 is provided at the position on the light shielding plate 94 at which the reflected beams B1' are returned to reach. A photoelectric detector 96B for detecting the light intensity or light quantity of the reflected beams B1' is disposed right under the window 94B. Detection signal SS4 from the photoelectric detector 96B is transmitted to a processing circuit and used for measuring transmittance between the pupil plane EP of the projection optical system PL and the object plane PF1 thereof and a variation in transmittance between them.

In order to set the intensity of the measuring beams B1 as a standard, a beam splitter 89 for reflecting a portion of the beams LB0 (approximately several %) and a photoelectric detector 96A for detecting the intensity or quantity of the light reflected are provided, and detection signal SS3 from the photoelectric detector 96A is transmitted to a processing circuit. Upon measuring the transmittance and a variation of the transmittance, a ratio (SS4/SS3) of the detection signal SS4 from the photoelectric detector 96B to the detection signal SS3 from the photoelectric detector 96A is calculated.

As shown in FIGS. 8 and 9, the transmittance measuring means may be composed of the beam splitter 89, the pinhole plate 90, the lens system 91, the mirror 92, and the photoelectric detectors 96A and 96B. In this embodiment, the transmittance measuring means is located on the wafer stage 42, so that it is required to align the wafer stage 42 in the state as shown in FIGS. 8 and 9 upon measuring.

When the light shielding plate 94 is disposed with respect to the vision field IF as shown in FIG. 9, the reflected beams B1' return in an accurate way within the window 94B of the light shielding plate 94. If the light shielding plate 94 is aligned in such a way that it is deviated from that disposition, for example, toward the right side by a distance ΔX, the reflected beams B1' are deviated by 2ΔX toward the left side with respect to the window 94B. In other words, in this embodiment, the position of the reflected beams B1' inside the vision field IF is located always in a point-symmetrical relationship with the measuring beams B1 with respect to the point through which the light axis AX passes.

Therefore, in the case where the measuring beams B1 are located on the X-axis on which the light axis AX passes as shown in FIG. 9, the X-directional distance from the light axis AX to the center of the measuring beams B1 becomes larger than the initial value, so that the X-directional distance from the light axis AX to the center of the reflected beams B1' becomes larger than the initial value by that increased distance. The size of the window 94B on the light shielding plate 94 can be determined with a scope larger than twice the error of alignment of the wafer stage 42 added to the size of a sectional shape of the reflected beams B1'.

When the measuring beams B1 and the reflected beams B1' are arranged so as to travel through the different light paths inside the lenses groups GB and GC on the projection imaging plane PF2 side rather than the pupil plane EP of the projection optical system PL as in the construction as shown in FIG. 8, a variation in transmittance at a wider portion within the lenses groups GB and GC can be measured, like in the case of FIGS. 5 and 6 above.

It is also possible to transmit the measuring beams B1 to the projection optical system PL coaxially with the reflected beams B1', when the mirror 92 in FIG. 8 is replaced with a beam splitter and the photoelectric detector 96B is disposed below the beam splitter. In this case, however, it is needed to align the window 94A of the light shielding plate 94 leaving in the direction perpendicularly from the measuring beams B1 right under the light axis AX upon measuring transmittance.

Further, when the mirror 92 in FIG. 8 is replaced with the beam splitter, the photoelectric detector 96A for use as a standard can be disposed on the left-hand side of the beam splitter, so that the beam splitter 89 can be omitted and the light quantity of the beams LB0 from the excimer laser light source 1 can be utilized in a more effective mode.

Figure 10:
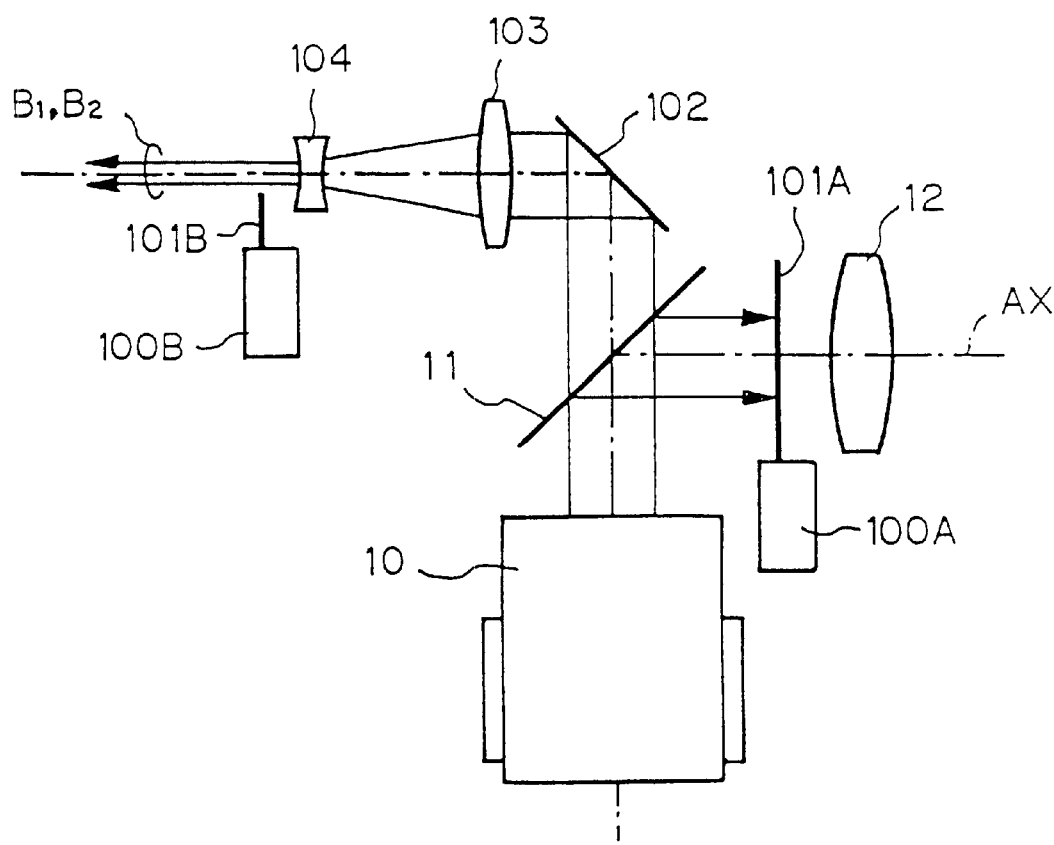
FIG. 10 is a view showing an example of an optical system for producing measuring beams to be projected during measurement of an attenuation factor (transmittance).

It can also be noted herein that the measuring beams B2 as shown in FIGS. 5 and 6 and the measuring beams B2 as shown in FIGS. 8 and 9 may be obtained, as shown in FIG. 10, by arranging the mirror 11 so as to work as a beam splitter in the portion composed of the variable light extinction system 10, the mirror 11 and the lens system 12 in the illumination optical system as shown in FIG. 1 and by passing an excimer laser light transmitted through the mirror 11 to a concave lens 104 after passage through a wholly reflecting mirror 102 and a convex lens 103.

With this construction, in order to selectively shift between the supply of the illumination light upon exposure and the supply of the illumination light upon measuring the transmittance, a shutter 101A that can be opened and shut off by a drive system 100A is interposed between the mirror (beam splitter) 11 and the lens system 12 and the other shutter 101B that can be opened and shut off by the other drive system 100B, behind the concave mirror 104. Further, the shutters 101A and 101B are disposed so as to offset with each other. Moreover, the drive systems 100A and 100B are driven by an instruction from a processor disposed in the processing circuit in FIG. 11 as will be described hereinafter.

Furthermore, the convex lens 102 and the concave lens 104 in FIG. 10 are not restricted to particular ones and they may be of any system that can reduce the beam size to a state of a parallel light flux and that can collimate and send out the measuring beams B1 and the measuring beams B2 or that can expand the beam size thereof and send out them.

Now, a description will be made of the configuration of the processing circuit for processing information relating to the transmittance on the basis of each signal from the photoelectric detectors 86A, 86B, 96A and 96B as the transmittance measuring means, with reference to FIG. 11. The processing circuit of FIG. 11 mainly comprises high-speed sample-hold circuits (hereinafter referred to each as an "S/H circuit") 120A to 120E, inclusive, and analog-digital converters (each hereinafter referred to as "ADC") 124A and 124B. The S/H circuits detect the light quantity of pulse light accurately in response to a pulse light having a duration as extremely short as approximately 10 to 20 ns, which is emitted from the excimer laser light source 1. The ADC convert the signal voltage in accordance with the hold light quantity to a digital value.

First, the detection signal SS1 from the photoelectric detector 86A is applied to the S/H circuit 120A including an amplifier circuit, and the area (light quantity) of a pulse wave form of the signal SS1 amplified is sampled and held in response to a timing signal from a timing circuit 128, thereafter being applied to a multiplexer 122A. Likewise, the detection signal SS3 from the photoelectric detector 96A is applied to the S/H circuit 120B including an amplifier circuit, and the area (light quantity) of a pulse wave form of the signal SS3 amplified is sampled and held in response to a timing signal from the timing circuit 128, thereafter being applied to the multiplexer 122A.

Each of the detection signals SS2 and SS4 from the other photoelectric detectors 86B and 96B is applied to the S/H circuits 120C and 120D each including an amplifier circuit, and the area (light quantity) of each pulse wave form of the signals SS2 and SS4 amplified is sampled and held in response to a timing signal from the timing circuit 128, respectively, thereby being applied to a multiplexer 122B.

Moreover, a photoelectric signal from the photoelectric detector 19 as shown in FIG. 1 is likewise applied to a high-speed sample-hold circuit 120E. The signal amplified by the circuit is sampled and held in response to the timing signal from the timing circuit 128, thereafter being applied to the multiplexer 122B. With this configuration, the multiplexer 122A selects either one of the values of the light quantities of the held signals SS1 and SS3 in response to an instruction from the processor 126, while the other multiplexer 122B selects either one of the values of the light quantities of the held signals SS2 and SS4 and the light quantities of signals from the detector 19 in response to an instruction from the processor 126.

One light quantity value selected out of the light quantity values by the multiplexer 122A is applied to the ADC 124A, while one light quantity value selected therefrom by the other multiplexer 122B is applied to the ADC 124B. The light quantities are then converted into digital values by each of the ADCs 124A and 124B, respectively, and each data converted into the digital value is read by the processor 126. Then, the processor 126 performs providing the instruction to the timing circuit 128, generating a shift signal for selection to the multiplexer 122A or 122B, reading data from each of the ADCs 124A and 124B, and associating between the control system 1A of the excimer laser light source 1 and the main control system of the main body of the exposure apparatus.

With the configuration as described above, the processor 126 provides three main functions, including a transmittance measuring program for detecting and updating a variation of transmittance and the tendency of such a variation at each time interval by the photoelectric detectors 86A, 86B, 96A and 96B; an exposing condition specifying program for setting various exposing conditions (including an applying voltage (or charging voltage) of the excimer laser light source 1, the extinction rate of the variable light extinction system 10, the speed of scanning each of the stages, a slit width of the blind mechanism 23, etc.) on the basis of the exposure amount (an accumulated light quantity) to be measured by the photoelectric detector 19 upon controls of the exposure amount; and a calibration program for calibrating in advance the relationship between the exposure amount measured by the photoelectric detector 19 and the actual exposure amount provided on the wafer.

Now, a description will be made of an example of the calibration program with reference to FIG. 12. Upon the calibration operation, a reference illuminance meter is mounted on a given portion on the wafer stage 42, which can measure an absolute exposure amount (unit mJ) or an illuminance (mW/cm), as shown at step 300. The reference illuminance meter is adapted to measure an illuminance value and the exposure amount of a single pulse light ray or an accumulated exposure amount of plural pulse light rays with a measuring precision of ±0.5% or less with respect to the absolute value.

Then, as shown at step 302, standard exposing conditions for calibration are set for the main control system of the exposure apparatus. The standard exposing conditions are determined by the product obtained by multiplying an average illuminance value i (light quantity) of one pulse light required to provide an appropriate exposure amount (mJ) on a resist on a wafer to be used by the number (N) of pulse light accumulated at each point on the wafer.

It is noted herein that, as this embodiment assumes scanning exposure, the number N (a positive integer) of the pulse light accumulated at each point of the wafer can be set by the formula: $N=f \times (Dap/Vws)$, where f (in Hz) is the oscillating frequency of the excimer laser light source 1; Dap (in mm) is the width relating to the scanning direction of an effective projection region EIA (as shown in FIG. 9) on the wafer; and Vws (in mm/s) is the velocity at which to scan the wafer.

Thus, it can be understood that the number N is the number of pulses to be oscillated during a period of time during which the wafer is being transferred in the scanning direction by the width Dap portion of the effective projection region EIA and as a rule it is required that an integer without any fraction can be obtained by the operation of the above formula. As a practical procedure, the number N of the pulse light is determined roughly by a variation (+α%) in the intensity of the pulse light from the excimer laser light source 1 and a control precision (±A%) of the exposure amount exposed to the wafer and set to satisfy the relationship: $A > (\alpha/\sqrt{N})$.

As the number N is set to, for example, N=40 in the manner as described above, the scanning velocity Vws can be determined from existing values of the width Dap and the frequency f. Suppose that the width Dap=8 mm and the frequency f=800 Hz, the velocity Vws is given as 160 mm. Among those figures, the number N can be made larger than the initial value, but it cannot be made smaller therefrom, in order to ensure the precision for controlling the exposure amount. On the other hand, the width Dap can also be made smaller than its initial value due to the size (diameter) of the vision field IF of the projection optical system PL, but it cannot be made larger than the initial value thereof.

In each case, the light quantity (illuminance value i) per pulse light is adjusted so as to set the relationship to satisfy the formulas: $A > (\alpha/\sqrt{N})$ and $N=f \times (Dap/Vws)$. At this end, the light extinction rate by the variable light extinction system 10 in FIG. 1 or the discharging voltage (in high volt) within the excimer laser light source 1 is to be adjusted.

Figure 12:
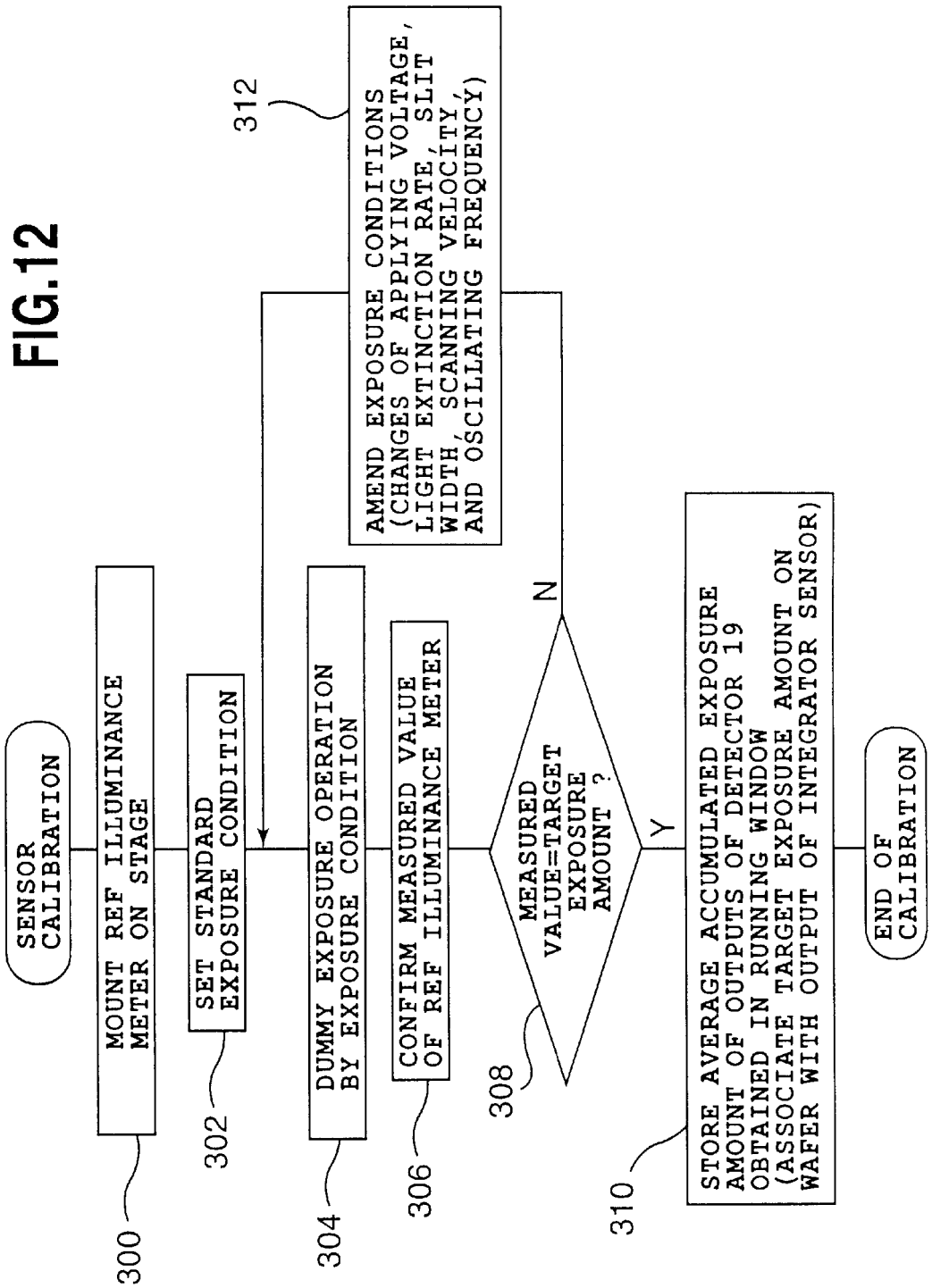
FIG. 12 is a flowchart indicating a flow of a calibration program to be executed by means of a processor in FIG. 11, in order to calibrate an output from an integrator sensor for controlling an exposure amount.

When the standard exposing conditions have been set in the manner as described above, a dummy exposure operation is carried out in a manner as shown at step 304 in FIG. 12. Upon the dummy exposure operation, the reticle R is removed from the reticle R stage 30 and the wafer stage 42 is aligned so as to locate a light receipt window of the reference illuminance meter on the wafer stage 42 right under the projection optical system PL.

Upon measurement of illuminance on the image plane side of the projection optical system PL, the way of measurement can be selected from the dynamic measurement of illuminance for scanning and transferring the wafer stage 42 in accordance with the standard exposing conditions and the static measurement of illuminance in which the illuminance is measured in a state in which the wafer stage 42 is stayed still. The static measurement of illuminance is of a type in which the wafer stage 42 is exposed to light in a still state under exposing conditions excluding the scanning velocity Vws set under the standard exposing conditions, while the light receipt window of the reference illuminance meter is stayed still within the effective projection region EIA.

Although the device according to the present invention can utilize each of both dynamic illuminance measurement and static illuminance measurement, the dummy exposure operation at step 304 is set so as to use the dynamic illuminance measurement. Therefore, at step 304, the wafer stage 42 is transferred with scanning at the velocity Vws so as to cause the light receipt window of the reference illuminance meter to cross in the Y-axial direction right under the effective projection region EIA.

As the scanning and transferring of the wafer stage for the dummy exposure operation has been finished, a measured value of the reference illuminance meter is confirmed as shown at step 306. The measured value represents an exposure amount provided at each point on the wafer by scanning the wafer stage 42 in a one direction. Then, at step 308, it is decided to determine whether the measured exposure amount is equal to a target exposure amount to be determined by a sensitivity to the resist.

When it is decided that the target exposure amount was not obtained at step 308, then the operator corrects the exposing conditions as shown at step 312. The correction usually includes an alteration of a high volt value of the excimer laser light source 1 or an alteration of the light extinction rate by the variable light extinction system 10. However, in some cases the slit width Dap of an exposing illumination light, the scanning velocity Vws or the oscillating frequency f also can be altered.

Once the exposing conditions have been corrected, the processes from step 304 are repeated until the decision at step 308 becomes YES. Then, when it is decided at step 308 that the measured value coincides with the target exposure amount within a predetermined acceptable scope (for example, ±0.2%), the process advances to step 310 at which the target exposure amount provided on the wafer is allowed to correspond to an output of an integrator sensor (the measured value of the accumulated light quantity by the photoelectric detector 19 in FIG. 1).

The process at step 310 is to determine a proportional relationship between the accumulated light quantity and the exposure amount, the accumulated light quantity being obtained by the photoelectric detector 19 for the pulse illumination light having the pulse number N and oscillating during a period of time during which the wafer stage 42 has been transferred by the width portion Dap in the scanning direction of the effective projection region EIA upon the scanning exposure, and the exposure amount being defined by the reference illuminance meter. At this end, a software-type running window is set in the processor 126 in FIG. 11, which can always monitor the accumulated light quantity of the pulse illumination light having pulses N, in synchronization with the oscillation of the pulse illumination light from the excimer laser light source 1.

Figure 13:
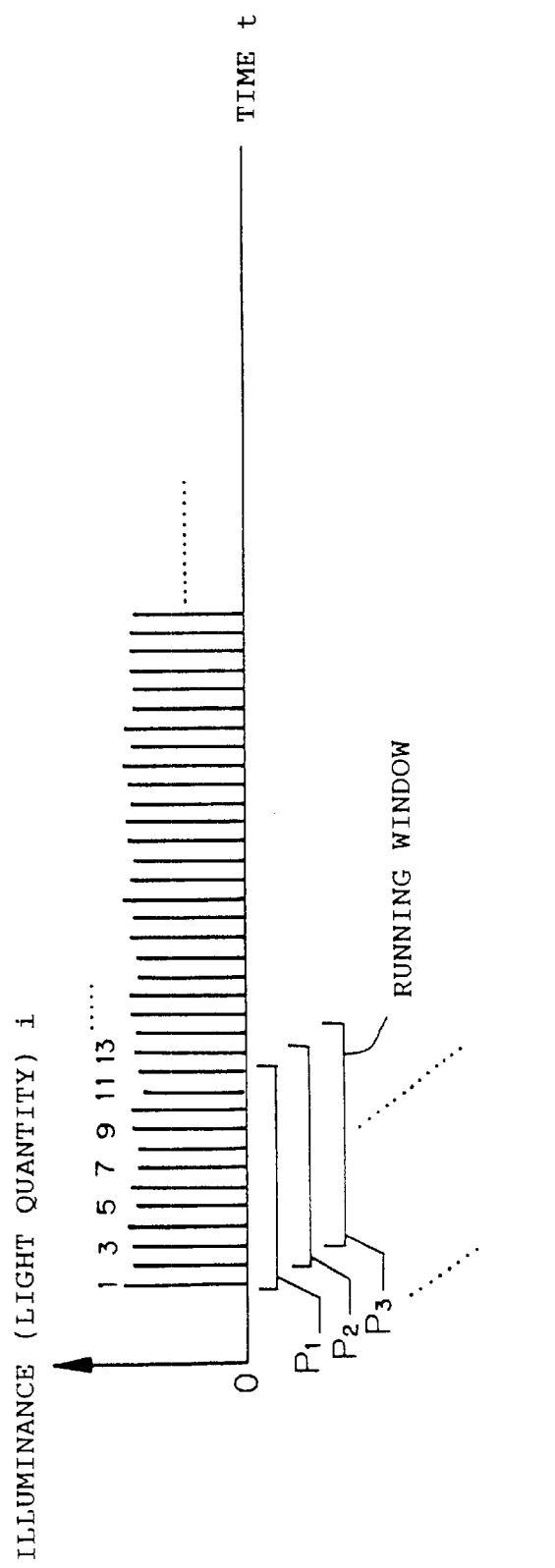
FIG. 13 is a graph for explaining a measurement method for measuring the exposure amount upon scanning exposure under illumination of pulse emission.

The running window can be operated in a manner as shown in FIG. 13 which shows an example of oscillation characteristics of pulse illumination light by representing the time t on the X-axis and the illuminance (or light quantity) value i of the pulse illumination light on the Y-axis. As shown in FIG. 13, the intensity of the pulse illumination light from the excimer laser light source 1 may cause a deviation for each pulse, even if it is oscillated at a constant frequency.

Therefore, the number of pulses N (the pulse number N being set herein to be N=12 for brevity of illustration in the drawing) determined as the width of the running window under the exposing conditions, and each of the accumulated light quantities P1, P2, P3, . . . , Pj, are calculated and saved in order in the running window, wherein the accumulated light quantity P1 is the accumulated light quantity from pulse 1 to pulse N of the pulse illumination light, the accumulated light quantity P2 is the accumulated light quantity from pulse 2 to pulse (N+1), the accumulated light quantity P3 is the accumulated light quantity from pulse 3 to pulse (N+2), and the subsequent accumulated light quantities being obtained in the like way as described immediately above.

Figure 11:
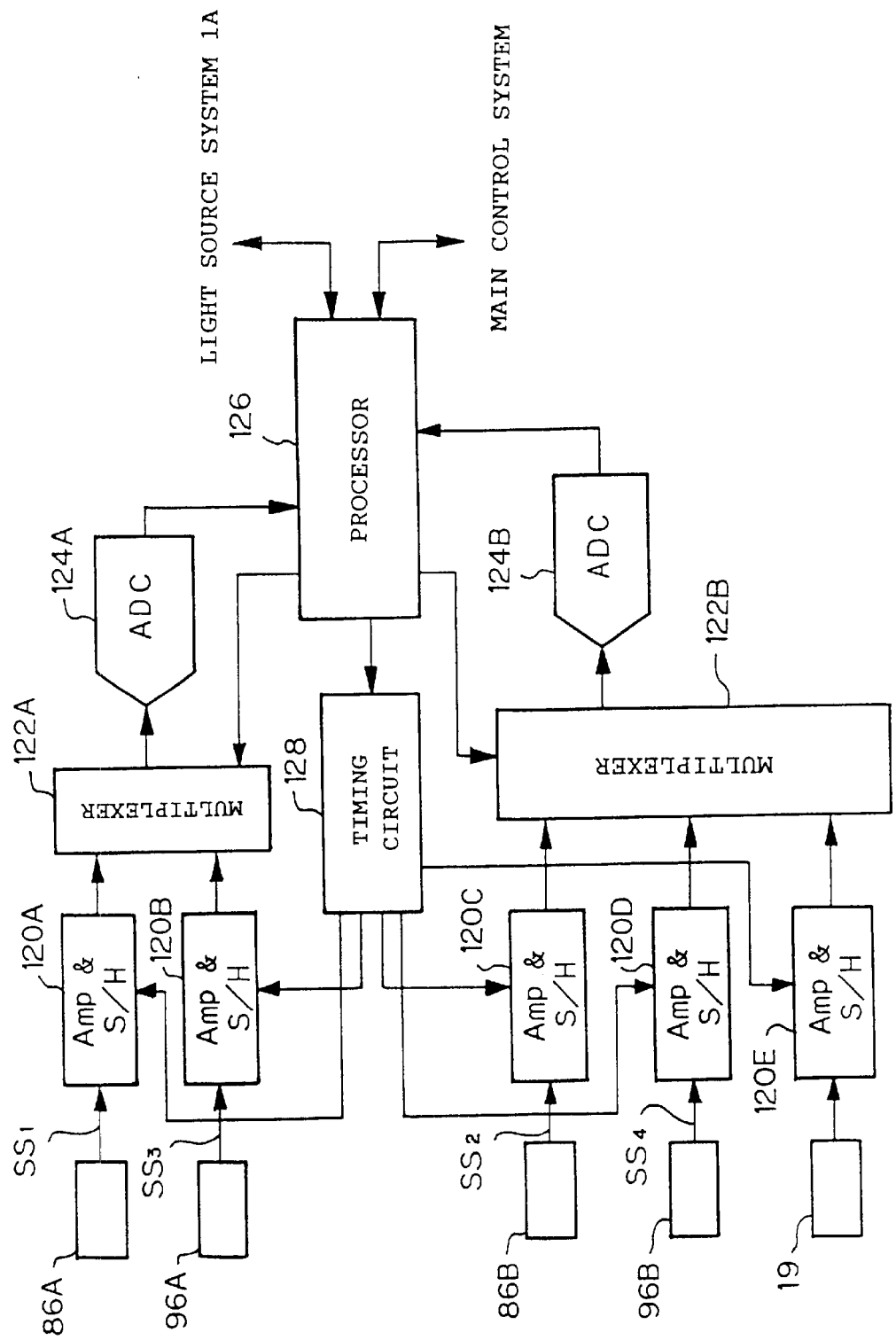
FIG. 11 is a view showing the construction of a processing circuit for processing a photoelectric signal from each of photoelectric detectors to be disposed on the transmittance measuring means as shown in FIGS. 5, 6, 8 and 9.

At this time, the processor 126 as shown in FIG. 11 reads data of the illuminance value (the light quantity value) i for each of the pulse illumination light one after another through the photoelectric detector 19, the S/H circuit 120E, the multiplexer 122B, and the ADC 124B, and adds the data of the illuminance value (the light quantity value) i corresponding to the number N within the running window, followed by storing the data therein. Each value of the accumulated light quantities P1, P2, P3, . . . , Pj should be present within the acceptance scope (for example, ±0.4%) for the target exposure amount, when a variation in oscillation of the excimer laser light source 1 is included within a standard and the exposing conditions are set in a favorable manner, that is, when the decision at step 308 is made YES.

It should be noted herein, however, that it is difficult to compare each value of the accumulated light quantities P1, P2, P3, . . . , Pj measured by the photoelectric detector 19 directly with the value of the target exposure amount defined by the reference illuminance meter, because measuring sensors to be used each therefor is different completely from each other. Therefore, at step 310, when the target exposure amount is obtained on the wafer side, the accumulated light quantities P1, P2, P3, . . . , Pj are determined in a manner as shown in FIG. 13, and an average value Pav (=Σ[Pn]) of the accumulated light quantities P1, P2, P3, . . . , Pj is computed as an output value of the integrator sensor, and a proportional constant k for the arget exposure amount at that time and the output value Pav of the integrator sensor is computed and then saved.

The constant k is one factor that is the basis for controlling the exposure amount hereinafter. Once the constant k can be determined accurately, then the accurate control over the exposure amount can be feasible on the basis of a value (corresponding to each of the accumulated light quantities P1, P2, P3, . . . , Pj in FIG. 13) obtained by accumulating signals from the photoelectric detector 19 in a running window type, and the constant k. The running window type referred to herein is to transfer a window in a software mode, in synchronization with the pulse emission of the excimer laser light source 1, however, it allows the operator to specify the start timing (to designate which start pulse is set to be pulse 1) optionally by the processor 126 in FIG. 11 on the basis of an instruction from the operator or an instruction on a program.

As the calibration program of FIG. 12 has been finished in the manner as described above, the absolute exposure amount provided on the wafer and the accumulated light quantity value measured by the photoelectric detector 19 are associated with the constant k. Therefore, when the operator sets a new target exposure amount Ed on the wafer, the exposing conditions, for example, for setting an accumulated light quantity value Pn measured in a running window type so as to satisfy k×Ed (or Ed/k), can be set automatically or manually through the exposing condition designating program in the processor 126.

Then, an example of the transmittance rate measuring program to be executed by the processor 126 in FIG. 11 will be described with reference to a flow chart of FIG. 14. The measurement operation of FIG. 14 is executed in response to an instruction from the main control system that controls the device in a comprehensive way at an appropriate time during operation of the exposure apparatus, i.e., at every appropriate time interval, for example, after operation for exchanges reticles R, at the time of starting the exposure processing for wafers of one lot, at the time of starting the exposure processing for one sheet of a wafer, at the time of appropriate shot exposure during exposure of one sheet of a wafer, during operation for exchanges wafers or reticles, and during a standby status of the device.

Figure 14:
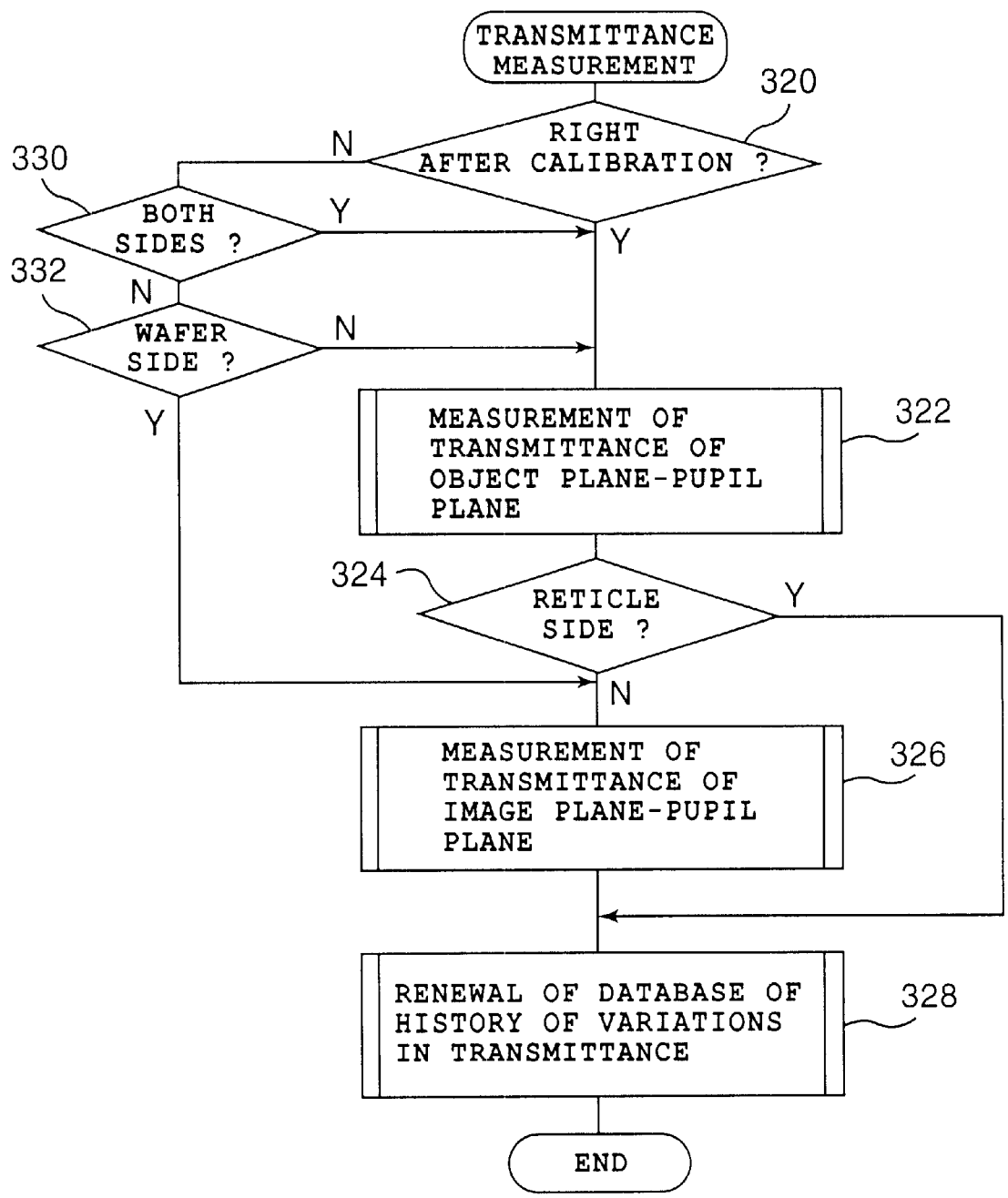
FIG. 14 is a flowchart indicating a flow of a transmittance measurement program for executing the measurement operation by each of the transmittance measuring means as shown in FIGS. 5, 6, 8 and 9.

Further, the program of FIG. 14 is executed automatically immediately after the execution of the calibration program of FIG. 13 as described above, and a flag may be set in advance for selecting a way of measurement from the measurement of a variation in transmittance between the object plane side PF1 and the pupil plane EP of the projection optical system PL (the measurement of transmittance on the reticle side) by means of the transmittance measurement means of FIGS. 5 and 6 and the measurement of a variation in transmittance between the image plane PF2 and the pupil plane EP (the measurement of transmittance on the wafer side) thereof by means of the transmittance measurement means of FIGS. 8 and 9.

Once the program of FIG. 14 has been executed, it is decided at step 320 to determine whether this execution has been started immediately after the calibration operation of FIG. 13. If it is decided that the program of FIG. 14 has been executed immediately after the execution of the calibration operation, a flag is set so as to execute the measurement of transmittance both for the reticle side and the wafer side, and a transmittance measurement routine between the object plane and the image plane using the measurement means of FIGS. 5 and 6 is executed in a manner as shown at step 322. A detailed description of this routine will be made hereinafter.

As the routine at step 322 has been finished, then it is decided to determine whether the transmittance has been measured for the reticle side only as shown at step 324. When it is decided at step 320 as having been executed immediately after calibration, then the flag is set so as to make measurements for both the reticle side and the wafer side, so that the process advances to step 326 at which a transmittance measurement routine between the image plane and the pupil plane is executed using the measurement means of FIGS. 8 and 9. A detailed description will be made of the operation of the routine in more detail.

Finally, at step 328, database of a history of variations in transmittance is renewed or updated on the basis of data relating to the transmittance obtained by the measurement of transmittance on the reticle side at step 322 and data relating to the transmittance obtained by the measurement of transmittance on the wafer side at step 326. The database saves a history of variations in transmittance of the projection optical system PL during a period of time ranging from a certain point of time in the past to the current point of time as well as a history of correction coefficients for controlling the exposure amount in accordance with such variations in transmittance. Such correction coefficients can be calculated on the basis of the variations in transmittance and are each an operator that acts directly on a part of the exposing conditions.

On the other hand, when it is decided at the previous step 320 that the timing of executing the program of FIG. 14 is not immediately after calibration, then the process advances to step 330 at which the contents of setting the flag are checked. When the flag is set so as to perform the measurement of transmittance for both the reticle side and the wafer side, the processes at steps 322, 324, 326 and 328 are executed. On the other hand, when it is decided at step 320 that no measurement of transmittance for both sides is set, then it is decided to determine if the flag is set for the measurement of transmittance for the wafer side only as shown at step 332.

Then, at step 332, it is decided that the measurement for transmittance is only for the wafer side, then the processes at steps 326 and 328 are to be executed. On the other hand, when it is decided at step 332 that the measurement is not made for the wafer side only (in other words, the measurement for transmittance for the reticle side only), then the processes at the steps 322, 324, and 328 are to be executed. The processes as described above then conclude the operation of the transmittance measurement program.

Next, a description will be made of the transmittance measurement routine at step 322 in FIG. 14. In this measurement routine, the reticle R stage 30 is first set at an appropriate position as indicated in FIG. 7, and the shutter 101A is shut off while the other shutter 101B is opened, as shown in FIG. 10. Then, the light extinction rate of the variable light extinction system 10 in FIGS. 1 and 10 is set to be a value suitable for the measurement for transmittance.

Then, the excimer laser light source 1 is triggered on the basis of an instruction from the processor 126 in FIG. 11, and pulses are oscillated by an appropriate number of pulses. The processor 126 reads a wave-shaped level (illuminance) of the signal SS1 from the photoelectric detector 86A in FIG. 11 through the S/H circuit 120A, the multiplexer 122A and the ADC 124A, in synchronism with the triggering, and at the same time a wave-shaped level (illuminance) of the signal SS2 from the photoelectric detector 86B through the S/H circuit 120C, the multiplexer 122B and the ADC 124B.

At this time, when the wave-shaped level of the signal SS1 read from the ADC 124A is referred to as I1$j$ (j being a number of pulse light) and the wave-shaped level of the signal SS2 read from the ADC 124B is referred to as I2$j$, the processor 126 obtains a value Irn corresponding to the transmittance sequentially in accordance with the formula: Irn=I2$j$/I1$j$, whenever each pulse light is emitted. As the pulse emission has been finished, the processor 126 calculates an averaged value Ir (=[$\Sigma$(Irn)]/n) obtained by averaging the value Irn corresponding to the transmittance obtained for each of the pulse light number n as a transmittance or transmissivity between the object plane side PF1 and the pupil plane EP of the projection optical system PL. The value Ir for the transmittance is saved in database at step 328 in FIG. 14.

Likewise, in the transmittance measurement routine at step 326 in FIG. 14, the wafer stage 42 is first set at an appropriate position as shown in FIGS. 8 and 9, and the shutter 101A is shut off while the shutter 101B is opened, as shown in FIG. 10. Then, the light extinction rate of the variable light extinction system 10 in FIGS. 1 and 10 is set to be a value appropriate for the measurement of transmittance.

Then, the excimer laser light source 1 is triggered on the basis of an instruction from the processor 126 in FIG. 11, and pulses are oscillated by am appropriate number of pulses. The processor 126 reads a wave-shaped level (illuminance) of the signal SS3 from the photoelectric detector 96A in FIG. 11 through the S/H circuit 120B, the multiplexer 122A and the ADC 124A, in synchronism with the triggering, and at the same time a wave-shaped level (illuminance) of the signal SS4 from the photoelectric detector 96B through the S/H circuit 120D, the multiplexer 122B and the ADC 124B.

At this time, when the wave-shaped level of the signal SS3 read from the ADC 124A is referred to as I3$j$ (j being a number of pulse light) and the wave-shaped level of the signal SS4 read from the ADC 124B is referred to as I4$j$, the processor 126 obtains a value Iwn corresponding to the transmittance sequentially in accordance with the formula: Iwn=I4$j$/I3$j$, whenever each pulse light is emitted. As the pulse emission has been finished, the processor 126 calculates an averaged value Iw (=[Σ(Iwn)]/n) obtained by averaging the value Iwn corresponding to the transmittance obtained for each of the pulse light number n as a transmittance rate or transmissivity between the image plane PF2 and the pupil plane EP of the projection optical system PL. The value Iw for the transmittance rate is saved in database at step 328 in FIG. 14.

It is to be noted herein, however, that although the averaged pulse number n is set with the purpose to improve deterioration in an error of measurement due to a fluctuation in detection mainly upon photoelectric detection, the values Ir and Iw of transmittance may be obtained by emission of one pulse, if such a fluctuation in detection can be disregarded.

Further, the processor 126 determines a correction coefficient at the time of controlling the exposure amount by operation on the basis of the values Ir and Iw of transmittance obtained in the manner as described above, upon renewal of database in FIG. 14. In this case, when it was decided at step 320 in FIG. 14 that the calibration program has been executed immediately beforehand, the values Ir and Iw of transmittance obtained are saved as initial values IrO and IwO of transmittance, respectively, in the database.

Therefore, the correction coefficient at the time of controlling the exposure amount is computed, up to the next execution of the calibration program, using as a reference a proportional constant k for the target exposure amount saved at the time of execution of the calibration program at this time and the output value Pav (the average accumulated light quality obtained at step 310 in FIG. 12) of the integrator sensor, and the initial values, IrO and IwO, of transmittance obtained by the transmittance measurement program to be executed concurrently therewith.

More specifically, when the values Ir and Iw of transmittance are to be obtained by executing the transmittance measurement program at step 322 or step 326 in FIG. 14 after some time has elapsed from the execution of the calibration program, the processor 126 gives a correction coefficient Ve at the time of controlling the exposure amount by the following formula:

Ve=(Ir/IrO)×(Iw/IwO).

The correction coefficient Ve is Ve=1, as a matter of course, when there is no variation in transmittance. When transmittance varies to some extent in accordance with an elapse of time after the time of execution of the calibration program, the correction coefficient Ve gives an integer other than 1. Although the correction coefficient Ve is less than 1 in many cases, it can give the numeral larger than 1 due to the state of use of the exposure apparatus, the timing of execution of the calibration program, and so on. Further, the correction coefficient Ve means that an actual exposure amount provided on the wafer causes an error by (Ve−1) with respect to the target value, even if the exposure amount is controlled so as to make the output value of the integrator sensor equal to the value Paw corresponding to the target exposure amount.

Therefore, in this case, the exposure amount can be controlled so as to make the output value of the integrator sensor equal to a value (Pav/Ve) in order to bring the actual exposure amount into agreement with the target value. It is to be noted, however, that as the actual value of the target exposure amount can be altered optionally by the input from the operator, the exposure amount may be controlled so as to make the output value (an average value of the accumulated light quantity) of the integrator sensor equal to a value (Eg/k×Ve), upon exposure to the wafer, when the target exposure amount provided on the wafer is set to be Eg, because the relationship of Eg=k×Pav is established by the proportional constant k obtainable by the calibration program.

Therefore, when both the calibration program in FIG. 12 and the transmittance measurement program in FIG. 14 are both executed at steps 322 and 326, respectively, upon updating the database as shown at step 328 in FIG. 14, the proportional constant k and the correction coefficient Ve are both updated to latest values. When only the transmittance measurement program in FIG. 14 is executed, the correction coefficient Ve is updated to a latest value. It is to be noted herein, however, that the values Ir and Iw (IrO and IwO) of transmittance measured are saved in database for a period of time of one day, one week or one month, together with information on the measuring time and measuring timing, and they are utilized for analysis and prediction of the feature or tendency of the variations in transmittance.

Now, a description will be made of an example of variations in transmittance of the projection optical system PL with reference to FIG. 15. FIG. 15(A) is a graph in which time t is given on the X-axis and the values Ir and Iw of transmittance measured are given on the Y-axis. FIG. 15(B) is a graph in which time t is given on the X-axis and the value of the correction coefficient Ve is given on the Y-axis.

In FIG. 15(A), a period of time from time T1 to time T2 is a period of time during which lots are exchanged or reticles are exchanged after the previous processing by exposure has been finished and during which the exposing illumination light does not pass through the projection optical system PL. As molecules of impurities floating in the barrel of the projection optical system PL may be attached or deposited gradually to or on the surface of an optical element during this period of time, there is the tendency that the transmittance values Ir and Iw become gradually smaller when the transmittance is measured at an appropriate time interval between times T1 and T2.

The period of time between times T2 to T3 in FIG. 15(A) is a period of time during which plural sheets (a representative lot comprising 25 sheets) of wafers in a new lot are processed continually by exposure processes, and the exposing illumination light continues passing through the projection optical system PL, excluding a period of time required for exchanging wafers (for example, from 15 to 30 seconds) by work in exchanging one sheet of a wafer, aligning a wafer, etc. At this end, the molecules of impurities deposited on the surface of each optical element within the projection optical system PL are released gradually in a space by a cleaning action of ultraviolet rays by irradiation of the exposing illumination light, and there is the tendency that the values Ir and Iw for the transmittance rate of the projection optical system PL become gradually larger.

When the calibration program of FIG. 12 is executed at the time of starting the lot exposure processing at time T2 and at the same time the transmittance measurement program of FIG. 14 is executed, the correction coefficient Ve determined at time T2 is renewed to 1, as shown in FIG. 15(B). Thereafter, as the transmittance measurement program is executed each at an appropriate time interval during the lot exposure processing to give the transmittance values Ir and Iw and the correction coefficient Ve is computed, the correction coefficient Ve tends to become gradually larger because there is the tendency that the transmittance rate of the projection optical system PL becomes gradually larger during the period of time from time T2 to time T3.

Then, when the lot exposure processing has been completed at time T3, the transmittance rate of the projection optical system PL becomes smaller gradually in the case of the period of time between time T1 to time T2. When the transmittance measurement program is executed at every appropriate time interval until time T4 when the next lot exposure processing starts and the transmittance rate values Ir and Iw are given, the correction coefficient Ve is computed as a value that has the tendency to become smaller gradually.

Immediately before the start of executing the next lot exposure processing at time T4, the calibration program of FIG. 12 and the transmittance measurement program of FIG. 14 are executed again, so that the correction coefficient Ve is reset again to 1 at time T4. It should be noted herein, however, that when the calibration program of FIG. 12 and the transmittance measurement program of FIG. 14 are executed at time T3 in FIG. 15, the correction coefficient Ve is shifted in a parallel mode to a correction coefficient Ve' in FIG. 15(B).

As shown in FIG. 15, the correction coefficient Ve (or Ve') represents a variation characteristic of a transmittance rate of the projection optical system PL at the point of time, as a reference, when the calibration program has been executed. When the progress of the correction coefficient Ve (or Ve') is associated with various timings of the exposure processing operations and the resulting data is saved as a history on database, the data can present the advantage in that it can be confirmed immediately whether defects are caused from a poor control of the exposure amount or not, in the case where such defects are found during an inspection step of inspecting a line width or an image quality of a pattern on the wafer which has been subjected to exposing processes.

In FIG. 15(A), the values Ir and Iw for transmittance are set so as to vary in a generally equal characteristic manner. It can be noted herein, however, that they are not limited to the mode that they always vary in such an equal characteristic manner and that there may be the case where either one can vary to an extremely slow extent, due to the construction or disposition of optical lens elements in the projection optical system PL or kinds of a glass material therefor. In this case, it is also possible to disregard the transmittance value that varies to a very slow extent from the viewpoint of a precision required for controlling the exposure amount. In other words, in this case, it is possible to measure either one of a variation in transmittance from the object plane to the pupil plane of the projection optical system PL and a variation in transmittance from the pupil plane to the image plane by either one of the transmittance measuring means of FIGS. 5 and 6 as well as the transmittance measuring means of FIGS. 8 and 9.

Figure 16:
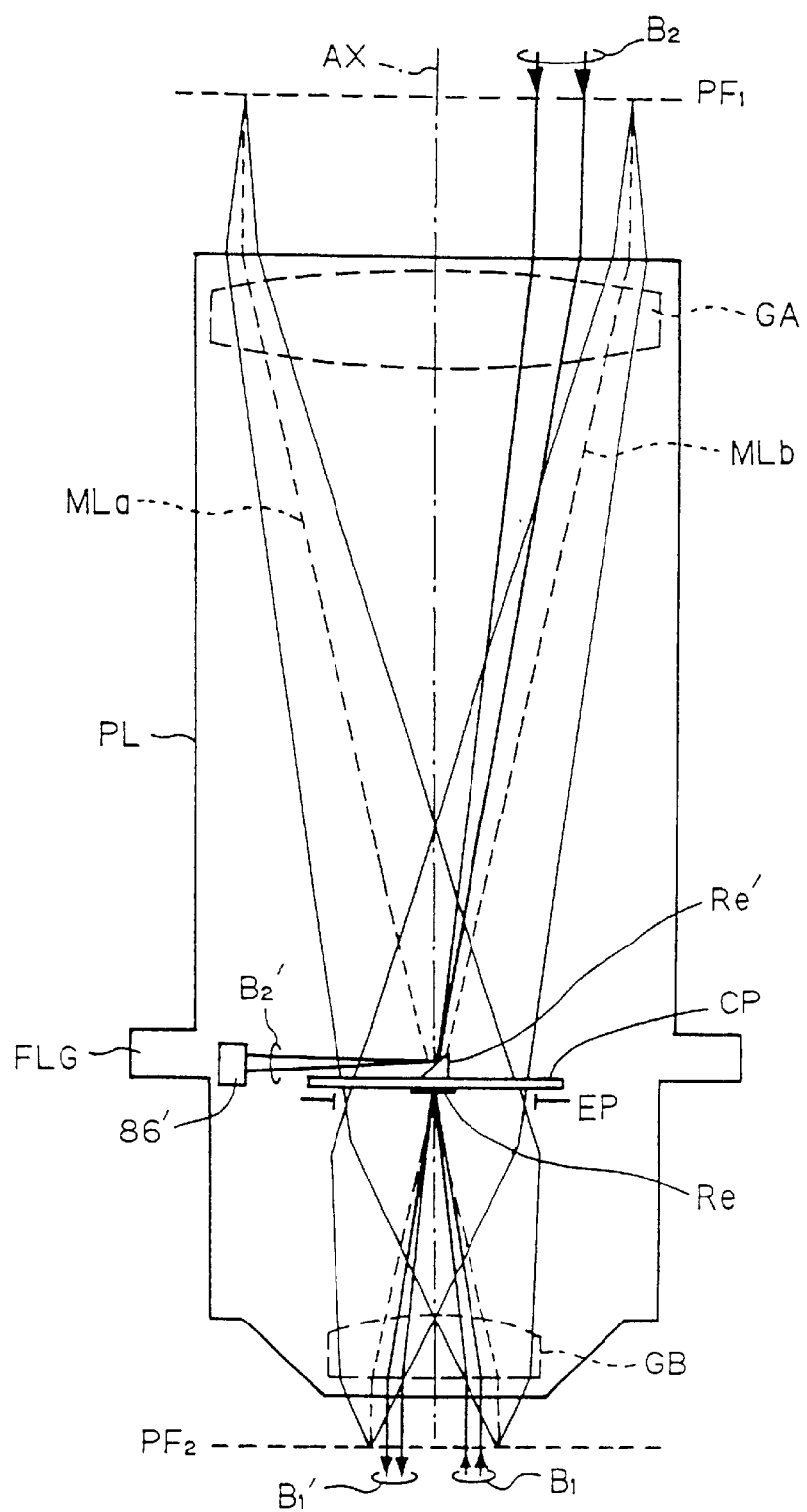
FIG. 16 is a view showing another construction of the reflecting member to be disposed in the vicinity of the pupil plane of the projection optical system and a detector for receiving reflected beams.

Then, a description will be made of another embodiments applicable to the present invention with reference to FIGS. 16 and 17. First, FIG. 16 shows a construction of a projection optical system PL corresponding to the projection optical system PL as shown in FIG. 2. This construction has the feature in a structure of a reflecting member (a transparent plate CP) disposed on the pupil plane EP, in particular in a passage for use in measuring transmittance within a projection light path extending from the object plane side PF1 to the pupil plane EP. In other words, as shown in FIG. 16, measuring beams B2 incident from the object plane side PF1 side are reflected in a transverse direction by a small reflecting member Re' disposed obliquely on the transparent plate CP at the center of the pupil plane EP of the projection optical system PL and then received by a photoelectric detector 86' disposed in the barrel of the projection optical system PL or on an outer wall of the barrel thereof.

The photoelectric detector 86' can be used in place of the photoelectric detector 86B as shown in FIGS. 5 and 6, and can measure a transmittance value Ir on the basis of its photoelectric signal in the same manner as above. In the construction as shown in FIG. 16, the reflected beams reflected from the reflecting member Re' are not returned to the object plane side PF1 side, so that the transmittance measuring means as shown in FIGS. 5 and 6 can be provided simply with a system for irradiating the measuring beams B2. Therefore, this construction is advantageous in terms of its compact structure.

Although FIG. 16 shows the construction in which the reflecting oblique member Re' is disposed only on the upper side of the transparent plate CP, however, it should be noted herein that the reflecting member Re' may also be disposed on the lower side of the transparent plate CP. In this case, the measuring beams B1 incident from the projection imaging plane PF2 side of the projection optical system PL can be reflected in a transverse direction in the vicinity of the pupil plane EP thereof and then detected in a photoelectric way, so that this construction presents the advantage in that the structure of the transmittance measuring means as shown in FIGS. 8 and 9 can be made compact in size.

Figure 17:
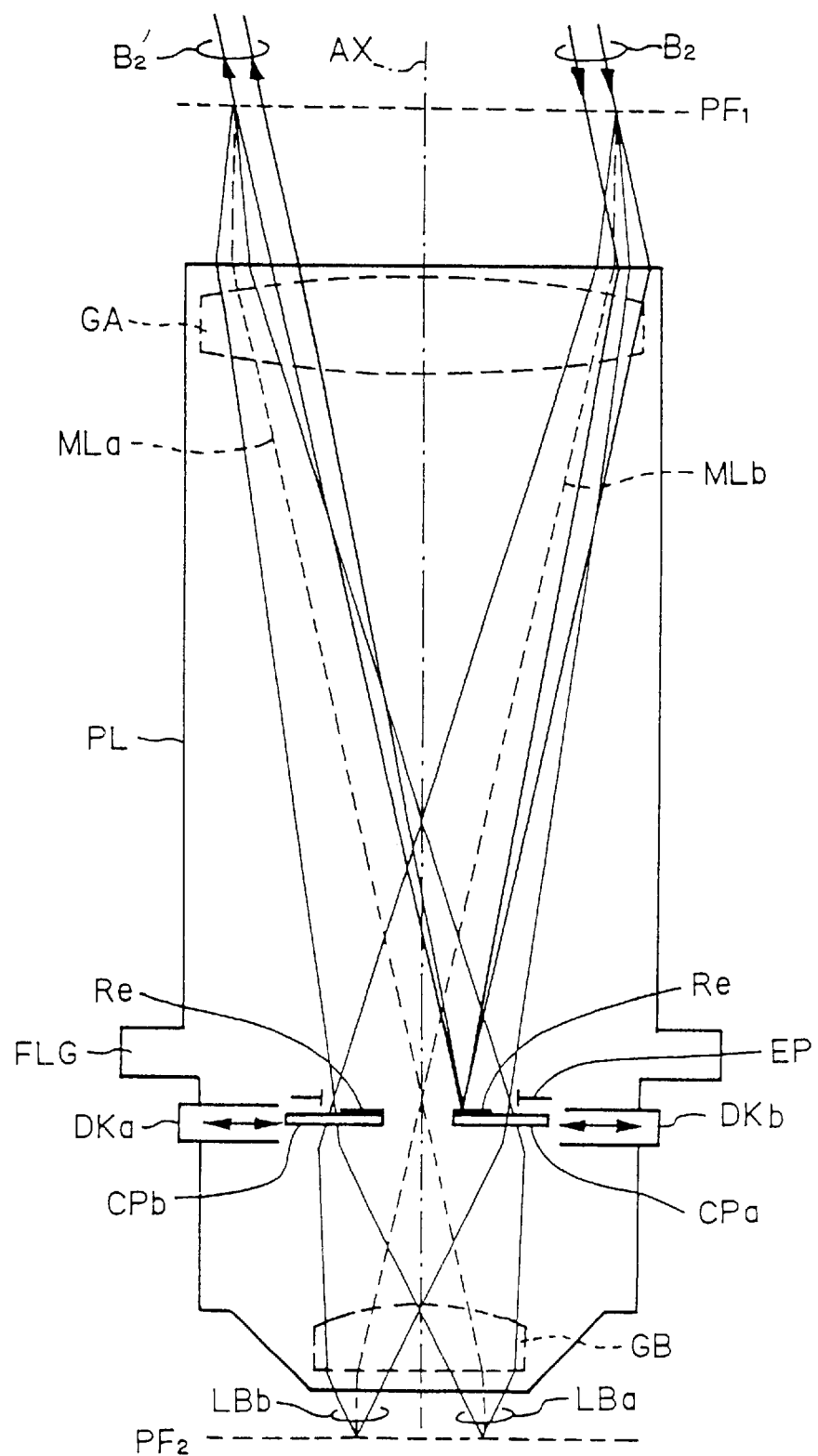
FIG. 17 is a view showing another construction of the reflecting member to be disposed in the vicinity of the pupil plane of the projection optical system and a projection optical system.

Now, turning to FIG. 17, this embodiment is shown therein to have the construction of the projection optical system PL corresponding to the projection optical system PL as shown in FIG. 2 above. The projection optical system PL according to this embodiment is characterized by the structure of a reflecting member Re (a transparent plate CP) disposed on the pupil plane EP thereof. In particular, the projection optical system PL is characterized by a path for use in measuring transmittance within a projection light path extending from the object plane side PF1 to the pupil plane EP thereof. In other words, as shown in FIG. 17, main light rays are incident to the projection optical system PL in a direction oblique to the light axis AX, although the measuring beams B2 incident from the object plane side PF1 side are a parallel light flux. With this construction, the measuring beams B2 reaching the pupil plane EP of the projection optical system PL are allowed to converge at a position in the vicinity of the pupil plane EP thereof.

Therefore, in this embodiment, the plates CPa and CPb on which the reflecting member Re is formed are disposed detachably at a peripheral portion of the pupil plane EP, each of the plates CPa and CPb is disposed so as to be movable by means of respective drive mechanisms DKa and DKb in order to allow the reflecting member Re to be inserted in the position through which the measuring beams B2 pass at the peripheral portion of the pupil plane EP upon measuring the transmittance. With this configuration, the reflected beams B2' from the pupil plane EP have the main light rays advance in an oblique direction with respect to the light axis AX upon passage through the object plane side PF1, however, they can maintain a collimated state.

This embodiment can provide the advantages in that the transparent plate CP as large in size as covering the entire area of the pupil plane EP of the projection optical system PL is not required any more and that a quality of a pattern projection image can be sustained in the highest state and a loss of the exposure amount provided on the wafer can be reduced because no barrier exists for the pupil plane EP even during a period of time during which a pattern of a reticle is exposed by projection.

It should be noted herein, however, that for the construction as shown in FIG. 17, as a matter of course, the movable reflecting member Re can also be formed on the lower side of each of the plates CPa and CPb and that a reflecting surface can be disposed for the measuring beams B1 from the image plane PF2. In this case, the measuring beams B1 are incident to the projection optical system PL in a direction oblique to the light axis AX while they are maintained in a state in which they stay collimated.

It also should be noted herein that, when this construction assumes the provision of the drive mechanisms Dka and DKb, the similar effects can also be achieved by a construction in which the movable reflecting member Re is formed on the transparent plate CP so as to cover the entire area of the pupil plane EP of the projection optical system PL and the transparent plate CP in its entirety is inserted into or retracted from the projection optical system PL. In this case, when the transmittance measurement program is to be executed, the transparent plate CP can be moved by sliding in the vicinity of the pupil plane EP and, when the measurement for the transmittance has been finished, the transparent plate CP can be moved by sliding outside the projection light path.

With the configuration as described above, the movable reflecting member Re can also function as a shutter for blocking the entirety of the pupil plane EP of the projection optical system PL, so that this construction can provide the advantage in that an unnecessary exposure by a slight amount of stray light can be prevented to a full extent upon irradiating the measuring beams B2 from the object plane side PF1 side of the projection optical system PL, even if the wafer W would be located right under the projection optical system PL.

It should also be noted herein that a variation in transmittance may occur likewise in the illumination optical system as well as in the projection optical system PL. For example, for the exposure apparatus as shown in FIG. 1, the photoelectric detector 19 of FIG. 1 is used for controlling the exposure amount, so that an error portion in the exposure amount cannot be measured the photoelectric detector 19 on a real time basis, the error occurs due to an influence of a variation in transmittance within an illumination light path extending from the beam splitter 17 to the main condenser lens system 26, the beam splitter 17 being dividing a part of the exposing illumination light for the photoelectric detector 19.

When each of the programs as shown in FIGS. 12 and 14 is executed by means of the transmittance measuring means as described in FIGS. 5 and 6 as well as FIGS. 8 and 9, such an error in the control of the exposure amount can be corrected which might be caused by a variation in transmittance of the illumination optical system, however, a variation in transmittance in the illumination optical system itself cannot be measured. Therefore, a description will be made of a type for correcting the control of the exposure amount with reference to FIG. 18, while measuring a variation in transmittance for both the illumination optical system and the projection optical system PL.

Figure 18:
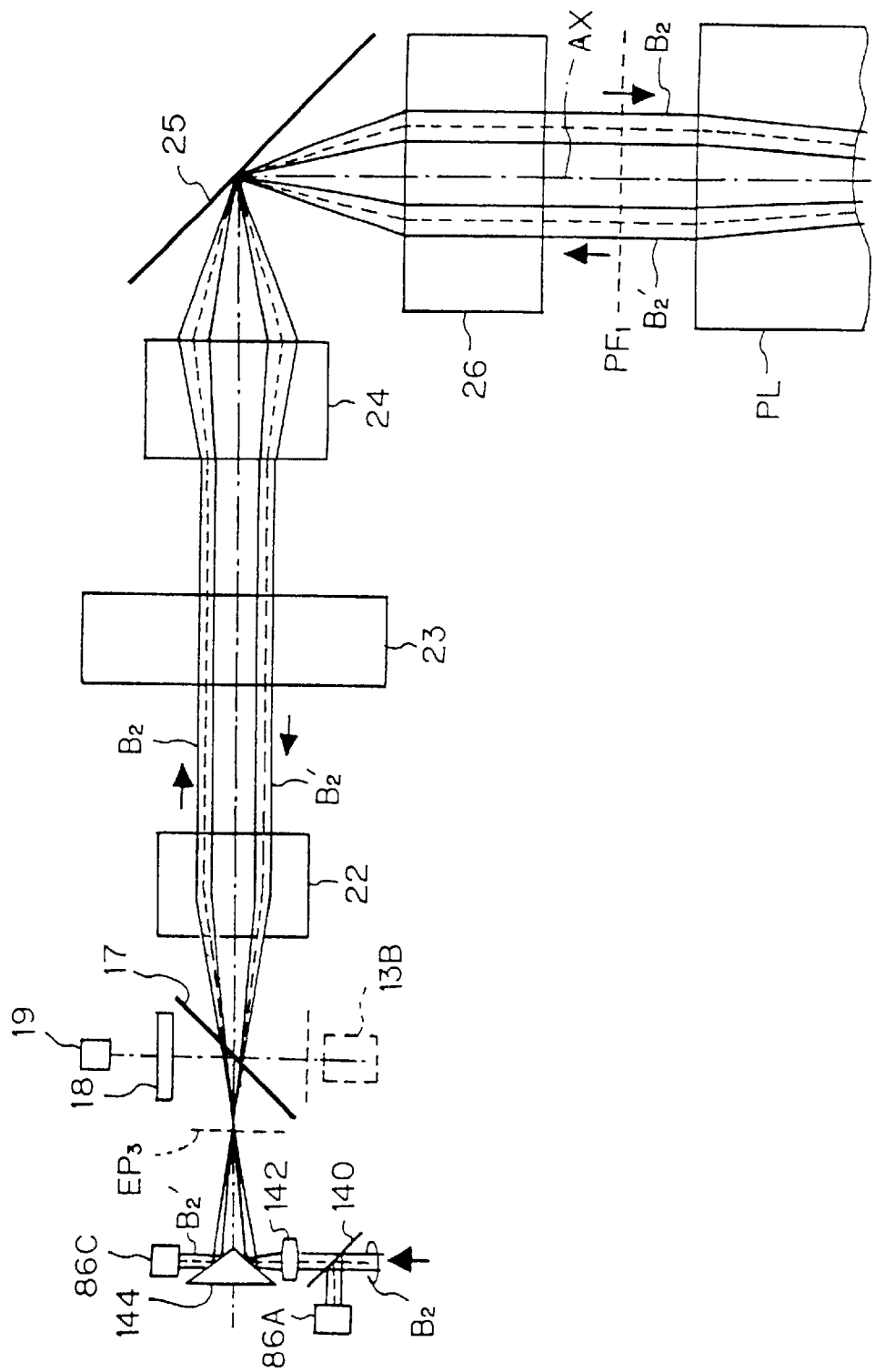
FIG. 18 is a view showing the construction of the transmittance measuring means in a third embodiment of the present invention.

FIG. 18 shows a configuration of the correction type, in which the measuring beams B2 from the transmittance measuring means as shown in FIGS. 5 and 6 are supplied through an exposing illumination optical system (composed of a system ranging from the beam splitter 17 to the main condenser lens system 26 in this embodiment). Further, as shown in FIG. 18, the elements constituting the exposing illumination optical system, including the second fly-eye lens 13B, the beam splitter 17, the condensing lens system 22, the reticle blind mechanism 23, the imaging condensing lens system 24, the mirror 25, and the condenser lens system 26, are disposed in substantially the same manner as shown in FIG. 1.

In this embodiment, however, the transmittance monitor system (including the lens system 20 and the photoelectric detector 21) as shown on the left side of the beam splitter 17 in FIG. 1 is omitted, and instead there may be installed therein an irradiation system for producing the measuring beams B2 for measuring transmittance and a light recipient system for photoelectrically detecting the reflected beams B2' from the pupil plane EP of the projection optical system PL.

More specifically, the measuring beams B2 collimated by a beam shaping optical system as shown in FIG. 10 are incident to a beam splitter 140 in FIG. 18, and the beam intensity of a part of the beams reflected at the beam splitter 140 is detected photoelectrically by means of the photoelectric detector 86D to give the signal SS1 as a reference. On the other hand, the measuring beams B2 passing through the beam splitter 140 are converted by a lens system 142 into a converging light flux which in turn is reflected one reflecting plane of a prism mirror 144 and reaches the center of a pupil plane EP3.

The pupil plane EP3 is located at the position corresponding to a secondary light source plane formed on the leaving plane side of the second fly-eye lens 13B, and is a plane that is conjugated with the pupil plane EP of the projection optical system PL. Therefore, when the measuring beams B2 are set so as to pass through the center of the pupil plane EP3 in a state inclining at an angle with respect to the light axis AX and to converge at the center of the pupil plane EP3, the measuring beams B2 can be converged just at the pupil plane EP of the projection optical system PL toward the reflecting member Re, as shown in FIG. 2.

The measuring beams B2 passed through the pupil plane EP3 are converted into a nearly parallel light flux by the condensing lens system 22 and then converted into a parallel light flux, again, through an opening portion of the reticle blind mechanism 23 by means of the imaging lens system 24, the mirror 25, and the condenser lens system 26, the resulting parallel light flux being incident to the projection optical system PL. On the other hand, the reflected beams B2' from the reflecting member Re disposed in the vicinity of the pupil plane EP of the projection optical system PL pass along a light path symmetrical to the measuring beams B2 with respect to the light axis AX common with the projection optical system PL and the illumination optical system, through the main condenser lens system 26, the imaging lens system 24, the reticle blind mechanism 23 and the condensing lens 22 in this order, thereby being converged at the central portion of the pupil plane EP and then allowed to disperse.

Moreover, the reflected beams B2' from the condensing lens system 22 are reflected with the other reflecting plane of the prism mirror 144 and then received by the photoelectric detector 86C. A level of a signal SS5 from the photoelectric detector 86C undergoes influences from the transmittance of both the illumination optical system and the projection optical system PL, and a variation in transmittance by both the illumination optical system and the projection optical system PL can be given by calculating a periodical variation in a ratio (SS5/SS1) of the level of the signal SS5 to the signal SS1 from the photoelectric detector 86A.

The embodiments as described above enable an accurate measurement for a transmittance value (corresponding to the value Ir), in which the illumination optical system subsequent to the beam splitter 17 branching a part of the illumination light to an integrator sensor (the photoelectric detector 19) to be used for controls over the exposure amount is combined with the projection light path extending up to the pupil plane EP of the projection optical system PL, and for a transmittance variation characteristic (corresponding to the correction coefficient Ve). Therefore, this construction can provide the advantage that an accurate management for a control precision at the time of the control over exposure can be fulfilled by adding an influence from a variation in transmittance of the illumination optical system. Further, this construction does not require the provision of the mirror 25 with a partially permeable portion in the illumination optical system, unlike in the case as shown in FIGS. 5 and 6, so that this construction can present the advantage that no loss is caused thereby for the exposing illumination light.

Moreover, in the case where there can be adopted a movable reflecting member Re (a movable transparent plate CP) having an area that can cover the entirety of the pupil plane EP of the projection optical system PL, as described in connection with FIG. 17, the measurement of transmittance can be made in substantially the same manner as above by using the exposing illumination light, even if the measuring beams B2 collimated could not particularly be formed as shown in FIG. 18. More specifically, when the transmittance measurement program is to be executed, the movable reflecting member Re is inserted in the vicinity of the pupil plane EP of the projection optical system PL in a state in which no reticle is loaded, the exposing pulse illumination light is irradiated in the such state toward the projection optical system PL through the second fly-eye lens 13B as shown in FIG. 1.

It is possible to easily measure a transmittance value or a variation in transmittance or the correction coefficient Ve, with both of the illumination optical system and the projection optical system PL added thereto, by determining a ratio (i qb/i qa) i qb of an illuminance value (light quantity) per pulse light to be detected with the photoelectric detector 21 for the reflectance to an illuminance value (light quantity) i qa per pulse light to be detected with the photoelectric detector 19 for monitoring the integrator sensor as shown in FIG. 1.

With this configuration, a system extending from the excimer laser light source 1 to the second fly-eye lens system 13B as shown in FIG. 1 can also be used as the irradiation system of the measuring beams at the time for measuring the transmittance, and a reflectance monitor system extending from the beam splitter 17 to the photoelectric detector 21 as shown in FIG. 1 can also be used as a light recipient system at the time for measuring the transmittance, so that this construction does not require the transmittance measuring means as shown in FIGS. 5 and 6 and in FIG. 18 as well as the beam shaping optical system as shown in FIG. 18 to be used any more. Therefore, this device construction can achieve remarkable effects that the structure of the device can be made compact in size as a whole and costs for production can be reduced to a great extent.

It should be noted herein, however, that when the exposing illumination light from the second fly-eye lens system (an optical integrator) 13B is also used as measuring beams at the time for measuring the transmittance in the manner as described above, the exposing illumination light becomes a light flux accompanying a certain number of openings (NA) at the object plane side PF1 of the projection optical system PL because they are supplied so as to become an image of a light source having an area at the pupil plane EP of the projection optical system PL. Therefore, when the exposing illumination light from the second fly-eye lens system 13B are utilized as measuring beams, the measuring beams are not present in a collimated state at the object plane side PF1.

Although each of the embodiments according to the present invention has been described above, it should be noted herein that the present invention can be applied in the same manner as described above not only to an exposure apparatus having a projection optical system composed only of refractive optical elements (transparent elements such as lenses, etc.) made of quartz or fluorite as a optical glass material, but also to an exposure apparatus with a projection optical system of a catadioptric type equipped in which the such refractive optical elements are combined with reflective optical elements (particularly a concave mirror). In some cases, the present invention can be likewise applied to an exposure apparatus with a full reflective projection system composed only of plural sheets of reflective optical elements.

When the exposure apparatus is equipped with an optical element system of the such catadioptric type or full reflective projection type, a reflectance or reflectivity at each of the reflective optical elements may vary with an amount of particles of impurities attached or deposited on the surface of each of the reflective optical elements, and an attenuation factor (a transmittance or a reflectance) of the entirety of the projection optical system may be caused to vary thereby. Therefore, in the case of the projection optical systems including the reflective optical elements, a value corresponding to the attenuation factor (transmittance or reflectance) or a variation in the attenuation factor (a variation in the transmittance or in the reflectance) can also be obtained in the thoroughly same manner as described above.

Then, a description will be made briefly of some examples of projection optical elements of a catadioptric type, with reference to FIG. 19.

FIG. 19(A) shows a condensed projection optical system in which refractive optical elements (lens system) GS1 to GS4, inclusive, and a concave mirror MRs are combined with a beam splitter PBS. The feature of this system resides in that an imaging light flux from the reticle R is reflected at the concave mirror MRs through a large-sized beam splitter PBS and returned again to the beam splitter PBS, thereby focusing an image on the projection imaging plane PF2 (on the wafer W) at a given reduction rate by means of the refractive lens system GS4. A detailed description is disclosed in Japanese Patent Application Laid-Open No. 3-282, 527 (U.S. Pat. No. 5,220,454).

Moreover, the transparent plate CP with the reflecting member Re for reflecting the measuring beams (exposing illumination light) formed thereon at the time of measuring transmittance is fixedly or detachably disposed in the vicinity of the pupil plane between the beam splitter PBS and the refractive lens system GS4. In the case of the projection optical system as shown in FIG. 19(A), the pupil plane may be created inside the beam splitter PBS. In this instance, the reflecting member Re may also be formed directly on the leaving plane on the side of the lens system GS4 of the beam splitter PBS.

FIG. 19(B) shows a condensed projection optical system in which refractive optical elements (lens systems) GS1 to GS4, inclusive, and a small-sized mirror MRa are combined with the concave mirror MRs. The feature of this system resides in that an imaging light flux from the reticle R is arranged so as to form an image on the projection image plane PF2 (on the wafer W) through a first imaging system PL1 of a nearly equal magnification, composed of the lens systems GS1 and GS2 and the concave mirror MRs, a small-sized mirror MRa disposed in an eccentric way, and a second imaging system PL2 having a nearly desired reduction rate, composed of the lens systems GS3 and GS4. A detailed description is disclosed in Japanese Patent Application Laid-Open No. 8-304,705 (U.S. Pat. No. 5,691,802).

Moreover, in this embodiment, the transparent plate CP with the reflecting member Re for reflecting the beams for measuring transmittance (exposing illumination light) formed thereon is fixedly or detachably disposed in the vicinity of the pupil plane to be formed in the second imaging system PL2. In the case of the projection optical system as shown in FIG. 19(B), an intermediate imaging plane PF4 is formed between the first and second imaging systems PL1 and PL2, respectively, so that the system may be configured such that the measuring beams collimated are irradiated from the position of the intermediate imaging plane toward the reflecting member Re on the transparent plate CP and then the reflected beams can be detected photoelectrically by returning the reflected beams from the reflecting member to the reticle R.

FIG. 19(C) is a projection optical system of an equal magnification, in which the refractive optical element (lens system) GS1 is combined with the concave mirror MRs. The feature of this system resides in that an imaging light flux from the reticle R is arranged so as to form an image on the projection imaging plane PF2 (on the wafer W) as an erect image of an equal magnification through a first Dyson imaging system PL1 and a second Dyson imaging system PL2, each composed of a prism reflecting mirror MRe, the lens system GS1, and the concave mirror MRs. This system is disclosed in more detail in Japanese Patent Application Laid-Open No. 7-57,986 (U.S. Pat. No. 5,729,331).

In the case of the projection optical system as shown in FIG. 19(C), the intermediate imaging plane PF4 having a magnification nearly equal to an illumination region on the reticle R is formed between the first and second Dyson imaging systems PL1 and PL2, and the pupil plane as the projection optical system is formed in the vicinity of the position of the concave mirror MRs of each of the Dyson imaging systems. Therefore, in the case of FIG. 19(C), the concave mirror MRs can also be used as a reflecting member for the measuring beams at the time of measuring the transmittance.

Further, for the projection optical system as shown in FIG. 19(C), a plane mirror (preferably a double-sided mirror) is inserted at a position of the intermediate imaging plane PF4 in a direction parallel to the plane PF4 at the time of measuring transmittance, and the measuring beams (or the exposing illumination light) incident from the reticle R side are reflected to a full extent at the intermediate imaging plane PF4 by means of the plane mirror and returned to the reticle side. Then, the measuring beams are detected in a photoelectric manner. Likewise, the measuring beams (the measuring beams B1 leaving vertically from the wafer stage 42 as shown in FIG. 8) incident from the imaging plane PF2 (wafer) side can also be detected in a photoelectric manner by reflecting them to a full extent at the intermediate imaging plane PF4 by means of the plane mirror and returning them to the imaging plane PF2 side.

With the configuration as described above, the exposure apparatus equipped each with the projection optical system as shown in FIGS. 19(A), (B) and (C) can also execute the calibration program and the transmittance measurement programs as described above in an equal manner.

It is to be noted herein, too, that, among the projection optical systems as shown in FIG. 19, the projection optical system of FIG. 19(A) has a circular vision field, and the projection optical systems of FIGS. 19(B) and (C) have each a generally semi-circular vision field. Further, each of the projection optical systems as shown in FIG. 19 is so adapted as to utilize the effective projection region EIA having a rectangle-shaped slit-like area in the vision field. However, in some cases, an arc-shaped slit-like projection region may also be set for each of the projection optical systems.

In that case, a shape of distribution of intensity of the illumination light for illuminating the reticle R may be set to assume an arc-shaped slit-like form or an arc-shaped transmission slit may be disposed in the intermediate imaging plane PF4. However, when the fact that the illuminating light is a pulse light is taken into account, it is not advisable to make the width of the arc-shaped slit-form illuminating light or arc-shaped transmission slit too small as disclosed in prior art literature (SPIE, Vol. 1088, pp. 424–433 (1989)). The width should be rather wide to some extent.

For example, when it is supposed that the width Dap of the arc-shaped slit on the wafer extending in the scanning direction is set to be 1 mm, the number Nm (an integer) of pulse light to be oscillated during a movement of the wafer by the width portion of the slit during scanning is set to be 20 pulses, and the maximum frequency fp of the pulse oscillation of the illuminating light is set to be 1,000 Hz (as required by the standard of a laser light source), the transferring velocity Vws of the wafer at which the wafer is being moved during the scanning exposure of a one shot region on the wafer can be calculated by the following formula: Vws=Dap/(Nm/fp), to give 50 mm/second. From this result, it can be found that the larger the slit width Dap the higher the throughput can be improved.

Therefore, even when the arc-shaped slit-like illumination light or the arc-shaped transmission slit is used, it is needed to adopt a width greater than a conventional type, for example, a width on the wafer being from about 3 mm to 8 mm. At that time, however, it is preferred that the inner arc inside the arc-shaped slit be not concentric with the outer arc outside it and that the width of the arc-shaped slit for scanning exposure is set so as to assume a similar crescent-shaped form at any position in the non-scanning direction of the arc-shaped slit.

In the first embodiment of the present invention, even if a transmittance of a large number of refractive (or transmitting) optical elements constituting the illumination system or the projection optical system or reflectance of reflective optical elements would vary or fluctuate with time during the exposure operation, the present invention can control the exposure so as to always provide an appropriate exposure amount on the photosensitive substrate (the resist layer) by adding such a variation or fluctuation thereto.

Moreover, as an exposing energy reflected at the Fourier transform plane (pupil plane) of the projection optical system for projecting a pattern of the mask onto the photosensitive substrate is arranged so as to be detected in a photoelectric manner, it is possible to photoelectrically detect a portion (measuring beams) of the exposing energy that undergoes an influence from a variation in transmittance for a short period of time during exposure to each shot upon exposing plural shot regions sequentially on the photosensitive substrate.

In particular, the present invention is favorable for a projection exposure apparatus using an ultraviolet laser light source having a wavelength of 200 nm or less or an other light source having a shorter wavelength (e.g., energy rays having a wavelength of 50 nm or less from SOR or the like), in the case where a variation in transmittance is caused in the illumination optical system or the projection optical system due to an influence from molecules of impurities or for other reasons.

Further, the present invention has the reflecting member disposed fixedly or movably at least at a portion of the Fourier transform plane of the projection optical system, so that a portion (measuring beams) of the exposing energy passed through the projection optical system can be photoelectrically detected on a nearly real time basis during the exposure processing of the photosensitive substrate. Therefore, the present invention performs the effect that an occurrence of an error at the time of controlling the exposure amount to be caused by a variation in transmittance can be suppressed with high precision.

Moreover, the present invention can detect the exposing energy passed through the projection optical system from the illumination optical system and then reaching the Fourier transform plane of the projection optical system, so that a variation in transmittance of a generally entire system including both of the illumination optical system and the projection optical system can be detected in an accurate way. Therefore, the present invention can effect the accurate control of the exposure amount in the manner as described above.

Figure 20:
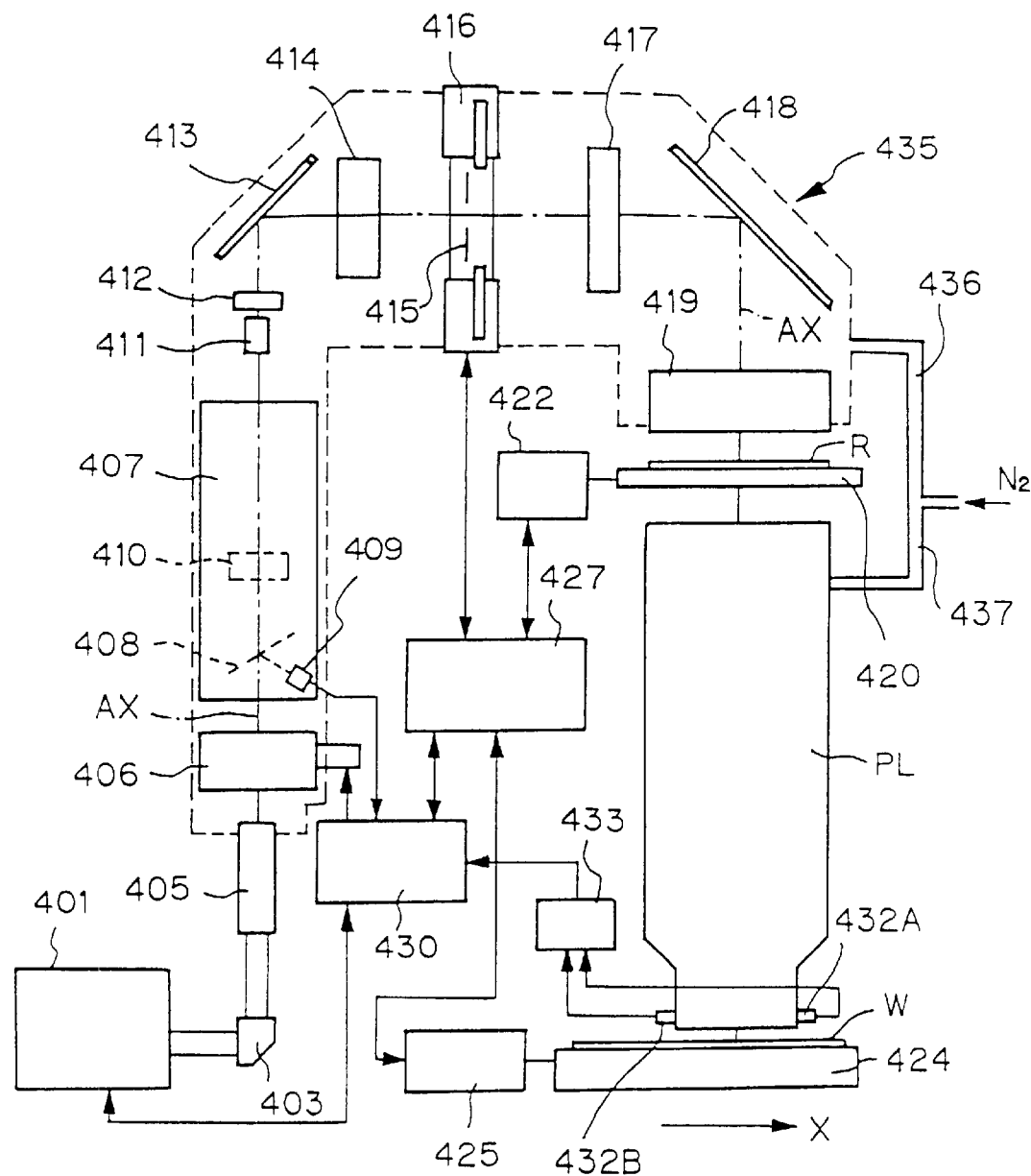
FIG. 20 is a view showing an entire configuration for an example of a scanning projection exposure apparatus in a second embodiment of the present invention.

Next, a description will be made of the construction of a projection exposure apparatus suitable for the practice of the second embodiment of the present invention with reference to FIGS. 20 and 21. FIG. 20 shows the entire construction of the projection exposure apparatus of a step-and-scan type in which a reticle R and a semiconductor-wafer W are scanned relative to each other, while a circuit pattern of the reticle R is being projected onto the semiconductor wafer W through a projection optical system PL, by using an ArF excimer laser light source 401 narrowed so as to avoid an absorption band of oxygen between wavelengths of 192 to 194 nm, in substantially the same manner as in the first embodiment as shown in FIG. 1.

In FIG. 20, reference numeral 401 denotes the ArF excimer laser light source, reference numeral 403 denotes a beam matching unit (BMU) including a movable mirror and so on, reference numeral 405 denotes a light-shielding pipe, and reference numeral 406 denotes a variable light extinction device as a light attenuator. The variable light extinction device 406 includes a drive motor and can adjust an extinction rate of an ultraviolet pulse light in a stepwise or non-stepwise manner in accordance with an instruction from an exposure control unit 430.

The ultraviolet pulse light passed through the variable light extinction device 406 is incident to a first illumination optical system 407 including a beam splitter 408, a first fly-eye lens system 410 or a beam shaping optical system or otherwise, each disposed along a given light axis AX. The beam splitter 408 reflects the ultraviolet pulse light passed therethrough by several percentage toward a photoelectric detector 409. In this embodiment, a photoelectrically detected signal from the photoelectric detector 409 is processed by the exposure control unit 430, thereby determining exposing conditions at the time of the scanning exposure.

In the embodiment as described above, the ultraviolet pulse light leaving from the first illumination optical system 407 travels to a second fly-eye lens system 411 and then to a space filter 412 for a variable illumination, followed by passing through a reflective mirror 413 and a condenser lens system 414 to distribute the intensity thereof in a uniform way and then reaching a fixed irradiation vision field stop (a fixed blind) 415 in a reticle blind mechanism 416.

Then, the ultraviolet pulse illumination light having its intensity distributed in a uniform mode with the fixed blind 415 of the reticle blind mechanism 416 are incident to a main condenser lens system 419 through an imaging lens system 417 and a reflecting mirror 418 and irradiate uniformly a portion of a circuit pattern region on the reticle R in a form resembling a slit-shaped or rectangle-shaped opening of the fixed blind 415. Each of the opening planes of the fixed blind 415 or a movable blind in the reticle blind mechanism 416 is disposed so as to be nearly conjugated with a pattern plane of the reticle R by a combination system in which the lens system 417 is combined with the main condenser lens system 418.

In FIG. 20, reference numeral 420 denotes a reticle stage, and reference numeral 422 denotes a drive control unit including a laser interferometer. The reticle stage 420 and the drive control unit 422 have each the construction generally equal to those as shown in FIG. 1.

On the other hand, as shown in FIG. 20, reference numeral 424 denotes a wafer stage, and reference numeral 425 denotes a drive control unit including a laser interferometer. The wafer stage 424 and the drive control unit 425 have each the construction generally equal to those as shown in FIG. 1.

Information on a rotational displacement of the wafer stage 424 measured by the laser interferometer of the drive control unit 425 is transmitted at a real time to the drive control unit 424 for the reticle stage 420 through the main control system 427, and an error in the rotational displacement on the wafer side is controlled so as to be compensated for by the control of rotation on the reticle side.

The main control system 427 is arranged to control each of the drive control units 422 and 425 in synchronism with each other so as to allow a transferring velocity Vr in the X-axial direction of the reticle stage 420 and a transferring velocity Vw in the X-axial direction of the wafer stage 424 to maintain a velocity rate in accordance with a projection magnification (for example, a ⅕-fold or ¼-fold magnification) of the projection optical system PL at the time of the scanning exposure.

Further, the main control system 427 executes an optimal exposure sequence in association with the exposure control unit 430 for controlling the excimer laser light source 401 and the variable light extinction device 406 by setting a variety of exposing conditions for subjecting shot regions on the wafer W to scanning exposure at an appropriate exposure amount.

In addition to the constructions as described above, the present invention in this embodiment can measure an exposing energy at a nearly real time, with a variation in transmittance of both of the illumination optical system and the projection optical system PL, by locating photoelectric detectors 432A and 432B at the positions close to an image plane (on the wafer W) of the projection optical system PL, receiving a portion of exposing ultraviolet pulse illumination light passed through the projection optical system PL, and sending a photoelectric signal in accordance with the intensity of the ultraviolet pulse illumination light selectively through a shift circuit 433 to the exposure control unit 430.

At this end, in this embodiment, an optical configuration on the tip side (on the wafer W side) of the projection optical system PL is modified to a special one so as to allow a monitoring light of the ultraviolet pulse light for monitoring a variation in an attenuation factor (a variation in transmittance or a variation in reflectance) occurs at both of the illumination optical system and the projection optical system PL to reach the projection optical system PL through a small opening disposed in the fixed blind 415 in the reticle blind mechanism 416. The measurement of such a monitoring light and a variation in transmittance by the photoelectric detectors 432A and 432B will be described hereinafter in more detail with reference to FIGS. 21 to 25, inclusive.

Further, the apparatus in this embodiment uses the ArF excimer laser light source 401 in substantially the same manner as the apparatus as shown in FIG. 1, so that a sub-chamber 435 is disposed so as to shut off a light path extending from the pipe 405 to the variable light extinction device 406, the first illumination optical system 407 and the second illumination optical system (including a system ranging from the second fly-eye lens system 411 to the main condenser lens system 419) from the outside air. To the entire space of the sub-chamber 435 are fed dry nitrogen ($N_2$) gases so as to control the oxygen content inside to an extremely low level through a pipe 436. Likewise, dry nitrogen gases are fed through a pipe 437 to the entire space (gaps among plural lens elements) inside the barrel of the projection optical system PL.

Although the entire configuration of FIG. 20 is set to be of a dioptric type in which the projection optical system PL is composed of refractive optical elements only, it is also possible to be of a catadioptric type in which refractive optical elements are combined with a concave mirror (or a convex mirror). In each type, the object end and the image end of the projection optical system PL are of a telecentric type, Next, a description will be made of details of the construction of the first embodiment of the device for detecting a variation in transmittance with reference to FIGS. 21 and 22. FIG. 21 schematically shows a light path extending from the reticle blind mechanism 416 to the wafer W as shown in FIG. 20, and FIG. 22 schematically shows a positional relationship of the vision field on the object side of the projection optical system PL with the reticle R. First, as shown in FIG. 21, ultraviolet pulse illumination light with its intensity distributed in a uniform mode by the condenser lens system 414 in FIG. 20 is irradiated on the fixed blind 415 in the reticle blind mechanism 416.

The fixed blind 415 is provided with a slit-shaped or rectangle-shaped opening 415A through which the illumination light is illuminated onto the circuit pattern region on the reticle R at the time of the scanning exposure and small openings 415B and 415C on both sides in the scanning direction (X-axial direction) of the opening 415A, through which a monitoring light LBm passes for detecting a variation in transmittance. In the state as shown in FIG. 21, the monitoring light LBm passed through the small opening 415C only out of the small openings 415B and 415C on the both sides is incident to the imaging lens system 417 and the main condenser lens system 419 without being blocked by movable blades 416A and 416B of a movable blind and then reaches the reticle R.

The movable blades 416A and 416B are controlled by drive motors 416C and 416D, respectively, so as to move in the X-direction at a velocity in synchronization with the movement in the X-direction of the reticle stage 420 at the time of starting and finishing the scanning movement of the reticle R, as disclosed in Japanese Patent Application Laid-Open No. 4-196,513 (U.S. Pat. No. 5,473,410).

Figure 21:
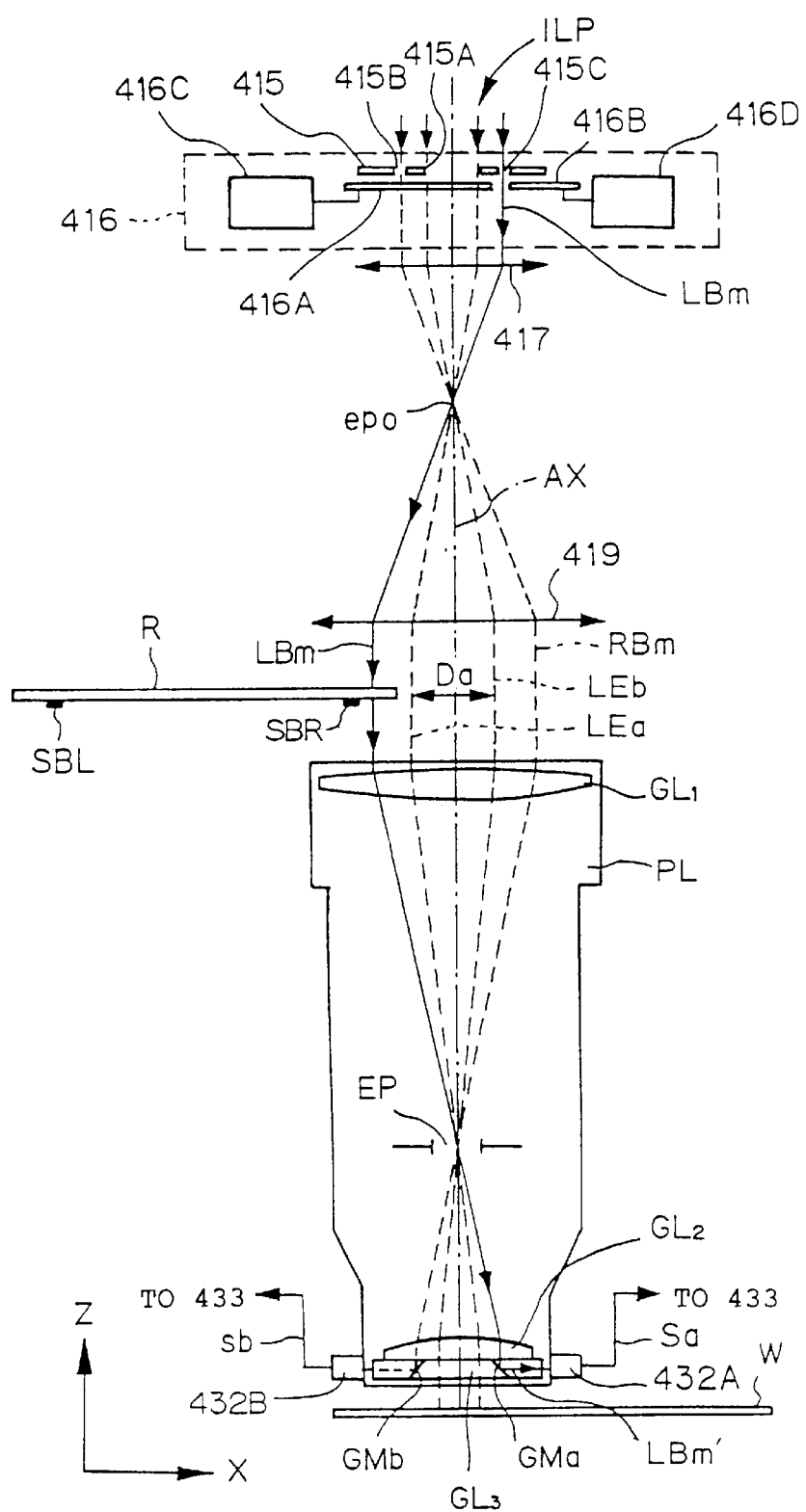
FIG. 21 is a view for schematically explaining a light path for both of the illumination optical system and the projection optical system and a light path for monitoring light for transmittance measurement for use with the projection exposure apparatus as shown in FIG. 20.

In FIG. 21, when the shielding of light by the movable blade 416A is released, ultraviolet pulse illumination light ILP passed through the rectangle-shaped opening 415A of the fixed blind 415 is irradiated on the reticle R by limiting the width Da of the scanning direction (the X-direction) to a slit-shaped or rectangle-shaped illumination light through the imaging lens system 417 and the main condenser lens system 419. Main light rays (as indicated by broken line) LEa and LEb defining the width Da are light rays from edge portions on the both ends defining a width in an X-axial direction of the opening 415A.

The main light rays LEa and LEb are crossed at a pupil plane (a Fourier transform plane) epo formed between the imaging lens system 417 and the main condenser lens system 419, and then are projected from the main condenser lens system 419 parallel to the light axis AX and then are incident to a lens element (a light-transmitting element) GL1 on the side closest to the object plane of the projection optical system PL. Further, the main light rays LEa and LEb advances to the center (a point through which the light axis AX passes) in the leaving pupil plane EP of the projection optical system PL and are crossed at the center thereof, followed by passing through a lens element GL2 and a light-transmitting optical element GL3, each located in the position closest to the image plane of the projection optical system PL, then advancing again in a direction parallel to the light axis AX, and reaching the wafer W.

Further, as shown in FIG. 21, the reticle R is located in the position in which the approach run starts at the time of the scanning exposure, and it is deviated from a slit-shaped or rectangle-shaped exposing illumination region having a width Da. Therefore, the monitoring light LBm passed through the small opening 415C of the fixed blind 415 is arranged so as to pass through a transparent portion on the right-hand side far on the right-hand side of a light shield band SBR defining a circuit pattern region on the reticle R in FIG. 1 and then reaching and entering in the projection optical system PL.

The monitoring light LBm arrived at the light-transmitting optical element GL3 disposed at the bottom-most portion through the center of the pupil plane EP of the projection optical system PL is reflected toward the side at the full reflection portion GMa disposed at a portion (an outer region in the X-direction of a slit-shaped or rectangle-shaped image projection region) of the light-transmitting optical element GL3, which is provided so as to fail to block a projection light path for the main light rays LEa and LEb. Light rays LBm' reflected at the full reflection portion GMa travel in the transverse direction and advance from an edge portion of the light-transmitting optical element GL3. Then, the light rays LBm' are received by a photoelectric detector 432A, and a photoelectric signal Sa is output to the shift circuit 433 in accordance with the intensity of the light rays LBm'.

Likewise, when the reticle R is located in the approach run start position on the right-hand side in FIG. 21, the movable blades 416A and 416B are disposed so as to allow only the monitoring light RBm from the small opening portion 415B of the fixed blind 415 to pass, and the monitoring light RBm is incident to the projection optical system PL through a transparent portion on the left-hand side far from the left-hand light shielding band SBL defining a circuit pattern region on the reticle R. Then, the monitoring light RBm passed through the projection optical system PL is reflected toward the side at a full reflection portion GMb disposed at a portion (an outer region in the X-direction of a slit-shaped or rectangle-shaped image projection region) of the light-transmitting optical element GL3 at its top end portion, which is provided to fail to block a projection light path for the main light rays LEa and LEb. The light reflected at the full reflection portion GMb advances in the transverse direction and is received by a photoelectric detector 432B, and a photoelectric signal Sb is output to the shift circuit 433 in accordance with the intensity of the light received by the photoelectric detector 432B.

In the configuration as shown in FIG. 21, the small opening portions 415B and 415C of the fixed blind 415 are disposed so as to be nearly conjugated with the pattern plane of the reticle R, and each image of the small opening portions 415B and 415C is formed within the transparent portions on the left-hand and right-hand ends of the reticle R. Further, the imaging magnification from the fixed blind 415 to the reticle R comprises an about 2-fold extended system. A further description will be omitted herein because the operation of the movable blades 416A and 416B is disclosed in detail in Japanese Patent Application Laid-Open No. 4-196,513 (U.S. Pat. No. 5,473,410).

Then, a description will be made of the state of illumination of the monitoring light LBm and RBm on the reticle R through the small opening portions 415B and 415C of the fixed blind 415, respectively, with reference to FIG. 22. FIG. 22(*a*) is a plan view showing a positional relationship in the state of FIG. 21 of the reticle R with the vision field IFo on the object side of the projection optical system PL. In this figure, the X- and Y-coordinate axes are set with the central point (the light axis AX) of the circular vision field IFo as an original point.

A slit-shaped or rectangle-shaped illumination region 415A' to be irradiated with a width Da in the scanning direction in the circular vision field IFo is formed on the reticle R as an image of the opening portion 415A of the fixed blind 415. Edges Ea and Eb of the illumination region 415A', each extending in the Y-direction, correspond to the respective positions of the main light rays LEa and LEb in FIG. 21, and the light shield bands SBR and SBL extending in the Y-direction to the left and right of the circuit pattern region PA of the reticle R are disposed to be parallel to each other. Further, the edges Ec and Ed defining the length in the Y-direction of the illumination region 415A' are set so as to agree with the positions of the light shield bands defining the upper and lower portions of the circuit pattern region PA of the reticle R.

Figure 22A:
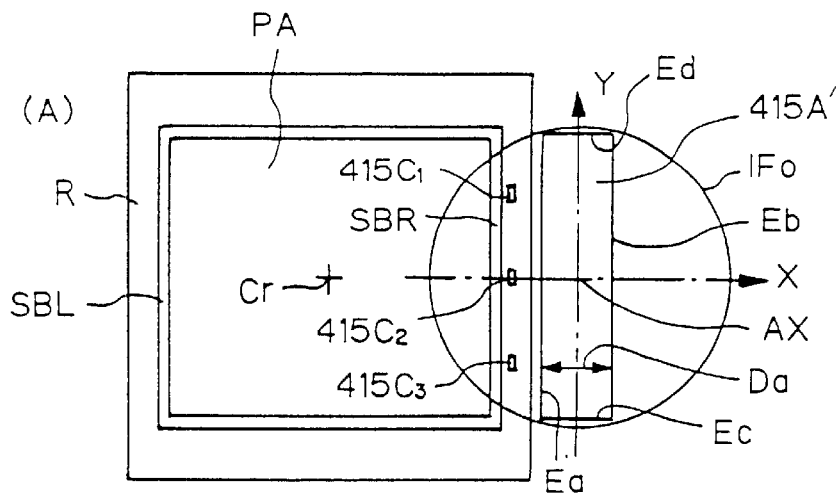
FIGS. 22A–C is each a plane view showing an example of the positional relationship between a reticle and a vision field of the projection optical system for use in measuring transmittance.

In the state of FIG. 22(A), the opening portion 415A of the fixed blind 415 is shut off by the action of the movable blades 416A and 416B, so that the ultraviolet pulse illumination light is not irradiated within the illumination region 415A' even if the excimer laser light source 401 is oscillated.

Moreover, it is supposed that a central point Cr of the circuit pattern region PA of the reticle R is located herein on the X-coordinate axis and that identical chip patterns are formed in the X-direction in the circuit pattern region PA on both sides astride the central point Cr. As is apparent from the state of FIG. 22, the orthogonal length of the circuit pattern region PA is larger than the diameter of the circular vision field IFo, and an entire image (corresponding to a two-chips portion) of the circuit pattern region PA is subjected to scanning exposure in a one-shot region on the wafer W.

When the reticle R is located at the approach run start position on the left-hand side with respect to the illumination region 415A' as shown in FIG. 22(A), an image by the small opening portion 415C of the fixed blind 415 is irradiated as three opening images 415C1, 415C2 and 415C3 at three locations on the transparent portion outside the light shield band SBR on the right-hand side of the reticle R. In the case of this embodiment, if it is intended to detect only a variation in the transmittance of the illumination optical system or the projection optical system PL, only one opening image, e.g., opening image 415C2, would be enough. In this embodiment, however, such three opening images are disposed in a row in the Y-direction on the left-hand side of the illumination region 415A' in order to allow a quantitative detection of some irregularity of variations in transmittance in the vision field IFo.

Therefore, the detector 432A as shown in FIGS. 20 and 21 is provided therein with photoelectric elements for individually receiving the monitoring light by each of the opening images 415C1, 415C2 and 415C3, and a difference of transmittance in the Y-direction within the vision field IFo can be determined by comparing signal levels from the photoelectric elements with each other.

While the reticle R is located at the approach run position on the left-hand side in the manner as described above, the monitoring light LBm by the light opening images 415C1, 415C2 and 415C3 is received by the detector 432A through the transparent portion of the reticle R and the projection optical system PL. The resulting detection signal Sa is then compared with a signal from the photoelectric detector 409 of FIG. 1, so that a variation in transmittance of the whole system including the illumination optical system and the projection optical system PL, ranging from the beam splitter 408 to the main condenser lens system 419 in FIG. 20 can be detected.

Figure 22B:
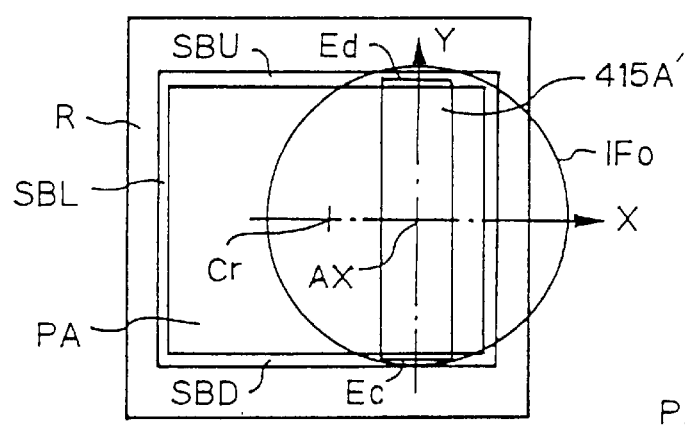

As the reticle R starts moving to the right-hand side in the X-direction from the approach run position of FIG. 22(A), the movable blades 416A and 416B in FIG. 21 also move in the X-direction in synchronism therewith to block the small opening portion 415C of the fixed blind 415. Therefore, as the reticle R starts an approach run to arrive at a scanning exposure state, the ultraviolet pulse illumination light is irradiated into the exposing illumination region 415A' only, as shown in FIG. 22(B). In FIG. 22(B), upper and lower edges Ec and Ed of the illumination region 415A' are located on the light shield bands SBU and SBD defining the upper and lower sections of the circuit pattern region PA of the reticle R, respectively, upon irradiating the circuit pattern region PA of the reticle R with the pulse illumination light within the illumination region 415A'.

Figure 22C:
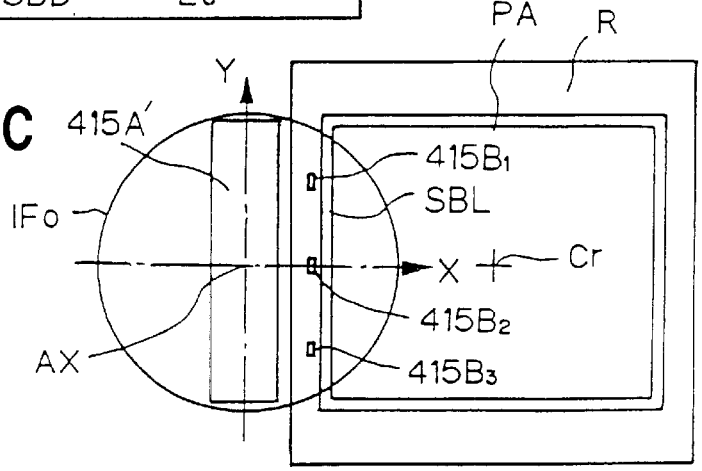

When the scanning exposure has been conducted in the manner as described above and then the reticle R has arrived at the right-hand side of the illumination region 415A' as shown in FIG. 22(C), the pulse illumination light within the illumination region 415A' is blocked by the action of the movable blades 416A and 416B, and the pulse illumination light from the small opening portion 415B of the fixed blind 415 is irradiated outside the light shield band SBL on the left-hand side of the reticle R as the monitoring light RBm. This allows three opening images 415B1, 415B2 and 415B3 by the small opening portion 415B of the fixed blind 415 are projected into the transparent portion on the left-hand side of the reticle R.

Then, the monitoring light by each of the three opening images 415B1, 415B2 and 415B3 is detected in a photoelectric mode individually by a photoelectric element inside the detector 432B through the reticle R and the projection optical system PL. The resulting photoelectric signal Sb is then compared with a signal from the photoelectric detector 409 of FIG. 20, so that a variation in transmittance of the whole system including the illumination optical system and the projection optical system PL ranging from the beam splitter 408 to the main condenser lens system 419 in FIG. 20 is detected, thereby determining a difference of the transmittance within the vision field IFo, as needed.

As described above, the present invention in this embodiment enables a detection of the variation in transmittance of the whole system with both of the illumination optical system and the projection optical system PL added thereto, while the reticle R is located at the approach run position for scanning exposure, as shown in FIGS. 22(A) and 22(C). Therefore, a variation in transmittance can be detected one after another immediately before the start of scanning exposure of each shot region, upon sequentially exposing plural shot regions on the wafer W in order in a step-and-scan system. Moreover, a transmittance that could vary during a period of time of exposing one sheet of wafer W can be detected at a nearly real time.

Figure 23:
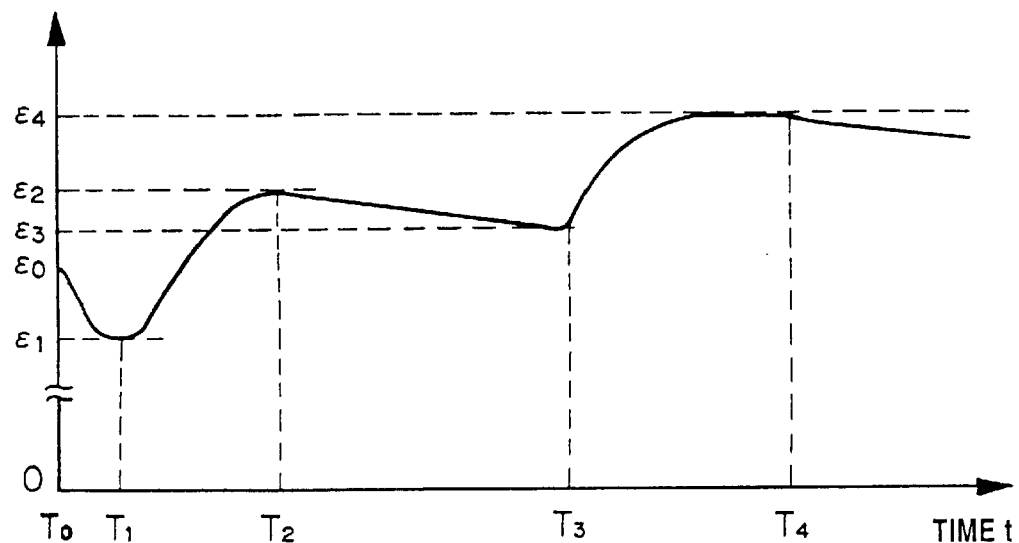
FIG. 23 is a graph showing an example of characteristics of a variation in transmittance by both of the illumination optical system and the projection optical system.

Now, a description will be made of characteristics in a variation of transmittance by both of the illumination optical system and the projection optical system PL, with reference to FIG. 23. In FIG. 23, the X-axis represents an elapse of time t while the Y-axis represents a transmittance $\epsilon$ (%). Further, the exposure apparatus is suspended for a long period of time (for example, for 1 or 2 days) prior to time T0 and stayed in such a state that no pulse illumination light passes at all through both of the illumination optical system and the projection optical system PL. Further, the characteristics as shown in FIG. 23 are given by measuring the energy of the pulse light at the leaving portion of the excimer laser light source 401 and the energy of the pulse light measured at the image plane of the projection optical system PL by means of an identical detector and then by plotting the ratios of the energies calculated from the experimental results.

As the exposure apparatus has been started and the ultraviolet pulse light having a constant frequency has been started being irradiated at time T0, the transmittance is reduced from $\epsilon 0$ to $\epsilon 1$ for a very short period of time until time T1, immediately after the irradiation of the ultraviolet pulse illumination light at time T0. As the irradiation continued thereafter, the transmittance was allowed to be increased gradually from $\epsilon 1$. As the time elapses to time T2, the irradiation was suspended. At this time the transmittance rose up to E2. After time T2, the transmittance reduced gradually in a nearly linear way, and the transmittance reaches $\epsilon 3$ ($<\epsilon 2$) after an elapse of time to time T3 (after one or two hours after time T2).

As the irradiation of the pulse illumination light restarted at time T3, then the transmittance starts increasing from $\epsilon 3$ and then reaches $\epsilon 4$ at which the transmittance is in a saturated state. Then, no variation in transmittance can be recognized any longer even if the irradiation of the pulse illumination light was continued. As the irradiation was stopped at time T4, it is then found that the transmittance is reduced gradually in a linear way.

In the characteristics as shown in FIG. 23, it is considered that the tendency of a variation in the initial stage during time T0 to T1 is caused by the physical properties of the lens element (quartz or fluorite) itself due to the irradiation of the pulse illumination light and, however, that the tendency of a variation during the period of time from time T1 to T2 or T3 to T4 is caused due to the fact that impurities such as water molecules, hydrocarbon molecules or otherwise adsorbed on the surface of the lens element or the reflecting mirror have been washed out upon irradiation of the ultraviolet pulse illumination light. In addition, it is considered that the variation in transmittance during the period of time from time T2 to T3 and time T4 et seq. is caused due to the fact that molecules of impurities floating in a space surrounding the various optical elements are attached again thereto gradually, even if the air inside the optical systems has been replenished with nitrogen gases.

Therefore, it is difficult to predict the variation in transmittance as shown in FIG. 23 indirectly on the basis of a history of irradiation of the pulse illumination light and the like, so that this embodiment adopts a type of directly detecting a variation in intensity of the pulse illumination light passing actually through both of the illumination light path and the projection light path. Although the transmittance has reached $\epsilon 3$ that is in a nearly saturated state during the period of time from time T3 to time T4, it is further considered that an ascent degree of transmittance resulting from the UV cleaning action by the pulse illumination light passing through the illumination optical system and the projection optical system PL is kept in a state of balance with a descent degree of transmittance resulting from re-adsorption of molecules of impurities to the surfaces of various optical elements.

Figure 24:
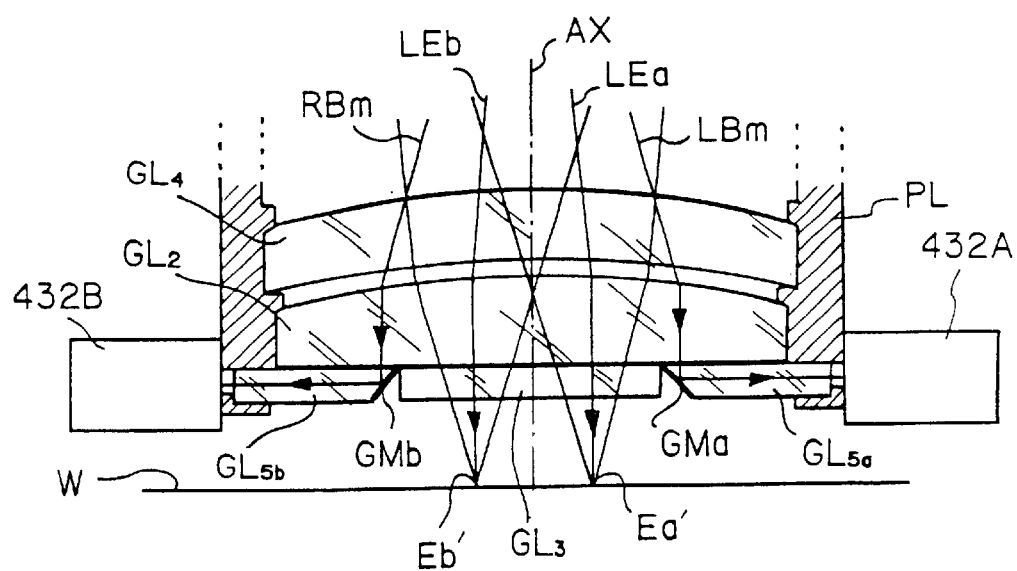
FIG. 24 is a view in section for explaining a modification of a photoelectric detection means disposed on the bottom surface of the projection optical system for measuring transmittance.

Then, a modification of the structure of a bottom end portion of the projection optical system PL of FIG. 21 will be described with reference to FIG. 24. FIG. 24 shows a section of the bottom portion of the barrel of the projection optical system PL as shown in FIGS. 20 and 21. Inside the barrel, in addition to the lens element G2, there are shown a lens element GL2 and a lens element GL4 located in the position closest thereto. The light-transmitting optical element (a parallel flat plate made of quartz) GL3, having the size that covers an imaging light flux having a predetermined number of openings, including the main light rays LEa and LEb travelling toward points Ea' and Eb' at which the edges Ea and Eb on both ends of the illumination region 415A' are projected, is tightly disposed on the bottom surface of the lens element GL2.

On the other hand, the monitoring light LBm is incident to a plate-shaped optical block GL5a mounted on the right-hand side of the light-transmitting optical element GL3 under the bottom surface of the lens element GL2, after passage through the lens elements GL4 and GL2. The incident light LBm is reflected in a horizontal way by the full reflection portion GMa formed at the tip end of the optical block GL5a and then received by the detector 432A. On both of the bottom surface section of the full reflection portion GMa at the tip of the optical block GL5a and the optical block GL5a is each formed a light shielding film or plate for preventing the monitoring light LBm from reaching the wafer W.

Likewise, the monitoring light RBm is incident to a plate-shaped optical block GL5b mounted on the left-hand side of the light-transmitting optical element GL3 under the bottom surface of the lens element GL2, after passage through the lens elements GL4 and GL2. The incident light RBm is reflected in a horizontal way by the full reflection portion GMb formed at the tip end of the optical block GL5b, and the reflected light is then received by the detector 432B. On both of the bottom surface sections of the full reflection portion GMb at the tip of the optical block GL5b and the optical block GL5b is each formed a light shielding film or plate for preventing the monitoring light RBm from reaching the wafer W.

The optical blocks GL5a and GL5b in this modification as shown in FIG. 24 are set to be completely identical in function to the light-transmitting optical element GL3 as shown in FIG. 21. When it is difficult to make the reflecting portions GMa and GMb integral with the light-transmitting optical element GL3, they can be disposed separately from the light-transmitting optical element GL3. When they are disposed separately from the light-transmitting optical element GL3, the light-transmitting optical element GL3 of FIG. 24 can be processed and adjusted individually as a correction plate for correcting an optical aberration (including a coma aberration, astigmatism or a certain kind of distortion) contained in a partial image of the circuit pattern of the reticle R to be projected onto the wafer W.

Figure 25:
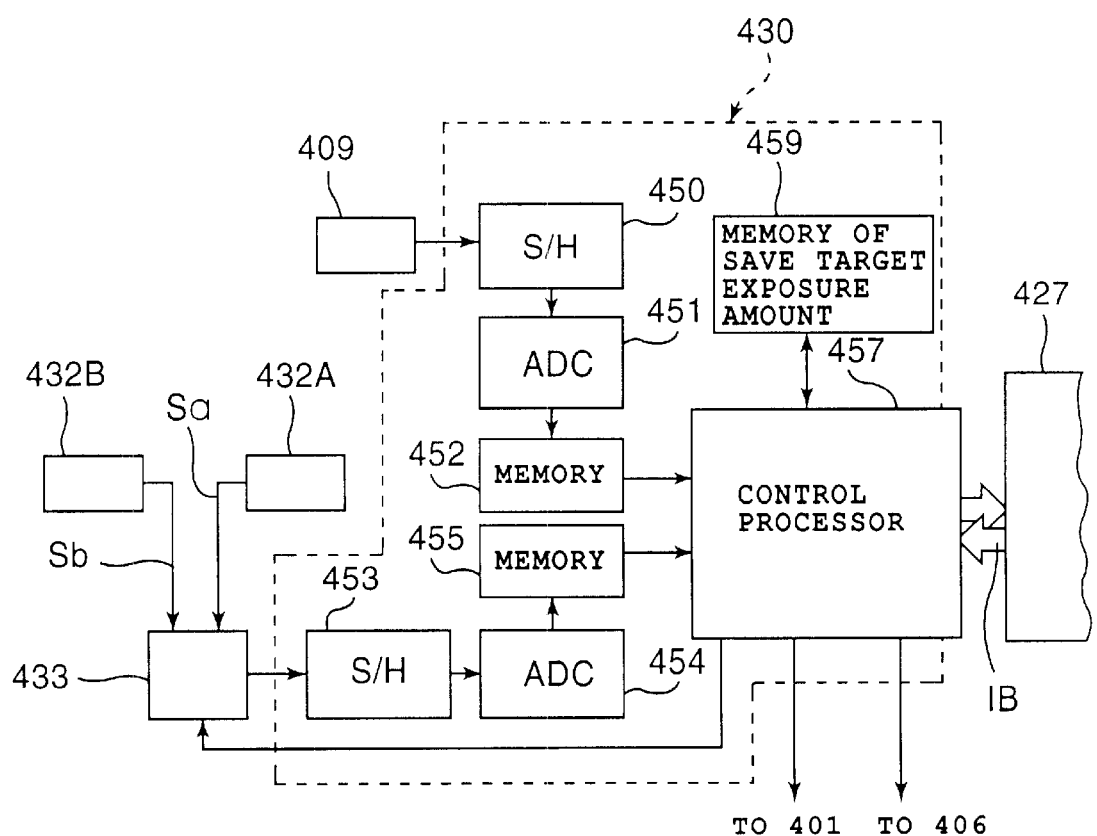
FIG. 25 is a circuit block diagram showing details of a circuit construction for an exposure control unit as shown in FIG. 20.

FIG. 25 is a circuit block diagram showing an example of a detailed configuration of the inside of the exposure control unit 430 as shown in FIG. 20. The exposure control unit 430 has a control processor (an operation processing circuit) 457 composed centrally with some peripheral circuits. In FIG. 25, the photoelectric signal from the photoelectric detector 409 as shown in FIG. 20 is input into a sample/hold (S/H) circuit 450, and a peak value in accordance with an energy amount per one pulse light is held therein. The signal according to the energy amount is then converted into a digital value by an analog-digital converter (ADC) 451, and plural pulse portions specified in advance in a memory circuit 452 are saved one after another.

On the other hand, either one of the photoelectric signals Sa and Sb output from the respective detectors 432A and 432B is selected by a shift circuit 433, and the selected signal is input into a sample/hold (S/H) circuit 453, a peak value in accordance with the energy amount per one pulse light is held therein. The signal according to the energy amount is then converted into a digital value by an analog-digital converter (ADC) 454, and plural pulse portions specified in advance in a memory circuit 455 are saved one after another. The shift operation of the shift circuit 433 can be controlled on the basis of an instruction from the control processor 457 so as to select a signal from the detector 432A, on the one hand, when the reticle R is located in the position as shown in FIG. 21 or 22(A) and to select a signal from the detector 432B, on the other, when the reticle R is located in the position as shown in FIG. 22(C).

The control processor 457 reads a plurality of digital data saved in the memory circuit 452 and computes an average value of the plural digital data into a value Is of the intensity of an original laser incident to the illumination optical system of the exposure apparatus from the excimer laser light source 401. Likewise, the control processor 457 reads a plurality of digital data saved in the memory circuit 455 and computes an average value of the plural digital data into a value Iw of the intensity of the exposing illumination light at the position at which the illumination light passes through the projection optical system PL.

Then, the control processor 457 gives a ratio (Iw/Is) of the computed intensity value Iw to the computed intensity value Is, and the data value of the ratios is then saved as transmittance data in a history memory relating to a variation in transmittance, disposed in the control processor. Furthermore, the control processor 457 calculates a difference between a group of data of the transmittance so far saved in the past in the history memory and data saved at this time, and makes a decision as to whether the difference is so large (for instance, resulting in an error by 1% or more as a control precision) that correction is required in terms of controlling the exposure amount.

In the case where, as a result of the such decision, it is required to alter or correct the exposing conditions previously set so as to provide a target exposure amount saved in the memory circuit 459, the control processor 457 outputs an instruction for correcting the intensity (energy) of the pulse light to the variable light extinction device 406 as shown in FIG. 20. If the adjustable scope would be minute, an instruction is given to the excimer laser light source 401 as shown in FIG. 20, in order to correct the oscillating intensity itself (adjust a high voltage between discharging electrodes) of the pulse light.

In addition, the control processor 457 is associated with the main control system 427 through an interface bus IB, and the main control system 427 sends to the control processor 457, for example, information on the reticle R which has finished its movement for the scanning exposure and now reached the approach run position. The control processor 457 then executes each of operations including, for example, selecting the detector 432A or 432B, in response to the such information, taking a signal from the detector selected, and correcting the exposing condition, etc., at a real time during a series of the scanning exposure operations for each of the plural shot regions on the wafer W.

In the system for controlling the exposure amount as described above, the intensity of the ultraviolet pulse illumination light reaching from the excimer laser light source 401 to the reticle R has been selected among the various exposing conditions and corrected on the basis of the data of transmittance saved one after another in the history memory in the control processor 457. It is to be noted herein, however, that the correction of the exposing conditions can also be executed by minutely adjusting an absolute value of each velocity Vr and Vw, while a ratio of the transferring velocity Vr of the reticle R to the transferring velocity Vw of the wafer W at the time of the scanning exposure is kept at a constant value. In this case, however, a minute adjustment of the width Da in the scanning direction of the illumination region 415A' by the slit-shaped or rectangle-shaped opening portion 415A of the fixed blind 415 would be required due to the fact that the excimer laser light source 401 is used as a pulse light.

On the contrary, it is also possible to execute the control of the exposure amount by effecting a minute adjustment of the width Da in the scanning direction of the illumination region 415A', without changing the ratio of the scanning velocities Vr and Vw and the absolute values thereof. In this case, however, there is a close relationship among the width Da of the illumination region 415A', the scanning velocities Vr and Vw, and the oscillating frequency f of the excimer laser light source 401, so that it is required to establish the relationship of f×Da=n×Vr (the condition where the number of pulses to be oscillated during the period of time when the reticle R moves in the distance corresponding to the width Da at the scanning velocity Vr should be set to be always an integer n), for example, on conditions that the number n of pulses is set by a number of an appropriate pulse light (for example, an integer from 30 to 50, inclusive), when it is defined by the scanning velocity Vr on the reticle R side. Therefore, in the case where the width Da is to be adjusted in a minute mode without changing the scanning velocity Vr of the reticle R, at least one of the integer n and the oscillating frequency f should be altered.

In addition, in the case where a plurality of the small opening portions 415B1–415B3 and 415C1–415C3, inclusive, are projected along the lengthwise direction (the Y-direction) of the illumination region 415A', as shown in FIGS. 22(A), (B) and (C), and the transmitting energy for each small opening image is detected by the photoelectric element individually disposed in the detectors 432A and 432B, an irregularity of transmittance (an irregularity of illuminance) in the Y-direction can be presumed. Therefore, a transmittance distribution changing element may be disposed in the vicinity of the position that is nearly conjugated with the reticle R in the illumination optical system or in the vicinity of the position of the pupil epo in accordance with the irregularity of transmittance obtained, thereby allowing a compensation for the irregularity of illuminance particularly in the Y-direction.

In the embodiment as shown in FIG. 25, transmittance data including both of the illumination optical system and the projection optical system PL is computed on the basis of a ratio of the intensity value of the illumination light detected by each of the detectors 432A and 432B to the intensity value of the original laser light energy, and the exposing conditions at the time of controlling the exposure amount are corrected in accordance with a variation in the transmittance data. The exposure amount, however, can also be controlled at a necessary degree of precision simply based on each of output signals from the detectors 432A and 432B, without using the photoelectric detector 409. Therefore, a device construction and operations necessary for this configuration will be described hereinafter as a second embodiment of the present invention, with reference to FIG. 26.

Figure 26:
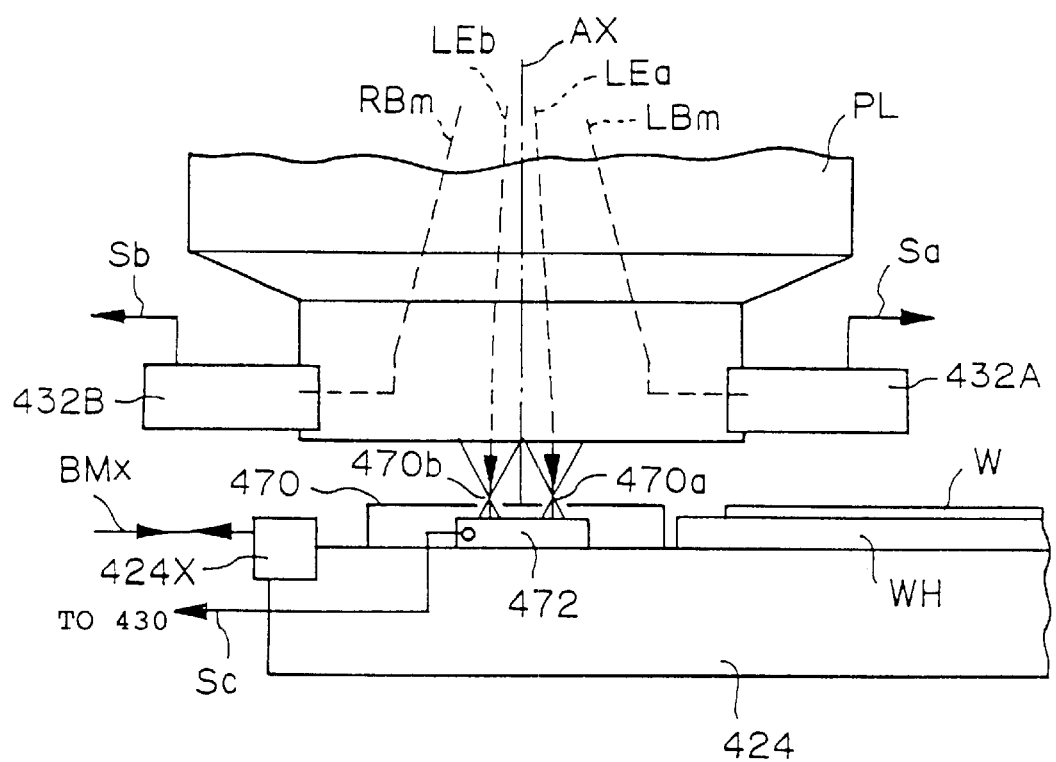
FIG. 26 is a view showing the construction of an illuminance detector on the side of a wafer stage to be added as an example in the second embodiment of the present invention.

FIG. 26 shows a relationship of the position of the tip end portion of the projection optical system PL with the position of the wafer stage 424. In this embodiment, an illuminance detector 470 is disposed on the wafer stage 424 as a third photoelectric detector. The exposure amount can be controlled by calibrating results of detection by the detectors 432A and 432B on the basis of the measured values which are obtained by measuring the intensity or illuminance of the exposing energy leaving from the projection optical system PL from time to time by means of the illuminance detector 470 disposed on the wafer stage 424.

In FIG. 26, the wafer W is placed on the wafer stage 424 through a wafer holder WH, and the illuminance detector 470 is mounted on the wafer stage 424 so as to allow the projection optical system to be on a level with the top surface of the wafer W (within the scope of approximately ±0.6 mm). Further, the illuminance detector 470 is provided on its surface with a first pinhole group 470a and a second pinhole group 470b, the first pinhole group 470a comprising a plurality of pinholes, each having a diameter of approximately 1 mm, arranged at a constant interval in the Y-direction intersecting at a right angle with the direction of the scanning exposure (in the direction perpendicular to the paper surface of FIG. 26), and the second pinhole group 470b disposed apart on the image plane side by a distance corresponding to the width Da in the scanning exposure direction of the illumination region 415A' by the fixed blind 415. The second pinhole group 470b also comprises a plurality of pinholes arranged at a constant distance in the Y-direction intersecting at a right angle to the direction of the scanning exposure.

When the wafer stage 424 is aligned in a precise manner, as shown in FIG. 26, on the basis of length measuring beams BMx to be projected onto a reflecting mirror 424X on the wafer stage 424 from a laser interferometer disposed in a stage drive control unit 425 (as shown in FIG. 20), these pinhole groups 470a and 470b are disposed so as to correspond to the position within the image plane of the main light rays LEa and LEb passing through the edges Ea' and Eb' in the scanning direction (X-direction) of the illumination region 415A' by the fixed blind 415, respectively.

Moreover, on the back side of each of the pinhole groups 470a and 470b of the illuminance detector 470, there are disposed plural photoelectric elements 472 each for detecting the exposing energy from the projection optical system PL passed through each pinhole in a photoelectric mode individually. Each of the photoelectric signal Sc from a group of the photoelectric elements is output to the exposure control unit 430 as shown in FIGS. 20 and 25.

In the configuration as shown in FIG. 26, when the movable blades 416A and 416B are full open in a state in which the illuminance detector 470 is aligned in the manner as shown in FIG. 7, the illumination region 415A' having a uniform distribution of illuminance is projected onto the illuminance detector 470, if no reticle R is located on the illumination light path. And, the illuminance value at each position of the plural pinholes, included in the first pinhole group 470a and the second pinhole group 470b, can be detected individually.

Figure 27A:
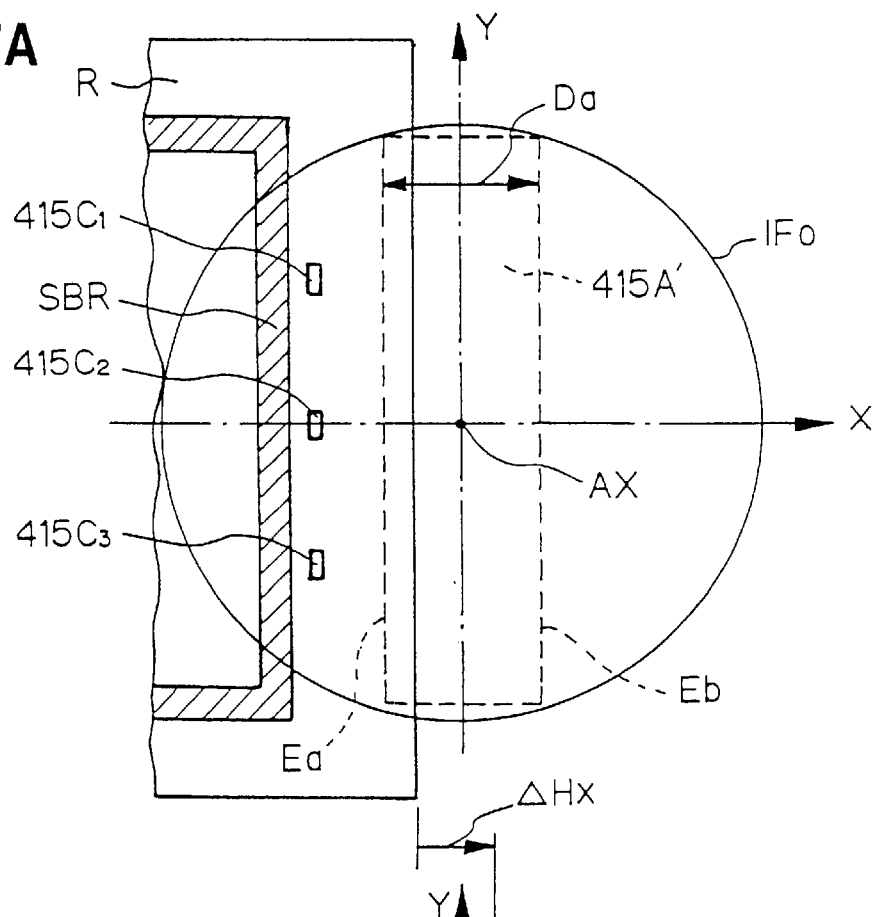
FIGS. 27A–B is each a view for explaining the position of a reticle, upon measuring the transmittance for both of the illumination optical system and the projection optical system by the illuminance detector of FIG. 26 and calibrating a detector for use in measuring the transmittance as shown in FIGS. 20 and 24.

The calibration of the detectors 432A and 432B by means of the illuminance detector 470 can be effected in a manner, for example, as shown in FIG. 27. FIG. 27(A) shows a state in which the reticle R is located in the approach run position on the left-hand side, like FIG. 22(A). First, in this state, the wafer stage 424 is aligned in the manner as shown in FIG. 26. Then, the movable blades 416A and 416B are set in the state as shown in FIG. 2, and images 415C1 to 415C3, inclusive, of the small opening portion 415C of the fixed blind 415 are projected onto the transparent portion outside the right-hand light shield band SBR of the reticle R in the manner as shown in FIG. 27(A). Thereafter, the light transmitted (the monitoring light LBm) is detected in a photoelectric mode by means of the detector 432A of FIG. 26, and a level of the resulting signal Sa is saved therein.

Then, the reticle R is allowed to move from the state of FIG. 27(A) toward the right-hand side by a distance AHx, and the movable blades 416A and 416B are opened to a small extent, followed by restricting a slight portion of the width on the edge Ea side of the illumination region 415A' having the width Da to a slim slit-shaped illumination region 415AL and projecting it onto the reticle R. At this time, the illumination region 415AL is incident to the projection optical system PL after transmission through the transparent portion outside the right-hand light shield band SBR of the reticle R, and the light passed therethrough is irradiated onto the first pinhole group 470a on the wafer stage 424. Therefore, the illuminance value of each light passed through each pinhole of the first pinhole group 470a and received individually by means of the photoelectric elements 472 represents an irregularity of illuminance in the Y-direction of the slit-shaped illumination region 415AL.

The exposure control unit 430 averages the values of illuminance in the slit-shaped illumination region 415AL on the basis of the signal Sc detected, and saves the resulting average value as an average illuminance value. The average illuminance value reflects the exposure amount provided actually on the wafer W at a high degree of fidelity. Therefore, in the case where the average illuminance value has an error by k% with respect to the set value in order to obtain a target exposure amount, it can be the that the level of the signal Sa from the detector 432A, saved in connection with FIG. 27(A), has also an error by approximately k%.

Thus, the exposure control unit 430 makes a correction of k% for the signal Sa from the detector 432A, which will be output thereafter, and determines exposing conditions for obtaining an appropriate exposure amount on the basis of the corrected signal Sa'. Usually, the exposure apparatus of this type is so adapted as to subject the plural sheets of wafers in a lot unit to exposure processing. Therefore, it is considered that, although there is the occasion that a variation in transmittance tends to become larger upon processing the wafer at the top of the wafers in a lot unit, no variation in transmittance to such a large extent will occur thereafter and that the transmittance for the other wafers would occur within a relatively small scope as the characteristics as shown in FIG. 23 (after time T2 et seq.).

Therefore, in this embodiment, the exposure amount can be controlled in a nearly accurate way without utilizing the photoelectric detector 409 as shown in FIG. 20, if, whenever the exposure processing for one sheet of a wafer has been finished, the wafer stage 424 is aligned in the manner as shown in FIG. 26, the illuminance value within an image projection region in the vision field IFo of the projection optical system PL, that is, on the image side of the illumination region 415A', is detected by the illuminance detector 470 on the stage, and the detection signals Sa and Sb from the respective detectors 432A and 432B disposed at the bottom end portion of the projection optical system PL are calibrated on the basis of the result of detection and then used.

Figure 28:
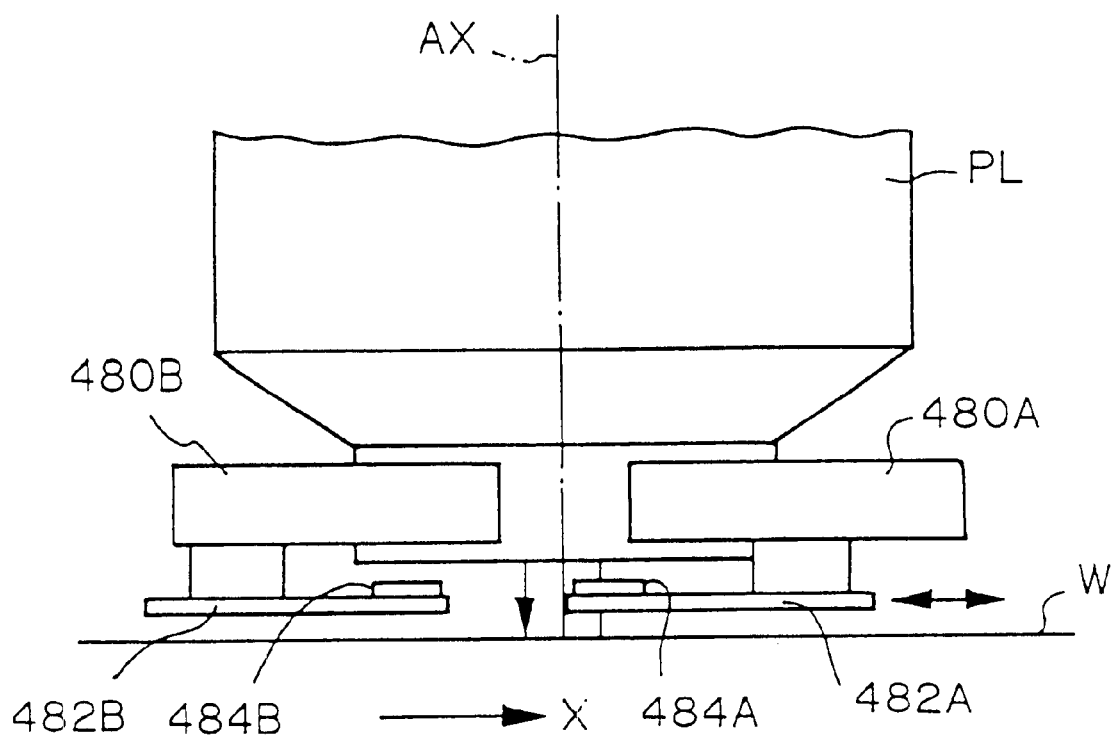
FIG. 28 is a view showing the construction of a photoelectric detector for use in transmittance measurement by another example in the second embodiment of the present invention.

As shown in FIGS. 26 and 28, the second embodiment of the present invention is configured such that illuminance within an actual image projection region (the illumination region 415A') at the time of the scanning exposure, in which the wafer is exposed to light, is detected and the signals from the detectors 432A and 432B are calibrated. Therefore, the second embodiment can reflect a variation in transmittance within the actual image projection region in an accurate way, so that it can present the advantage in that the exposure amount can be controlled with a high degree of precision. Moreover, in this embodiment of the present invention, irregularities of illuminance within the image projection region can be measured by means of the illuminance detector 470 on the stage, and such irregularities of illuminance can be corrected as needed.

Each example of the first embodiment of the present invention has been described above. It should be noted herein, however, that the method for measuring the transmittance of both of the illumination optical system and the projection optical system PL is not restricted to those examples and embodiments. For instance, in the examples as shown in FIGS. 26 and 27 above, the average illuminance value of the illuminance detected by the illuminance detector 470 (or an individual illuminance value for each pinhole) is compared with the intensity of the signal from the photoelectric detector 409 of FIG. 1, immediately before the start of the exposure processing one sheet of a wafer, a transmittance is determined for the image projection region (a region within the opening portion 415A of the fixed blind 415) at that point of time, and a value of each detection signal of the detectors 432A and 432B disposed at the bottom end portion of the projection optical system PL can be evaluated by using the resulting transmittance as a standard. Then, the value of each detection signal can be used for the control of the exposure amount.

Generally, the projection exposure apparatus of this type adopts, in many cases, a configuration such that several % of the pulse illumination light leaving from the fly-eye lens system disposed in the illumination optical system is reflected at the beam splitter (or passed therethrough), the intensity of the reflected light is detected with a photoelectric element (an integrator sensor), and the resulting photoelectric signal is integrated at every pulse illumination light to detect the exposure amount provided on the wafer. In this case, the integrator sensor can be used in place of the photoelectric detector 409 as shown in FIG. 1.

Moreover, the photoelectric detectors 432A and 432B for measuring transmittance are not required to be fixedly disposed at the bottom end portion of the projection optical system PL, as shown in FIGS. 20, 21 and 24, and they may be each of a movable type. In this case, for example, as shown in FIG. 28, the apparatus may be configured such that the illuminance of the pulse illumination light can be measured at an optional position within the vision field of the present invention, by providing movable arms 482A and 482B so as to be inserted in and detached from the vision field on the image plane side of the projection optical system PL (a space interposed between the bottom surface of the light-transmitting optical element GL3 and the wafer W) by means of drive mechanisms 480A and 480B disposed on the outer wall of the barrel of the projection optical system PL and mounting the photoelectric detectors 484A and 484B each having a light receipt surface extending in the Y-direction intersecting at a right angle to the scanning direction (the X-direction) on the respective end portions of the movable arms.

Figure 27B:
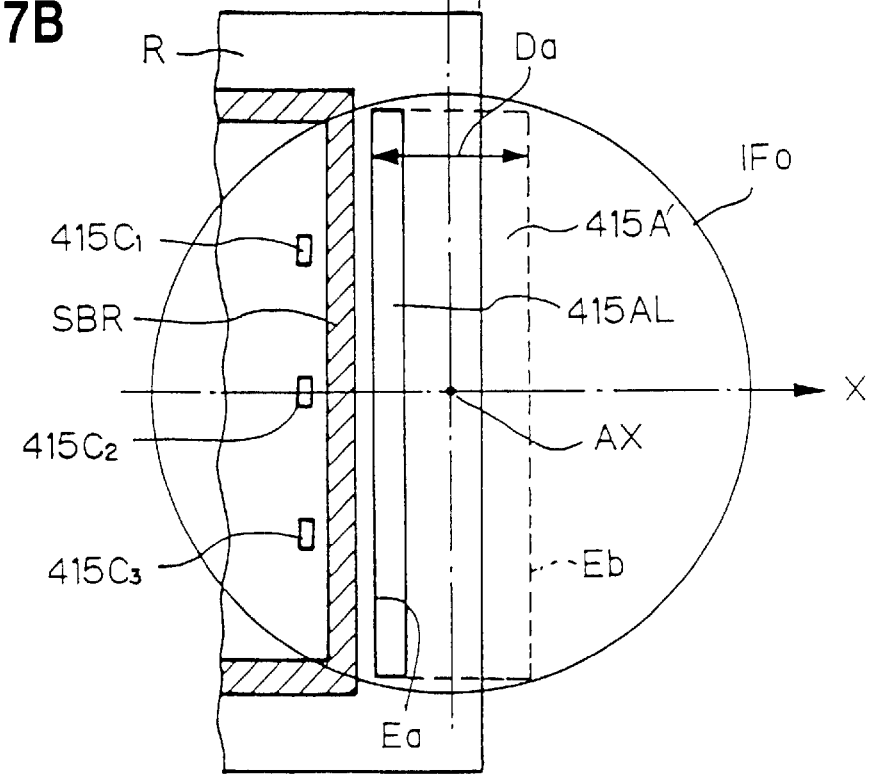

When the photoelectric detector 484A (or 484B) is disposed so as to be inserted in or detached from the projection light path on the image plane side of the projection optical system PL as shown in FIG. 28, the measurement of the transmittance to be determined by both of the illumination optical system and the projection optical system PL may be conducted preferably by projecting the exposing pulse illumination light onto a portion (or an entirety) of the illumination region 415A' through the transparent portion located outside the light shield band of the reticle R as shown in FIG. 27(B), and receiving the pulse illumination light passed through the projection optical system PL by means of the photoelectric detector 484A (or 484B). With this configuration, the results of measurement with higher precision can be expected to be gained because the transmittance produced at a light path corresponding to the inside of the illumination region 415A' within the vision field for use in the actual projection exposure can be measured in a direct way.

Even in the case of the example as shown in FIG. 28, each of the photoelectric signals Sa and Sb from the detectors 432A and 432B can be calibrated on the basis of the level of the photoelectric signal from the photoelectric detector 484A (or 484B) in substantially the same manner as in the example as shown in FIG. 26. In the case of the example as shown in FIG. 28, however, unlike the construction as shown in FIG. 26, the photoelectric detector 484A (or 484B) can be inserted into the vision field, even if the wafer W is located right under the projection optical system PL, so that at an appropriate point of time during the operation of exposure to wafers, the reticle R can be disposed as shown in FIG. 27(A), the slit-shaped illumination region 415AL as shown in FIG. 27(A) can be projected by means of the movable blades 416A and 416B as shown in FIG. 27(A), and the light passed therethrough can be received by the photoelectric detector 484A (or 484B), respectively.

At that time, the pulse illumination light in the illumination region 415AL to be projected onto the reticle R is shielded to a full extent by means of the photoelectric detector 484A (or the movable arm 482B) so as to fail to reach the wafer W after passage through the projection optical system PL.

Further, each of the above examples is configured such that a variation in transmittance of the entire system including the illumination optical system and the projection optical system PL can be detected by photoelectrically detecting a portion of the exposing energy leaving to the side closest to the image plane side of the projection optical system PL. In the case of the optical configuration in which a predetermined space is formed in the pupil plane EP of the projection optical system PL, however, the photoelectric detector is disposed so as to be inserted into or detached from the space of the pupil plane EP, and the illumination region 415AL is projected onto the transparent portion of the reticle R in a state in which the reticle R is disposed in a state as shown in FIG. 27(B), so that the light quality for monitoring a variation in transmittance and calibrating the variation at the time of controlling the exposure amount may be measured.

Then, a description will be made of the projection exposure apparatus according to the present invention suitable for use in practicing a third embodiment of the present invention, with reference to the accompanying drawings. In this embodiment, the present invention is applied to a scanning type projection exposure apparatus of a step-and-scan type, which uses a projection optical system of a reflection-refraction type as a projection optical system.

Figure 29:
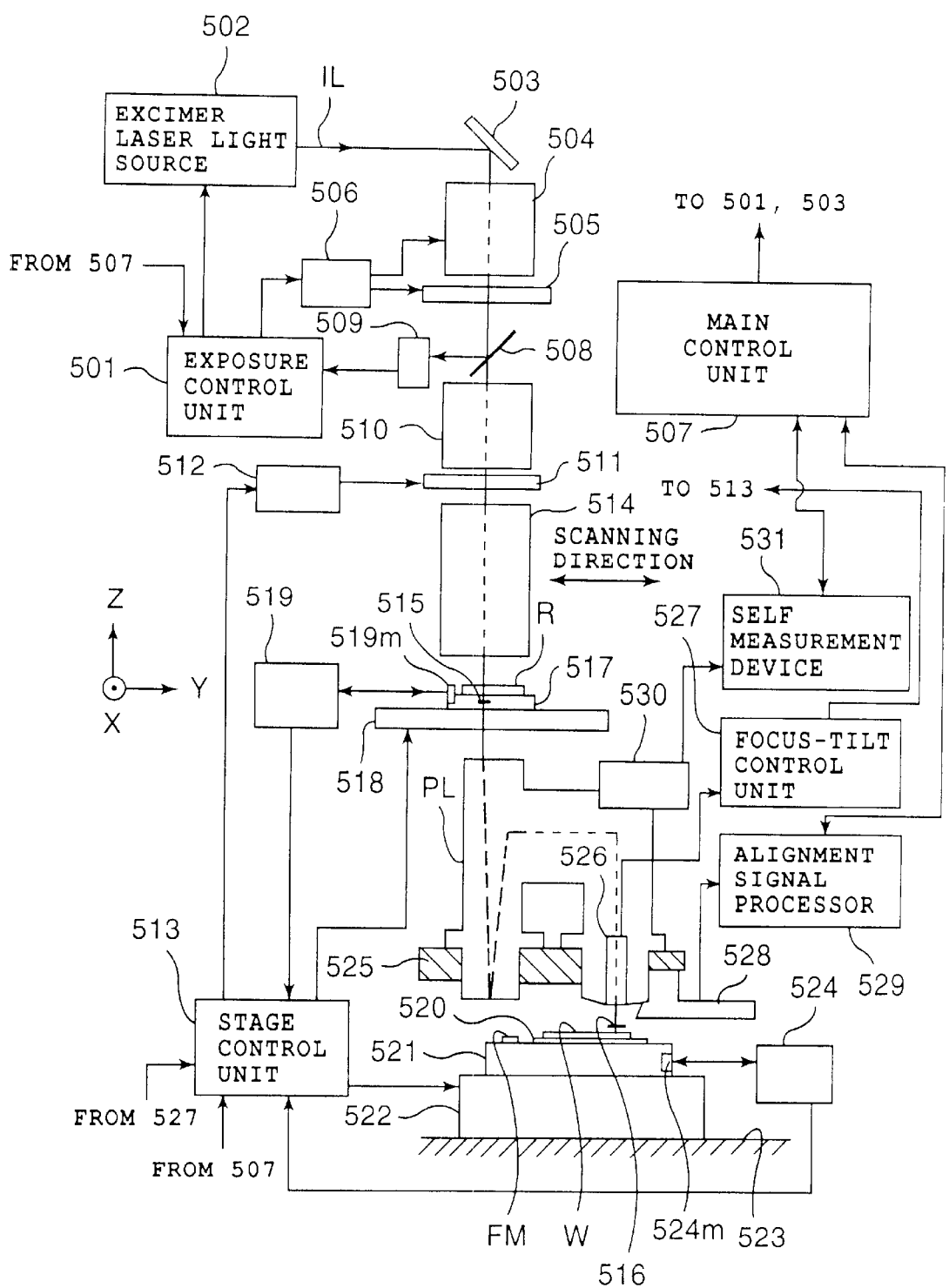
FIG. 29 is a view showing a brief configuration in an example for practicing a scanning projection exposure apparatus in the third embodiment of the present invention.

FIG. 29 shows a brief configuration of the projection exposure apparatus of this embodiment. In FIG. 29, illumination light IL composed of pulse laser light emitting from an excimer laser light source 502 with its emission state controlled by an exposure control unit 501 is deviated by an eccentric mirror 503 and reaches a first illumination system 504. As the excimer laser light source 502 in this embodiment, there may be used a broad-banded laser light source of a KrF excimer laser (wavelength of 193 nm) with a half value width of an oscillating spectrum modified to 100 pm or greater. Further, as a light source for exposure, there may be used a broad-banded laser light source of an ArF excimer laser (wavelength of 193 nm), a metallic vapor laser light source, a higher harmonics generating device of a YAG laser or a bright line lamps such as mercury lamps, etc., or otherwise.

The first illumination system 504 may include a beam expander, a light quantity changing mechanism, an illumination shift mechanism for shifting a light quantity of the illumination light when a coherence factor (a so-called σ value) of the illumination optical system is altered, a fly-eye lens, and the like. A secondary light source is formed on the emitting plane of the first illumination system 504 with the illumination light IL distributed in a plane-like manner, and a shift revolver 505 is disposed on the plane on which the secondary light source is formed, which is for use with an illumination-type opening stop for shifting the illumination conditions to various other conditions. The shift revolver 505 is provided on the side surface thereof with, for example, a circular opening stop of a usual type, an opening stop for a so-called shaping illumination composed of plural openings deviated from the light axis, a ring-shaped opening stop, and an opening stop for a small cy value composed of a small circular opening, and the like. The desired illumination-type opening stop (a σ stop) can be disposed on the emitting plane of the first illumination system 504 by rotating the shift revolver 505 through a shift unit 506. Further, when the illumination-type opening stop is shifted, an illumination shift mechanism in the first illumination system 504 is shifted in synchronism with the shift device so as to make the light quantity reach largest.

The operation of the shift device 506 is controlled by the exposure control unit 501, and the operation of the exposure control unit 501 is controlled by the main control unit 507 for controlling the operation of the apparatus as a whole in a comprehensive manner.

The illumination light IL passed through the illumination-type opening stop set by the shift revolver 505 is incident to the beam splitter 508 having a large transmittance and a small reflectance, and the illumination light reflected by the beam splitter 508 is received by the integrator sensor 509 composed of a photoelectric detector such as a photodiode or otherwise. The detection signal obtained by photoelectrically converting the illumination light by the integrator sensor 509 is supplied to the exposure control unit 501. The relationship of the detection signal with the exposure amount on the wafer is measured and saved in advance, and the exposure control unit 501 monitors the accumulated exposure amount on the wafer from the detection signal. The detection signal can be utilized for standardizing the output signal of various sensor systems for use with the illumination light for exposing.

The illumination light IL passed through the beam splitter 508 illuminates an illumination vision field stop (a reticle blind system) 511 through a second illumination system 510. The illumination vision field stop 511 has substantially the same configuration as the reticle blind mechanism 23 of FIG. 1 has.

The operation of the movable blind in the illumination vision field stop 511 is controlled by a drive device 512, and a stage control unit 513 is driven in synchronism with the movable blind in the scanning direction through the drive device 512, upon scanning the wafer in synchronism with the reticle by the stage control unit 513 in a manner as will be described hereinafter. The illumination light IL passed through the illumination vision field stop 511 illuminates a rectangular illumination region 515 at a uniform illuminance distribution on a pattern surface (a bottom surface) of the reticle R through a third illumination system 514. The surface of the illumination vision field stop 511 on which the fixed blind is disposed is conjugated with the pattern surface of the reticle R, and the shape of the illumination region 515 is defined by an opening of the fixed blind.

A description will be made of the configuration of the embodiment as shown in FIG. 29 by referring to the plane perpendicular to the paper plane of FIG. 29 on the plane parallel to the pattern plane of the reticle R as the X-axis, the plane parallel to the paper plane of FIG. 29 as the Y-axis, and the plane perpendicular to the pattern plane of the reticle R as the Z-axis. In this configuration, the illumination region 515 on the reticle R is a rectangular region elongated in the X-direction, and the reticle R is scanned in +Y-axial direction or −Y-axial direction with respect to the illumination region 515 at the time of the scanning exposure. In other words, the scanning direction is set to be the Y-direction.

A pattern in the illumination region 515 on the reticle R is reduced at a projection magnification β (β being, for example, ¼, ⅕, etc.) through the projection optical system PL which is telecentric on both sides (or one side on the wafer side), and an image is projected onto an exposure region 516 of the surface of the wafer W with photoresist coated thereon.

The reticle R is held on the reticle stage 517, and loaded through an air bearing on a guide extending in the Y-direction on a reticle support table 518. Further, the reticle stage 517 has substantially the same configuration as the reticle stage as shown in FIGS. 1 and 20. In the drawing, reference numeral 519 denotes a laser interferometer and reference symbol 519m denotes a moving mirror.

On the other hand, the wafer W is held on a sample table 521 through a wafer holder 520, and the sample table 521 is mounted on a wafer stage 522. The wafer stage 522 is mounted on a guide on a base 523 through an air bearing. The wafer stage 22 has the same configuration as the wafer stage as shown in FIGS. 1 and 20. In the drawing, reference symbol 524m denotes a moving mirror, and reference numeral 524 denotes a laser interferometer. The stage control unit 513 controls the operation of a linear motor or otherwise for driving the wafer stage 522 in accordance with the measured value fed by the laser interferometer 524.

A command for starting the exposure is sent to the stage control unit 513 from the main control unit 507 at the time of the scanning and exposing, and the stage control unit 513 scans the wafer W at a velocity Vw in the Y-direction through the wafer stage 522, in synchronism with scanning the reticle R at a velocity Vr in the Y-direction through the reticle stage 517. The scanning velocity Vw of the wafer W is set to β×Vr by using a projection magnification β from the reticle R to the wafer W.

Further, the projection optical system PL is held on an upper plate of a squared C-shaped column 525 disposed on the base 523. Moreover, a multipoint autofocus sensor 526 of an oblique incident type (hereinafter referred to as an "AF sensor") is disposed on a side surface portion in the X-direction of the projection optical system PL, which can project a slit image or the like in an oblique direction onto plural measurement points located on the surface of the wafer W and output plural focus signals corresponding to the Z-directional positions (hereinafter referred to each as a "focus point") at the plural measurement points. The plural focus signals from the multipoint AF sensor 526 are fed to a focus-tilt control unit 527 which in turn gives the focus position and an oblique angle on the surface of the wafer W on the basis of the plural focus signals and then supplies the resulting data to the stage control unit 513.

The stage control unit 513 drives a Z-stage mechanism and a tilt mechanism in the wafer stage 522 in a servo system so as to allow the supplied focus position and oblique angle to agree with a focus position and an oblique angle of an imaging plane of the projection optical system PL which have been determined in advance. This allows the surface of the wafer W within the exposure region 516 to be restricted so as to agree with the imaging plane of the projection optical system PL in an autofocus system and an auto-leveling system even during the scanning exposure.

Further, an alignment sensor 528 of an off-axis type is fixed to the +Y-directional side surface of the projection optical system PL, and the position of an aligning wafer mark disposed in each shot region of the wafer W is detected by means of the alignment sensor 528 upon carrying out the alignment, the wafer mark being provided in each shot region of the wafer W. The detection signal is then fed to an alignment signal processing unit 529 to which a measured value from a laser interferometer 524 is also supplied. The alignment signal processing unit 529 computes coordinates in a stage coordinates system (X, Y) of the wafer mark of a detection object from the detection signals and the measured values of the laser interferometer 524, and the resulting coordinates are then supplied to the main control unit 507. The stage coordinates system (X, Y) is intended herein to mean a coordinates system to be defined on the basis of the X-coordinate and the Y-coordinate of the sample table 521 to be measured by means of the laser interferometer 524. Further, the main control unit 507 is arranged so as to determine the sequence coordinates in the stage coordinates system (X, Y) of each shot region on the wafer W from the supplied coordinates of the wafer mark and to supply the resulting sequence coordinates to the stage control unit 513. Then, the stage control unit 513 controls the position of the wafer stage 522 on the basis of the supplied sequence coordinates upon the scanning exposure to each shot region.

On the sample table 521 is fixed a reference mark member FM, and the reference mark member FM is provided on its surface with, for example, a variety of reference marks that act each as a reference for the position of an alignment sensor, as well as a reference reflecting plane that becomes a reference for reflectance of the wafer W. Moreover, on the top end portion of the projection optical system PL is mounted a reflecting light detection system 530 for detecting a light flux, or otherwise, to be reflected from the wafer W side through the projection optical system PL, and a detection signal of the reflecting light detection system 530 is then fed to a self measurement unit 531 under control of the main control unit 507 as will be described hereinafter, the self measurement unit 531 being arranged so as to monitor a reflectance (a reflecting ratio) of the wafer W and a variation in transmittance of the projection optical system PL, and to measure irregularities of illuminance and a space image, etc.

Then, a description will be made of the configuration of the projection optical system PL in FIG. 29 in more detail with reference to FIG. 30.

Figure 30:
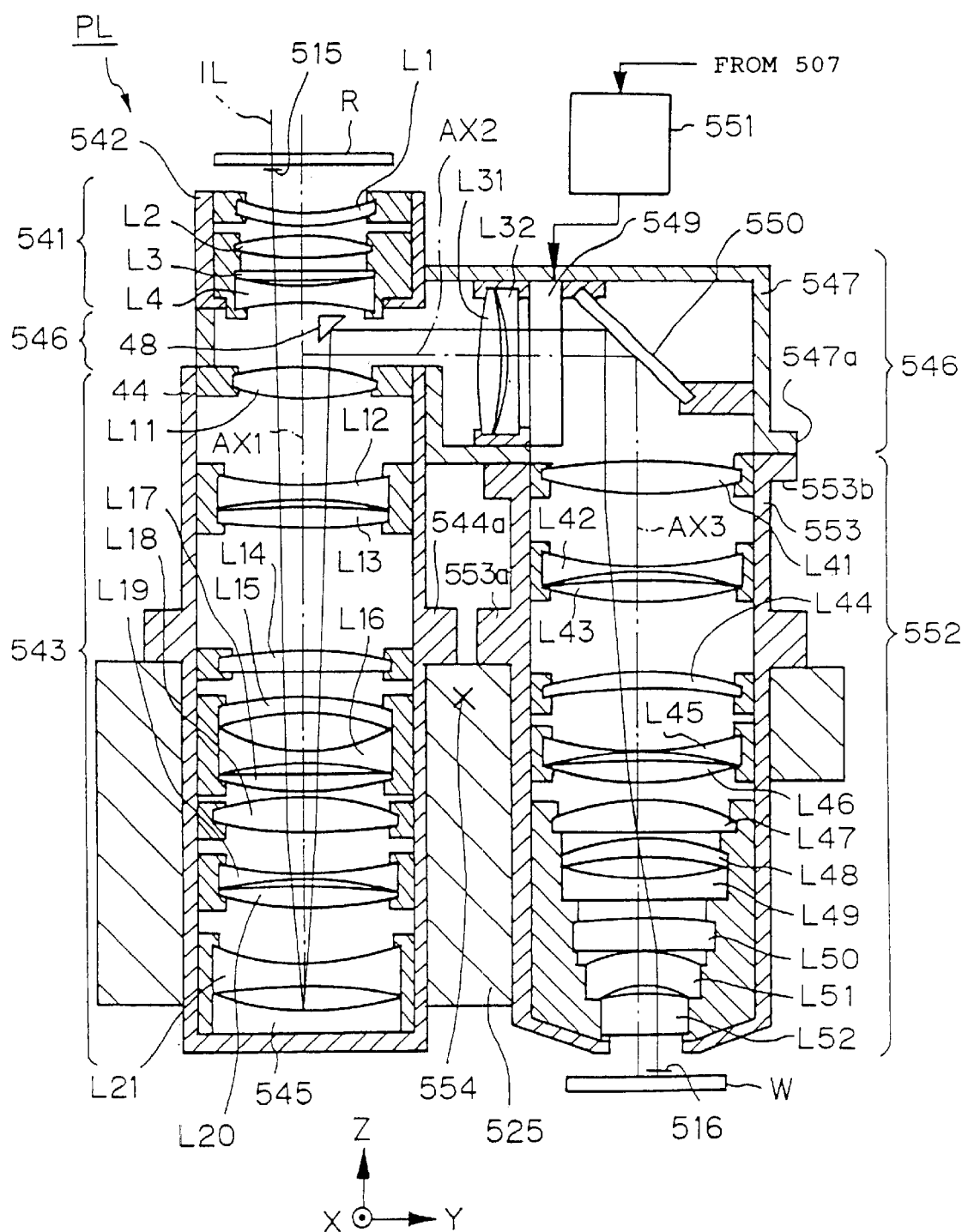
FIG. 30 is a longitudinally sectional view showing the configuration of a projection optical system PL as shown in FIG. 29.

FIG. 30 is a sectional view showing the projection optical system PL. In FIG. 30, the projection optical system PL may be divided into four sections in terms of its mechanism. The four sections may include a first object section 541, a light axis return section 543, a light axis deflection section 546 and a second object section 552. Further, a concave mirror 545 is disposed in the light axis turn section 543.

In the case where broad-banded laser light is used as illumination light IL as in this embodiment, such laser light can present the advantages in that an electric power can increase a light quantity even if a power source would be the same, so that a throughput can be increased, and that adverse influences or otherwise due to interference to be caused by a decrease in coherency can be reduced. It should be noted herein, however, that in the case where illumination light in an ultraviolet area such as KrF excimer laser light or ArF excimer laser light is used as in this embodiment, a glass material to be used as a refractive lens in the projection optical system PL should be restricted to quartz, fluorite or otherwise, so that it is difficult to design the projection optical system PL by a refraction optical system only. Therefore, in this embodiment, a reflection optical system or a refraction optical system, such as a concave mirror, which does not cause any chromatic aberration, is used together in order to achieve broad-banded achromatism. It should be noted herein that generally the reflection optical system is a 1-to-1 (equally magnified) optical system, however, when a reduced projection such as a ¼-fold or ⅕-fold projection is effected as in this embodiment, a unique modification for the construction is required in a manner will be described hereinafter.

In this configuration, the first object section 541 is disposed right under the reticle R, and the first object section 541 has lenses L1, L2, L3 and L4 disposed fixedly in this order from the reticle R side in a barrel 542 through a lens frame. Under the barrel 542, a barrel 544 of the light axis turn section 543 is disposed through a barrel 547 of the light axis deflection section 546, and lenses L11, L12–L20, inclusive, and L21, and the concave mirror 545 are fixed in the barrel 544 in this order from the reticle R side through a lens frame. The first object section 541 and the light axis turn section 543 are disposed coaxially each other, and the light axis will hereinafter be referred to as light axis AX1. The light axis AX1 extends in the direction perpendicular to the pattern plane of the reticle R.

In this configuration, a small-sized mirror 548 having a reflecting plane extending in +Y-axial direction obliquely at about 45° with respect to the light axis AX1 is disposed in the position deflected in the +Y-axial direction from the light axis AX1 within the barrel 547 of the light axis deflection section 546 interposed between the barrel 542 and the barrel 544. The barrel 547 in turn is provided therein with lenses L31 and L32, a correction optical system 549 and a beam splitter 550 in this order in the +Y-axial direction from the small-sized mirror 548. A light axis AX2 of the light axis deflection section 546 extends in the direction intersecting at a right angle to the light axis AX1, and the reflecting plane of the beam splitter 550 is disposed inclining at approximately 450 with respect to the light axis AX2 so as to intersect with the reflecting plane of the small-sized mirror 548. The beam splitter 550 is a beam splitter arranged so as to have a transmittance of 5% and a reflectance of approximately 95%, and a way of using the light flux passed through the beam splitter 550 will be described hereinafter. The correction optical system 549 is disposed so as to move in a direction along the light axis AX2 in a minute mode and comprises a lens group, or otherwise, that can minutely adjust an inclining angle with respect to the flat plane perpendicular to the light axis AX2. The position and the including angle of the correction optical system 549 can be controlled by an imaging characteristic correction unit 551. The operation of the imaging characteristic correction unit 551 is controlled by means of the main control unit 507 as shown in FIG. 29. Further, the position at which the correction optical system 549 is disposed is the position nearly conjugated with the pattern plane of the reticle R, and the correction optical system 549 can correct mainly an error in magnification, distortion, a focal position, an astigmatism, a coma aberration, a curvature in an image plane, and a spherical aberration. Moreover, the barrel 553 of the second object section 552 is disposed in a direction in which the light axis AX2 is bent by means of the beam splitter 550, so as to come into contact with the barrel 547, and the second object section 552 is provided with lenses L41, L42, L43–L52, inclusive, in the barrel 553 thereof in this order from the side of the beam splitter 550 by the aid of a lens frame. Moreover, the bottom surface of the second object section 552 is disposed so as to face the surface of the wafer W. A light axis AX3 of the second object section 552 is disposed extending in a direction parallel to the light axis AX1 of the first object section 541 and the light axis turn section 543 yet perpendicular to the light axis AX2 of the light axis deflection section 546.

In this case, the rectangular illumination region 515 on the reticle R by the illumination light IL is set at the position at which it is deflected in −Y-axial direction from the light axis AX1, and the illumination light passed through the illumination region 515 (hereinafter referred to as an "imaging light flux") is incident to the light axis turn section 543 through the lenses L1, L2, L3 and L4 in the first object section 541 and then through the inside of the barrel 547 of the light axis deflection section 546. The imaging light flux incident to the light axis turn section 543 is then incident to the concave mirror 545 through the lenses L11, L12–L20, inclusive, and L21, and then reflected by means of the concave mirror 545. The reflected and condensed imaging light flux passes through the lenses L21, L20–L12, inclusive, and L11, again yet in the order opposite to the previous passage, and then, is deflected in the +Y-axial direction by the small-sized mirror 548 in the barrel 547 of the light axis deflection section 546.

The imaging light flux reflected at the small-sized mirror 548 in the light axis deflection section 546 is then incident to the beam splitter 550 through the lenses L31 and L32 and the correction optical system 549. Upon this, an image (an intermediate image) of a pattern in the illumination region 515 on the reticle R, which has an approximately equal magnification, is formed in the vicinity of the beam splitter 550 inside the barrel 547. A combined system in combination of the first object section 541 with the light axis turn section 543 is called herein "an equal-magnification optical system". The imaging light flux deflected in the −Z-axial direction with the beam splitter 550 advances toward the second object section 552 where the imaging light flux in turn forms a reduced image of the pattern within the illumination region 515 on the reticle R in the exposure region 516 on the wafer W through the lenses L41, L42–L51, inclusive, and L50. In this sense, the second object section 552 will sometimes be referred to as "a reduced projection system".

As described above, in this embodiment, the imaging light flux passed through the illumination region 515 on the reticle R nearly in the −Z-axial direction is turned nearly in the +Z-axial direction by the first object section 541 and the light axis turn section 543 within the projection optical system PL. Then, the imaging light flux forms an intermediate image having a magnification nearly equal to the pattern within the illumination region 515 during the steps in which it is returned approximately to the +Y-axial direction and then to the −Z-axial direction in order by means of the light axis deflection section 546, thereafter forming a reduced image of the illumination region 515 in the exposure region 516 on the wafer W through the second object section 552. In this configuration, the projection optical system PL in this embodiment can have all the lenses L2–L4, L11–L21, L32 and L33, and L41–L52 disposed with the axis symmetrical to one another and be made of quartz but three or four lenses being made of fluorite. This simple construction alone can perform an achromatism with a high degree of precision in the scope of approximately 100 pm that in turn is a band width of the broad-banded illumination light IL.

The projection optical system PL in this embodiment can be divided into three systems in an optical mode, which include the equal-magnification optical system composed of the first object section 541 and the light axis turn section 543, the light axis deflection section 546, and the reduced projection system composed of the second object section 552, as described above. As to the mechanical structure of the projection optical system, the small-sized mirror 548 is interposed between the lens L4 of the first object section 541 and the lens L11 of the light axis turn section 543. In this construction, if the lens L4, the small-sized mirror 548 and the lens L11 would be incorporated in the identical barrel, it is required that the small-sized mirror 548 and the beam splitter 550 within the light axis deflection section 546 have to be incorporated in different barrels for adjustment purposes. If the small-sized mirror 548 and the beam splitter 550 would be incorporated into different barrels, however, there is the risk that the right angle of intersection of the reflecting planes of the two members with each other is caused to fluctuate. If the right angle of intersection of those two reflecting planes would fluctuate, it may cause deterioration in imaging performance. In this embodiment, accordingly, the equal-magnification projection system is divided into the first object section 541 and the light axis turn section 543 with the interposition of the barrel 547 of the light axis deflection section 546, and the small-sized mirror 548 and the beam splitter 550 are fixed in the barrel 547.

Upon the assembly of the projection optical system PL, each of the first object section 541, the light axis turn section 543, the light axis deflection section 546 and the second object section 552 is assembled together and adjusted in advance separately. Thereafter, the barrel 544 of the light axis turn section 543 is inserted into a through-hole formed in an upper plate of the column 525, and a lower portion of the barrel 553 of the second object section 552 is likewise inserted into a through-hole formed therein. A washer is inserted into a gap between a flange 544a of the barrel 544 thereof and the upper plate of the column 525 as well as a flange 553a of the barrel 553 and the upper plate thereof, and the flanges 544a and 553a are temporarily fastened on the upper plate of the column 525 with a screw. Then, the barrel 547 is mounted on the top ends of the barrels 544 and 553, and then washer is inserted into a gap between a flange 547a of the barrel 547 and a flange 553b on the top end of the barrel 553, and thereafter, the flange 547a is temporarily fastened on the flange 553b with a screw.

Next, laser beams for use with adjustment purposes are irradiated into the barrel 544 from above of the lens L11 in the barrel 544, thereby monitoring the position (the position on the plane corresponding to the surface of the wafer W) from which the laser beams leave the lens L52 disposed at the bottommost position of the barrel 553 and pass therethrough and adjusting the monitored position so as to agree with the target position, for example, by adjusting the thickness of the washer to be disposed at the bottom portion of the flanges 544a, 553a and 547a or transferring the barrels 542, 553 and 547 in a transverse direction, or otherwise. And, in a state in which the position of the laser beams agrees with the target position, the flanges 544a, 553a and 547a are fastened each with a screw, thereby fixing the light axis turn section 543, the second object section 552 and the light axis deflection section 546, respectively. Finally, the barrel 542 of the first object section 541 is transferred in the −Y-axial direction above the end portion of the barrel 547, and the barrel 542 is disposed on the barrel 547 by inserting a washer between a flange (not shown) of the barrel 542 and a corresponding flange (not shown) of the barrel 547. Once again, for instance, laser beams for adjustment use are irradiated from above the lens L1 of the barrel 542 to adjust the light axis, thereafter fastening the barrel 542 on the barrel 547 with a screw and finishing the assembly of the projection optical system PL with the projection exposure apparatus.

Moreover, in this embodiment, the position of a gravity 554 of the entire system of the projection optical system PL is set inside the projection optical system PL, yet outside the light path of the imaging light flux, with stability of imaging characteristics against vibration and a balance of the projection optical system PL taken into account. In other words, in FIG. 30, the gravity 554 of the projection optical system PL is set at the position (inside the upper plate of the column 525) in the vicinity of an intermediate position between the light axis turn section 543 and the second object section 552 and lower slightly from the flange 544a of the barrel 544 and the flange 553a of the barrel 553. By setting the gravity 554 of the projection optical system PL further in the vicinity of the flanges 544a and 553a in the manner as described above, the projection optical system PL can withstand vibration to a higher extent and provide a highly rigid structure.

As described above, in this embodiment, an intermediate image plane conjugated with the pattern plane of the reticle R exists inside the light axis deflection section 546 of the projection optical system PL and in the vicinity of the beam splitter 550, and the correction optical system 549 is disposed in the vicinity of the intermediate image plane. The imaging characteristics, such as a projection magnification of a reduced image of the reticle R to be projected on the wafer W, a distortion and so on, can be corrected by minutely moving, for example, a lens group acting as the correction optical system 549 in the direction parallel to the light axis AX2 or by adjusting an inclining angle of the lens group with respect to the plane perpendicular to the light axis AX2 or by other means. In the contrast, a conventional system has such an imaging characteristic correction mechanism disposed approximately right under the reticle R. In this embodiment, however, no such imaging characteristic correction mechanism is disposed right under the reticle R and no limitation is imposed from a mechanical point of view, so that the system according to the present invention can present the advantage in that the reticle support table 518 of FIG. 29 can be designed so as to have a higher degree of rigidity. Moreover, by providing a minutely movable optical system equivalent to the correction optical system 549 on the light axis turn section 543 or the second object section 552, a correction of an aberration (astigmatism, coma aberration, etc.) of an projection image as well as a correction of a curvature of an image plane can also be performed. In addition, a combination of these configuration can further make it possible to correct an error in a higher-order magnification.

Then, the operation of the reflecting light detection system 530 and the self measurement unit 531 in FIG. 29 will be described with reference to FIGS. 30 and 36.

First, as shown in FIG. 30, the illumination light IL passed through the illumination region 515 on the reticle R is irradiated on the wafer W side through the equal-magnification optical system composed of the first object section 541 and the light axis turn section 543, the light axis deflection section 546, and the second object section 552 (the reduced projection system). In this construction, if the reference mark member FM is set in place of the wafer W, the light reflected from the reference mark member FM is incident to the beam splitter 550 inside the light axis deflection section 546 through the second object section 552, as shown in FIG. 30. As the beam splitter 550 has a transmittance of 5%, then the reflected light passed through the beam splitter 550 is detected by means of the reflecting light detection system 530 as shown in FIG. 29. In FIG. 30, however, the reflecting light detection system 530 is omitted.

Figure 36:
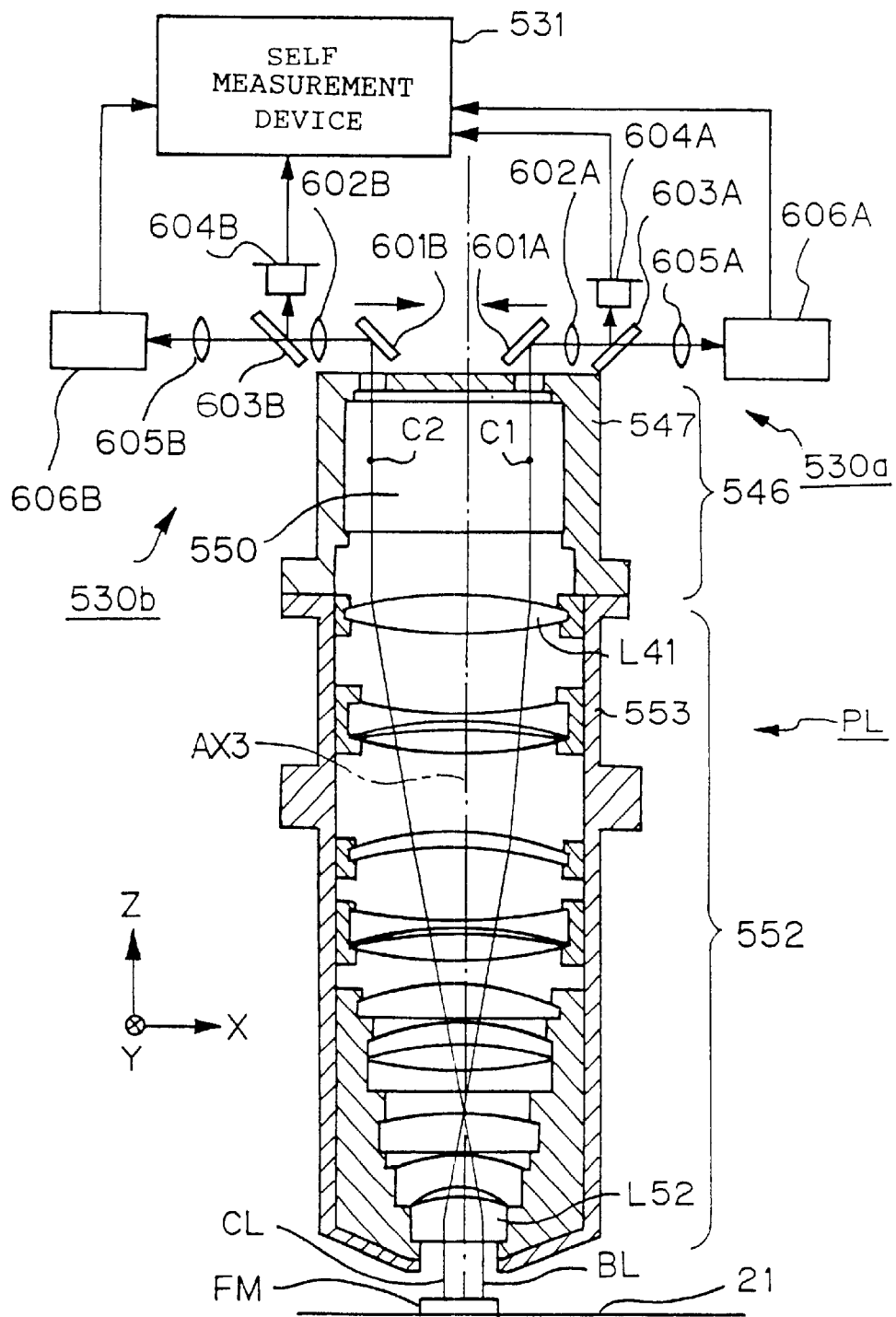
FIG. 36 is a longitudinally sectional view showing the configuration of a reflecting light detection system 530 for receiving light reflected from a reference pattern member as shown in FIG. 29.

FIG. 36 shows a sectional view along the flat plane perpendicular to the X-axis passing through the light axis AX3 in such a state that the reflecting light detection system 530 of FIG. 29 is superimposed on the light axis deflection section 546 of FIG. 30. In FIG. 36, the reflecting light detection system 530 comprises a first reflecting light detection system 530a and a second reflecting light detection system 530b. Further, the reference mark member FM is set in an effective exposure field of the second object section 552 of the projection optical system PL, and a reference pattern such as, for example, a slit, pinhole or otherwise, is formed by means of a light-passing opening in a film (a metallic film, etc.) having a high rate of reflectance on the reference mark member FM. By driving the wafer stage 522 of FIG. 29, a desired reference pattern formed on the reference mark member FM can be transferred to a position in the vicinity of a predetermined in the effective exposure field.

After the desired reference pattern has been set in the vicinity of the predetermined position, the illumination light IL passed through the reticle R as shown in FIG. 30 is irradiated onto the reference mark member FM through the projection optical system PL, and reflected light CL and BL are caused to emit toward the second object section 552 from a region on the reference mark member FM nearly symmetrical to each other with respect to the light axis AX3.

Then, the reflected light CL is incident to the beam splitter 550 in the light axis deflection section 546 through the lenses L52 to L41, inclusive, in the second object section 552, and the reflected light CL passed through the position Cl on the beam splitter 550 is then incident to the first reflecting light detection system 530a after passage through the opening of the barrel 547. In the first reflecting light detection system 530a, the reflected light CL is incident to a half mirror 603A through an eccentric mirror 601A and a first relay lens 602A, and the light flux reflected at the half mirror 603A is incident to the light recipient plane of a pupil position photoelectric detector 604A composed of a photodiode or otherwise. The detection signal of the pupil position photoelectric detector 604A is supplied to the self measurement unit 531.

The pupil position photoelectric detector 604A to be used herein can function as a sensor for measuring a variation (a variation in an attenuation factor of light passing through the projection optical system) in transmittance of the projection optical system PL by irradiation of illumination light having an ultraviolet wavelength range.

In this embodiment, an intermediate image of a reference pattern is formed in the vicinity of the beam splitter 550 by means of the reflected light CL, and a Fourier transform pattern of the intermediate image by the first relay lens 602A is formed on the light receipt plane of the pupil position photoelectric detector 604A. In other words, the light receipt plane of the pupil position photoelectric detector 604A comprises a Fourier transform plane (a pupil plane) with respect to the surface of the reference mark member FM. At this time, by transferring the reticle R of FIG. 30 relatively to the reference mark FM, the relationship of the position of the pattern on the reticle R with the position of the reference pattern on the reference mark FM can be detected by means of the self measurement unit 531 based on a variation in the detected signal from the pupil position photoelectric detector 604A.

On the other hand, the light flux passed through the half mirror 603A forms an image of the reference mark on a image pickup plane of an image pick-up element 606A composed of a two-dimensional CCD and so on through a second relay lens 605A. More specifically, the image pick-up plane of the image pickup element 606A is disposed so as to be conjugated with the surface of the reference mark member FM, and an image pickup signal of the image pickup element 606A is supplied to the self measurement unit 531. Then, the self measurement unit 531 detects the relationship of the position of the pattern on the reticle R with the position of the reference pattern on the basis of the image pick-up signal, in such a state that the reticle R and the reference mark member FM are stayed static. Moreover, the first relay lens 602A and the eccentric mirror 601A are both configured so as to be transferred to an optional measurement position in a region (an illumination field) corresponding to the effective exposure field of the second object section 552. Therefore, the detection signal of the pupil position photoelectric detector 604A and the image pick-up signal of the image pickup element 606A at such an optional measurement position can be incorporated.

The image pickup element 606A can function as a sensor for detecting a variation in imaging characteristic (for example, projection magnification, focal position, and at least one of five aberrations of Seidel) of the projection optical system on the basis of the projection optical system PL, which can be varied upon irradiation of the illumination light having an ultraviolet wavelength region.

In addition, in contrast to the first reflecting light detection system 530a, the second reflecting light detection system 530b is disposed above the position C2 of the beam splitter 550 of the light axis deflection section 546. The second reflecting light detection system 530b comprising an eccentric mirror 601B, a first relay lens 602B, a half mirror 603B, a pupil position photoelectric detector 604B, a second relay lens 605B and an image pickup element 606B. The second reflecting light detection system 530b is further configured so as to receive reflected light BL on the reference mark member FM, which is reflected in a manner nearly symmetrical to the reflected light CL. In an actual case, the first relay lens 602B and the eccentric mirror 601B of the second reflecting light detection system 530b is disposed so as to move individually from the first reflecting light detection system 530a, and the measurement can be effected at two optional positions in the illumination field corresponding to the effective exposure field of the second object section 552.

Upon effecting an actual measurement, if the reticle R would be of a type of passing light thoroughly, only the reflected light around a reference pattern (an opening pattern) of the reference mark member FM can be detected in the reflecting light detection systems 530a and 530b through the second object section 552 and the beam splitter 550, respectively, so that a distribution of the light quantity on the reference pattern can be measured.

Moreover, in the case where a predetermined pattern is formed on the reticle R, the light quantity returning to the reflecting light detection systems 530a and 530b can be determined by superimposing a projection image of the pattern on the reference mark member FM over the reference pattern. Therefore, by receiving the reflected light passed through the beam splitter 550 by means of the reflecting light detection systems 530a and 530b, the relationship of the position of the pattern on the reticle R with the position of the pattern on the reference mark member FM can be investigated.

The self measurement unit 531 can perform various operations by processing the detection signals and the image pick-up signals from the reflecting light detection systems 530a and 530b, the operations including, for instance, aligning the reticle R with the reference mark member FM, checking imaging characteristics of the projection optical system PL on the reference mark member FM, monitoring a reflectance of the wafer W on the basis of the reflection amount on the reference mark member FM, detecting an irregularity of illuminance within the exposure region 516 on the wafer W, and so on.

In contrast thereto, conventional techniques include a measurement of imaging characteristics or other operations in a system where an irradiation system or a light receipt system is disposed, for example, inside of the sample table 521, as shown in FIG. 29, so that the structure inside the sample table 521 and on the projection optical system thereof are made complicated. In this embodiment, however, the corresponding structure can be simplified, thereby leading to making the sample table 521 light in weight, enabling a prevention of generating heat due to irradiation of the illumination light, and so on. In addition, although a detection system for detecting reflectance of a wafer by receiving the light reflected from the wafer on the reticle R is used for conventional systems, this embodiment can simplify mechanisms on the reticle R.

As the detected signals from the reflecting light detection systems 530a and 530b are input to the main control unit 507 during scanning exposure, the main control unit 507 can detect illuminance of the illumination light IL on the wafer W. Moreover, the main control unit 507 outputs an instruction signal to exposure control unit 501 on the basis of the illuminance detected, and adjusts the intensity of the illumination light IL emitting from the excimer laser light source 502. This allows a correction of a variation in illuminance on the wafer W, which may occur attendant upon a variation in transmittance of the projection optical system PL by the irradiation of the illumination light IL.

It is to be noted herein that, in place of adjustment of the intensity of the illumination light IL emitting from the excimer laser light source 502, it can also be arranged, for instance, to vary a latitudinal width of the fixed blind of the irradiation vision field stop system 511, i.e., a width in the scanning direction of the exposure region 516 of the projection optical system PL, or to vary a frequency of pulse oscillation of the excimer laser light source 502 or a velocity at which to scan the wafer W during the scanning exposure. In summary, it can be sufficient to adjust at least one of the intensity of the illumination light IL, the width in the scanning direction of the exposure region 516, the frequency for pulse oscillation, and the scanning velocity of the wafer W. In addition, by varying a shape of the fixed blind of the illumination vision field stop system 511, the main control unit 507 can correct irregularities of illuminance on the wafer W, which may occur due to a variation in transmittance of the projection optical system PL by irradiation of the illumination light IL, on the basis of the detection signals detected by the reflecting light detection systems 530*a* and 530*b*.

Moreover, the main control unit 507 can detect a variation in imaging characteristic which may be caused by a variation in transmittance of the projection optical system PL, on the basis of the detection signals detected by the reflecting light detection systems 530*a* and 530*b*. Furthermore, the main control unit 507 can correct the imaging characteristic of the projection optical system PL by controlling the imaging characteristic correction unit 551 on the basis of the detected imaging characteristic. The imaging characteristic referred to herein is intended to mean at least one of an error in magnification, distortion, a focal position, astigmatism, a coma aberration, a curvature in an image plane, and a spherical aberration. Further, it can adjust a deviation of the focal position and inclination of an image plane by transferring the wafer W by means of the focus-tilt control unit 527.

In addition, in conventional cases, the detection light for measuring an imaging characteristic or the like is different from the exposing illumination light, so that there is the risk that the imaging characteristics, etc. to be measured by the detection light differ from the imaging characteristics to be measured under the exposing illumination light due to disagreement of a number of openings for the detection light (eventually a a value which is a coherence factor) with a number (a σ value) of openings for the exposing illumination light. Moreover, conventional systems have the problems, for example, that may arise with a lack of the number of openings for the light receipt system for measuring such imaging characteristics and so on. On the other hand, in the embodiments of the present invention, the exposing illumination light IL is used, as it is, as a detecting light, so that the first and second reflecting light detection systems 530*a* and 530*b* can be disposed with a margin so that the number of openings can be increased to a sufficient number, thereby allowing measurement for imaging characteristics and so on with high precision.

Then, a description will be made of the relationship between the positions of the illumination region 515 on the reticle R and the exposure region 516 on the wafer W as shown in FIG. 30, with reference to FIG. 31.

FIG. 31(*a*) shows the illumination region 515 on the reticle R as shown in FIG. 30. In FIG. 31(*a*), it is shown that an illumination region 515 in a rectangular form elongated in the X-direction is disposed at a position deviated slightly in the −Y-direction with respect to the light axis AX1 in a circular effective illumination vision field 541*a* of the first object section 541 of the projection optical system PL as shown in FIG. 30. The direction parallel to the short side of the illumination region 515 (a Y-direction) is the scanning direction in which the reticle R is being scanned. As shown in FIG. 30, in the equal-magnification optical system composed of the first object section 541 and the light axis turn section 543, the imaging light flux passed through the illumination region 515 of the reticle R is led up to the small-sized mirror 548 after having been turned by the concave mirror 545, so that it is required to deflect the illumination region 515 with respect to the light axis AX1.

On the other hand, FIG. 31(*b*) shows the exposure region 516 on the wafer W (a region being conjugated with the illumination region 515), as shown in FIG. 30. As shown in FIG. 31(*b*), the exposure region 516 in a rectangular form elongated in the X-direction at a position deviated slightly in the +Y-direction with respect to the light axis AX3 in a circular effective exposure field 552*a* of the second object section 552 of the projection optical system PL as shown in FIG. 30.

Further, FIG. 31(*c*) shows the illumination region 515 in a rectangular form at a position deviated slightly in the −Y-direction with respect to the light axis AX1 in the circular effective irradiation vision field 541*a* in the same shape as in FIG. 31(*a*). Further, FIG. 31(*d*) shows an effective exposure field 552*a*A of a second object section that is modified from the second object section 552 of FIG. 30, in which an exposure region 516A (a region being conjugated with the illumination region 515 as shown in FIG. 31(*c*)) in a rectangular form elongated in the X-direction with a light axis AX3A of the effective exposure field 552*a*A centered round the region. More specifically, the exposure region 516A on the wafer W can be set to be in a region with the light axis of the effective exposure field 552*a*A centered round the region by altering the construction of the second object section 552 (the reduced projection system) in the final stage of the projection optical system PL, as shown in FIG. 31(*d*). FIGS. 31(*b*) and 31(*d*) can be selected by easiness of designing for removal of an aberration of the projection optical system PL. FIG. 31(*b*) has the advantage over FIG. 31(*d*) in that the designing can be made easier, while FIG. 31(*d*) has the advantage over FIG. 31(*b*) in that a lens dimension of the second object section (the reduced projection system) can be made slightly smaller.

Then, a detailed description will be made of the configuration of the alignment sensor 528 of an off-axis type in FIG. 29 with reference to FIG. 32.

Figure 32:
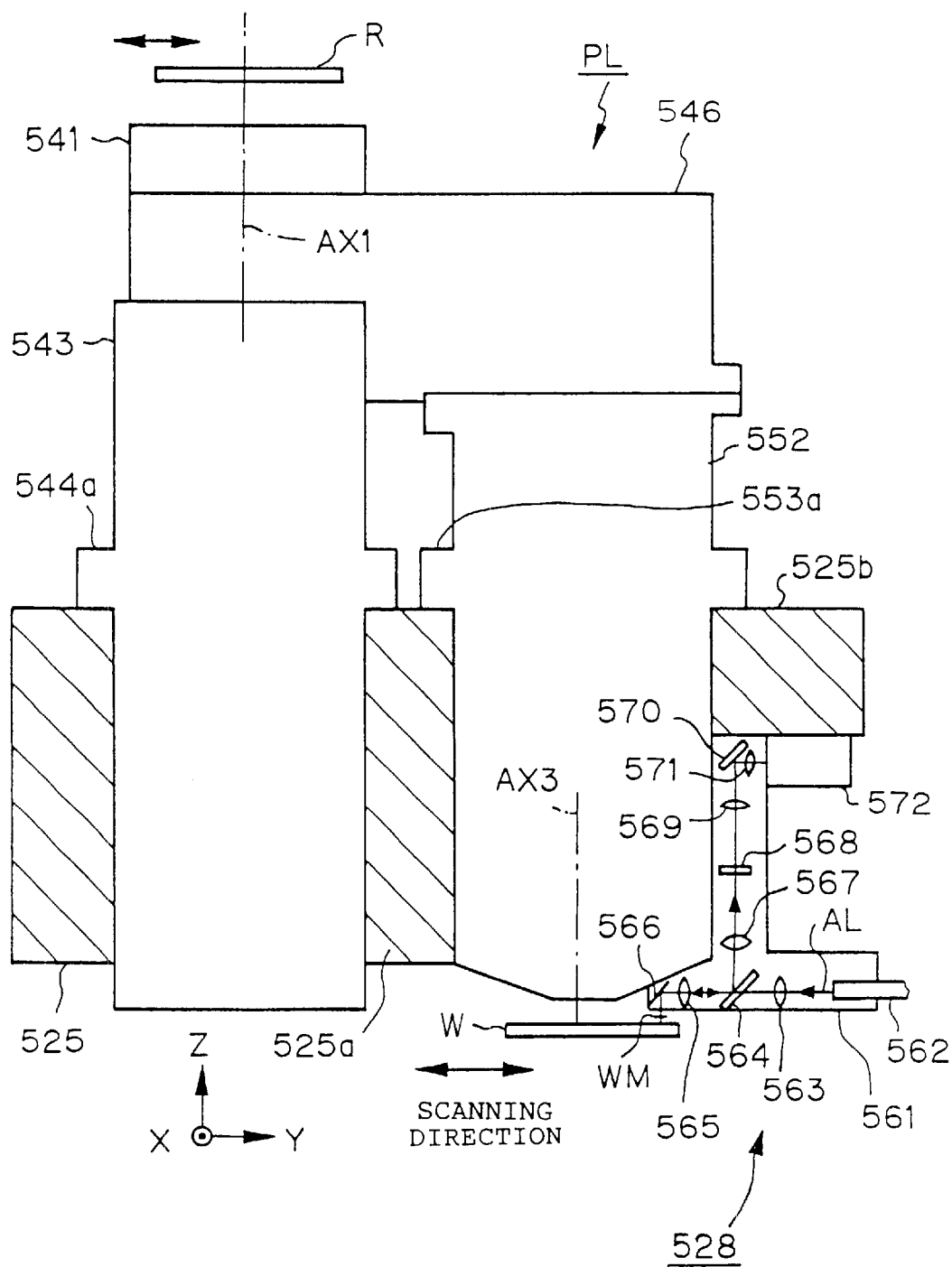
FIG. 32 is a partially sectional view showing the configuration of an alignment sensor 528 of an off-axis type as shown in FIG. 29.

FIG. 32 shows a figure of the projection optical system PL as shown in FIG. 30. As shown in FIG. 32, the projection optical system PL is divided into the first object section 541, the light axis deflection section 546, the light axis turn section 543 and the second object section 552, which are required to be designed so as not to be distorted due to outside disturbances such as vibration, heat, and so on. At this end, a high degree of rigidity is required for the column 525 with the flanges 544*a* and 553*a* mounted thereon, particularly for a portion 525*a* of the column 525 interposed between the light axis turn section 543 and the second object section 552. In order to ensure such a high degree of rigidity, the alignment sensor 528 for detecting the position of a wafer mark WM as an alignment mark on the wafer W is required to be disposed on the side surface portion of the second object section 552 and on the side opposite to the portion 525*a* that requires such high rigidity, i.e., on the side surface portion in the +Y-direction of the wafer stage 522. Further, a portion 525*b* in the column 525, which is located facing the +Y-directional side surface portion of the second object section 552 and the +X-directional and −X-directional side surface portions thereof becomes thinner by a half or less with respect to the portion 525a having higher rigidity, so that the alignment sensor 528 is disposed on the bottom portion of the thinner portion 525b. This disposition allows the first object section 541, the light axis deflection section 546, the light axis turn section 543 and the second object section 552 to be supported as an integral projection optical system PL, even when the reticle R and the wafer W are scanned in the direction indicated by arrow by scanning at the time of the scanning exposure, thereby achieving a high degree of rigidity for the projection optical system PL as a whole.

In the alignment sensor 528 of an off-axis type as shown in FIG. 32, a broad-band (white) alignment light AL emitting from a halogen lamp or the like, although not shown, and having a weak photosensitivity to a photoresist on the wafer W, is led to the inside of a barrel 561 of the alignment sensor 528 through an optical guide 562. Inside the barrel 561, the alignment light AL passes through a condenser lens 563 and then through a half mirror 564, and illuminates an observation vision field in a predetermined scope containing the wafer mark WM on the wafer W through a first object lens 565 and a prism-type eccentric mirror 566. The reflecting light from the wafer mark WM is reflected by means of the half mirror 564 through the eccentric mirror 566 and the first object lens 565, thereby allowing a second object lens 567 to form an image of the wafer mark WM on an indicator plate 568.

The light flux passed through the indicator plate 568 then passes through a first relay lens 569, an eccentric mirror 570 and a second relay lens 571 and again forms images of the wafer mark WM and an indicator mark on an image pickup element 572 composed of a two-dimensional CCD. The wafer mark WM so formed is a mark in the form of, for example, a concave and convex Y-axial lattice arranged at a predetermined pitch in the Y-direction, and the image pick-up signals of the image pickup element 572 are supplied to an alignment signal processing system 529 as shown in FIG. 29. The alignment signal processing system 529 computes an amount of deviation of the position of the wafer mark WM in the Y-direction with respect to the indicator mark on the indicator plate 568, on the basis of the image pick-up signals, and computes the Y-coordinate in the stage coordinates system (X, Y) of the wafer mark WM by adding a Y-coordinate measured by the laser interferometer 524 of FIG. 29 to the amount of deviation of the position, followed by supplying the Y-coordinate to the main control unit 507. An X-axial wafer mark in a form in which the wafer mark WM is rotated at 90° is also provided in the corresponding shot region on the wafer W, and the X-coordinate in the stage coordinates system (X, Y) of the X-axial wafer mark can be detected by means of the alignment sensor 528. The alignment of the wafer W can be performed by detecting the coordinates of the wafer mark provided in the predetermined shot region on the wafer W by means of the alignment sensor 528 in the manner as described above.

Further, in order to allow a measurement by the alignment sensor 528 with high precision, it is preferred to make a distance (a baseline amount) between the detection center (a center of the projection image of the indicator mark on the wafer W) of the alignment sensor 528 and the exposure center (a center of the exposure region 516) of the projection optical system PL as small as possible. At this end, the alignment sensor 528 is disposed to a position as close as possible to the second object section 552 of the projection optical system PL.

In addition to the alignment sensor 528 of an off-axis type, the multipoint AF sensor 526 of FIG. 29 for detecting the focus position and the inclination angle of the surface of the wafer W should also be disposed at a position approaching to the closest position to the second object section 552. Therefore, in this embodiment, in order to prevent a mechanical interference between the alignment sensor 528 and the AF sensor 526, the AF sensor 526 is disposed on the X-directional side surface portion of the second object section 552 in a manner of intersecting with the alignment sensor 528 at a right angle.

Figure 33:
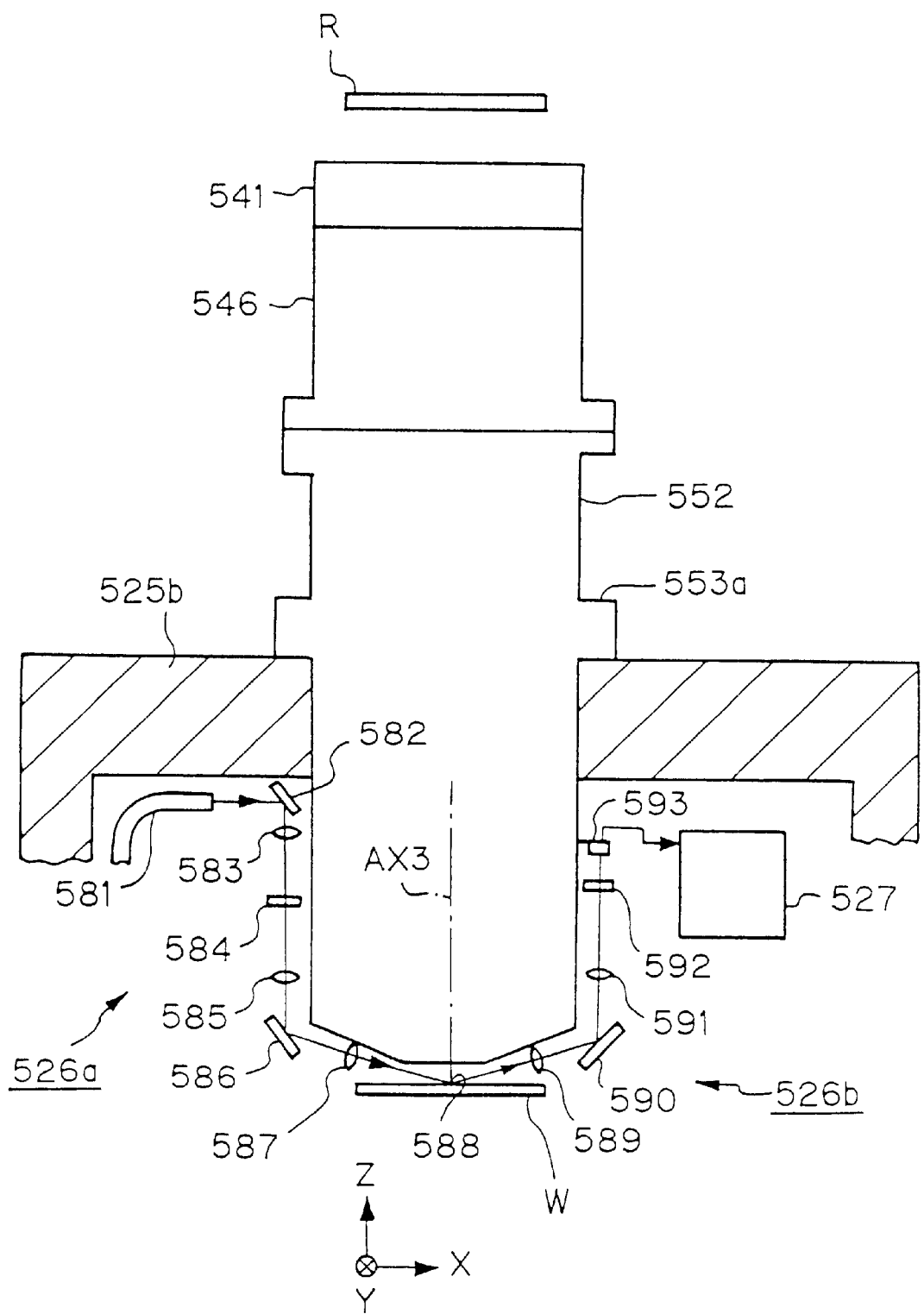
FIG. 33 is a partially sectional view showing the configuration of a multi-point AF sensor as shown in FIG. 29.

FIG. 33 shows the state in which the AF sensor 526 is disposed. FIG. 33 shows the AF sensor 526 of FIG. 32 in section in which the sectional plane passes through the light axis AX3 of the second object section 552 and extends along the flat plane (an XZ flat plane) perpendicular to the Y-axis. An upper half of FIG. 33 indicates a left-hand side view of the reticle R and the first object section 541 as shown in FIG. 32, for brevity of explanation. In FIG. 33, the AF sensor 526 is divided into two systems, one being an illumination optical system 526a and a condensing optical system 526b. The illumination optical system 526a and the condensing optical system 526b are disposed on the side surface portions in the −X-direction and the +X-direction of the second object section 552, respectively, and on the bottom portion of the thinner portion 525b of the column 525 of FIG. 32 thinner than the portion 525a having a higher rigidity.

First, in the illumination optical system 526a in this configuration, illumination light from a halogen lamp or otherwise, although not shown, which is low in photosensitivity and nearly white in color, is led to the side surface portion of the second object section 552 through an optical guide 581, and then the illumination light illuminates a multi-slit plate 584 through a mirror 582 and a condenser lens 583, the multi-slit plate 584 having a plurality of slit-shaped openings arranged in a given sequence. The illumination light passed through each of the slit-shaped openings of the multi-slit plate 584 projects a plurality of slit images (only one slit image 588 being indicated as a representative in FIG. 33) that are conjugated images of the plural slit-shaped openings onto the wafer W in a direction oblique to the light axis AX3 through a lens 585, a vibration mirror 586 and a lens 587. The region onto which these slit images are projected is a look-ahead region located in the rectangular exposure region 516 on the wafer W as shown in FIG. 29 and on this side in the scanning direction with respect to the exposure region 516.

The reflected light from the plural slit images on the wafer W are incident to the condensing optical system 526b. In the condensing optical system 526b, the reflected light passes through the lens 589, the mirror 590 and the lens 591 and again forms plural slit images (588, etc.) on a multi-slit plate 592 with slit-shaped openings corresponding to the multi-slit plate 584 formed therein. Further, on the back surface of the multi-slit plate 592, there is disposed a photoelectric detector 593 on which photoelectric conversion elements such as, for example, photodiodes, etc., for individually receiving the reflected light passed through each of the slit-shaped openings of the multi-slit plate 592, and a photoelectric conversion signal (hereinafter referred to as "a focus signal") from each of the photoelectric conversion elements of the photoelectric detector 593 is supplied to the focus-tilt control unit 527.

In this case, when the slit image formed again on the multi-slit plate 592 is vibrated in the latitudinal direction on the corresponding slit-shaped opening, due to the vibration of the vibration mirror 586, and the focus position (the position in the Z-direction) on the surface of the wafer W fluctuates, the center of vibration of the slit image and the center of the slit-shaped opening corresponding thereto are caused to slide in a transverse direction. Therefore, a signal corresponding to the amount of a fluctuation of the focus position at the projection position of each slit image (588, etc.) on the wafer W can be obtained by shaping the focus signal that is a photoelectric conversion signal of the reflected light passed through each of the slit-shaped openings in synchronization with the drive signal of the vibration mirror 586 in the focus-tilt control unit 527. Moreover, the AF sensor 526 is calibrated in advance so as for the synchronization shaping signals of the focus signals to become zero, when the surface of the wafer W agrees with the imaging surface of the projection optical system PL. Therefore, the focus-tilt control unit 527 can give an average value and an inclination angle of the focus positions in the exposure region 516 on the wafer W and a look-ahead region corresponding thereto from the synchronization shaping signals. The information on the average value and the inclination angle is supplied to the stage control unit 513 through the main control unit 507 at a nearly real time, and the stage control unit 513 performs auto-focusing and auto-leveling so as to bring the exposure region 516 on the wafer W into agreement with the imaging plane of the projection optical system PL during the scanning exposure in the manner as described above.

Then, in FIG. 29, the laser interferometers and the moving mirrors disposed actually in a two-dimensional way are represented herein each as a laser interferometer 524 and a moving mirror 524m, respectively. Therefore, an example of a specific disposition of the laser interferometers and the moving mirrors on the wafer side in this embodiment will be described with reference to FIGS. 34 and 35.

Figure 34:
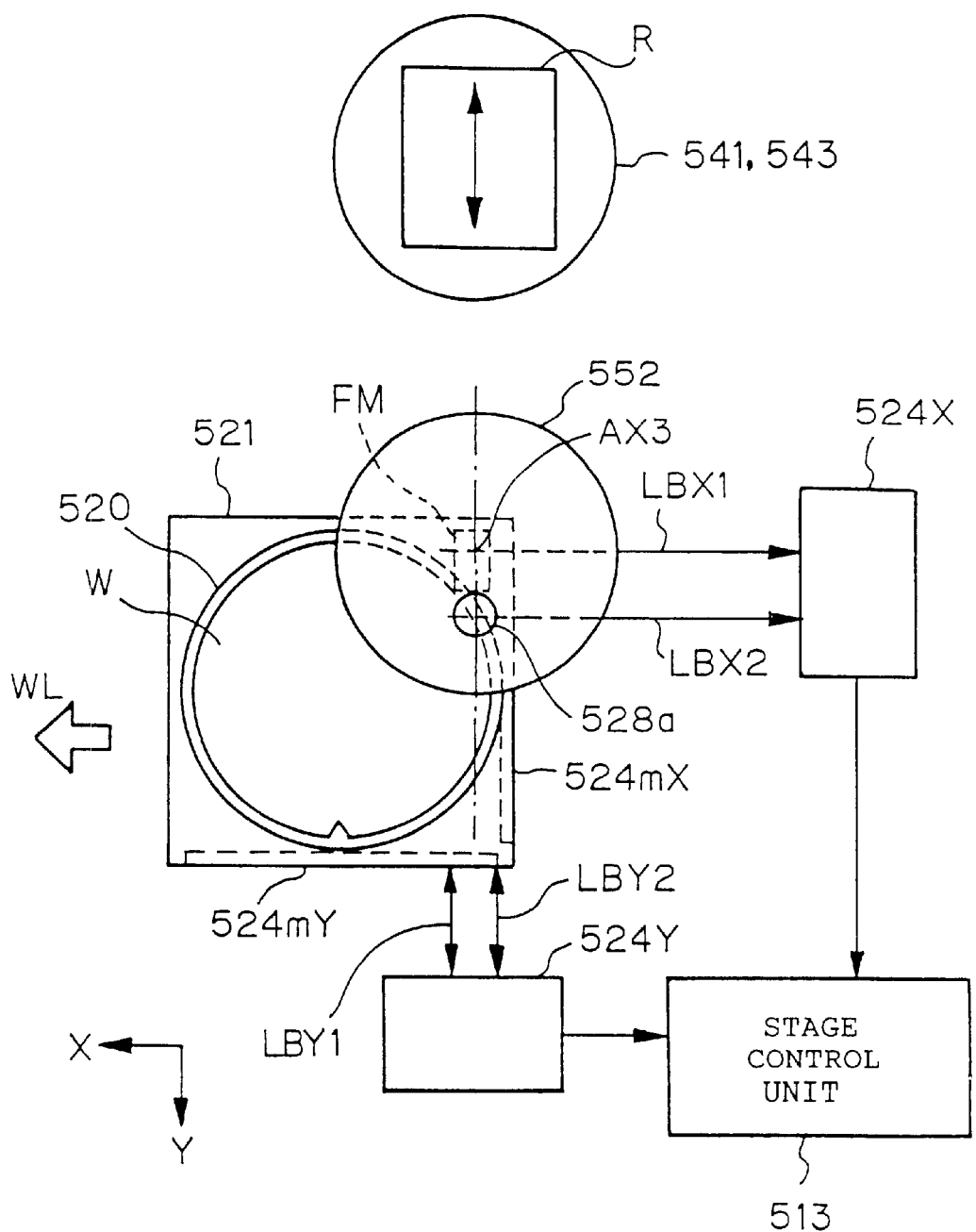
FIG. 34 is a plan view showing the relationship between a laser interferometer on the wafer side and the projection optical system as shown in FIG. 29.

FIG. 34 is a plan view showing the sample table 521 of FIG. 29 with the wafer W loaded thereon. In FIG. 34, an outer shape of the second object section 552 of the projection optical system PL as shown in FIG. 30 and the observation vision field 528a of the alignment sensor 528 of FIG. 32 as well as the outer shapes of the first object section 541 and the light axis turn section 543 and the reticle R are illustrated in an accurate position relationship. Further, FIG. 34 shows the state in which the light axis AX3 of the second object section 552 is located on the reference mark member FM on the sample table 521.

In this embodiment, as shown in FIG. 30, the column 525 between the first object section 541 and the light axis turn section 543 of the projection optical system PL, and the second object section 552 is of a secure structure in order to increase rigidity, so that it is difficult to locate the laser interferometer between them. Further, there is no space wide enough to effect air conditioning by means of downflowing along the light axis of the laser interferometer, even if the laser interferometer could be interposed between them, so that the system has to be configured such that the structure of the laser interferometer becomes likely to undergo influences from fluctuation of air.

In order to avoid influences from fluctuation of air, in this embodiment, as shown in FIG. 34, the laser interferometers are disposed on the side opposite to the light axis turn section 543 with respect to the second object section 552 of the projection optical system PL, i.e., in the +Y-direction and −X-direction with respect to the second object section 552. In FIG. 34, a moving mirror 524mY having a reflecting plane perpendicular to the Y-axis is fixed to the side surface portion in the +Y-direction of the sample table 521, and a moving mirror 524mX having a reflecting plane (perpendicular to the X-axis) intersecting at a right angle with the reflecting plane of the moving mirror 524mY is fixed to the side surface portion in the −X-direction of the sample table 521. Moreover, the X-axis laser interferometer 524Y is disposed so as to face the Y-axis moving mirror 524mY, and tri-axial laser beams are irradiated from the laser interferometer 524 onto the moving mirror 524mY in a direction parallel to the Y-axis. FIG. 34 shows the biaxial laser beams LBY1 and LBY2, among the tri-axial laser beams, arranged at a predetermined interval in the X-direction, the biaxial laser beams LBY1 and LBY2 being disposed so as to pass through the light axis AX3 of the second object section 552 and the center of the observation vision field 528a of the alignment sensor 528 and then through the positions symmetrical to the straight line parallel to the Y-axis.

Figure 35A:
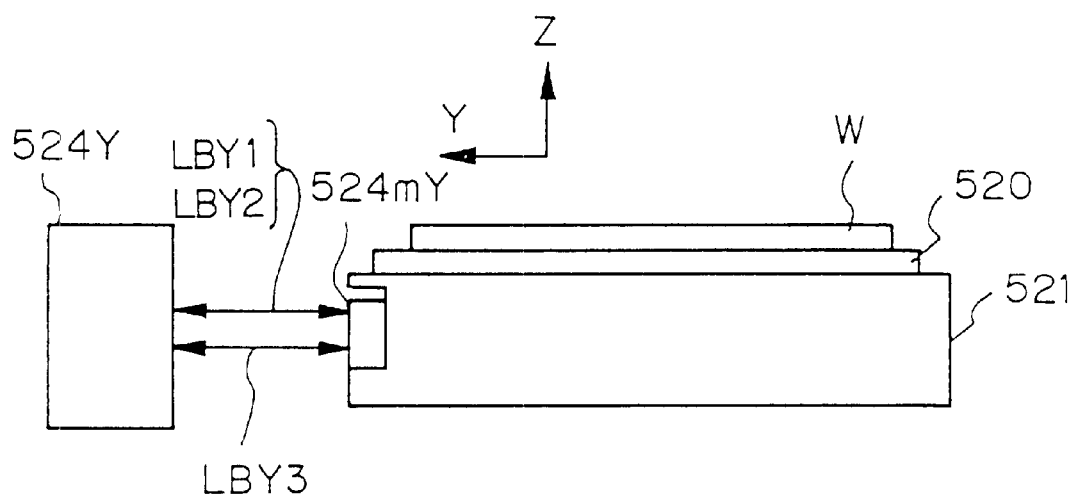
FIGS. 35a–b shows a portion of a sample table; in which (a) is a side view of the sample table 521 of FIG. 34, when looked in the +X-direction, and (b) is a perspective view showing triaxial laser beams incident to a moving mirror 524mY.
Figure 35B:
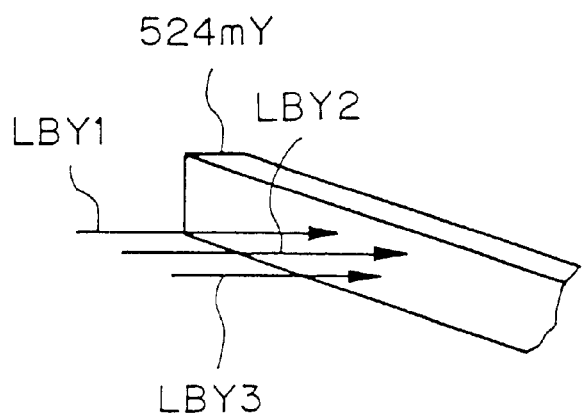

Further, FIG. 35(a) is a side view of the sample table 521 of FIG. 34, when looked in the +X-direction. As shown in FIG. 35(a), the third-axial laser beams LBY3 are irradiated at a predetermined Z-directional interval with respect to the bi-axial laser beams LBY1 and LBY2 on the moving mirror 524mY in a direction parallel to the Y-axis from the laser interferometer 524Y. As shown in FIG. 35(b), the laser beams LBY3 passes through an intermediate position in the X-direction between the biaxial laser beams LBY1 and LBY2. Then, at the laser interferometer 524Y, the Y-coordinates Y1, Y2 and Y3 of the tri-axial laser beams LBY1, LBY2 and LBY3, respectively, are always detected at a resolution of approximately 0.001 μm and output to the stage control unit 513. The stage control unit 513 gives, for example, an average value of the Y-coordinates Y1 and Y2 and a difference between the such two Y-coordinates as the Y-coordinate of the sample table 521 and the yawing angle, respectively. Upon measuring the yawing angle, a correction for a curvature of the moving mirror 524mY is also effected.

Moreover, in FIG. 34, the X-axial laser interferometer 524X is disposed so as to face the X-axially moving mirror 524mX, and tri-axial laser beams are irradiated onto the moving mirror 524mX in a direction parallel to the X-axis from the laser interferometer 524X. FIG. 34 shows bi-axial laser beams LBX1 and LBX2 arranged at a predetermined Y-directional interval, out of the tri-axial laser beams, and those laser beams LBX1 and LBX2 pass along the light axis AX3 of the second object section 552 through a light path parallel to the X-axis and on the center of the observation vision field 528a of the alignment sensor 528 through a light path parallel to the X-axis, respectively.

In addition, like FIGS. 35(a) and 35(b), the tri-axial laser beams are irradiated at a predetermined interval in the Z-direction with respect to the bi-axial laser beams LBX1 and LBX2 onto the moving mirror 524mX in a direction parallel to the X-axis from the laser interferometer 524X. Then, the laser interferometer 524X always detects the X-coordinates X1 and X2 corresponding to the bi-axial laser beams LBX1 and LBX2 and the X-coordinate X3 corresponding to the remaining mono-axial laser beams at a resolution of approximately 0.001 μm and outputs those coordinates to the stage control unit 513. Further, the stage control unit 513 sets the X-coordinate X1 corresponding to the light axis AX3 as the X-coordinate of the sample table 521 upon exposure to the wafer W, on the one hand, and the X-coordinate X2 corresponding to the center of the observation vision field 528a as the X-coordinate of the sample table 521 upon alignment, on the other. This allows a so-called Abbe's error resulting from a deviation of the position between the position of a measuring object and the measuring axis to become substantially zero each upon exposure and upon alignment, so that the position can be detected with high precision. In addition, like the Y-axial moving mirror 524mY, a correction of a curvature of the moving mirror 524mX can also be performed on the basis of the two X-coordinates X1 and X2.

As a result, in this embodiment, as shown in FIG. 34, the laser interferometers 524Y and 524X are disposed in the +Y-direction and −X-direction, respectively, with respect to the sample table 521 and the projection optical system PL composed of the light axis turn section 543, the second object section 552 and so on is also disposed along the −Y-direction with respect to the sample table 521. This configuration allows a space on the side in +X-direction (in the direction symmetrical to the laser interferometer 524X) with respect to the sample table 521 to be utilized. Therefore, in this embodiment, a wafer conveyance system containing a wafer loader WL for loading wafers on or unloading them from the sample table 521, or the like, is disposed on the side in the +X-direction with respect to the sample table 521.

This configuration allows air conditioning as downflowing onto the light path of laser beams from the laser interferometers 524X and 524Y. More specifically, air or the like having a uniform distribution of temperature and velocity, are blown from above, for example, the laser beams LBY1, LBY2, LBX1, and LBX2, onto a floor surface on which the projection exposure apparatus is disposed, and then is recovered at the floor surface, thereby performing air conditioning by downflowing. This air conditioning provides the advantages that influences from fluctuation of air in the light path of laser beams upon the laser interferometers 524X and 524Y can be reduced, and precision for measuring, for example, the position of the sample table 521 and the yawing angle thereof can be improved.

Turning again to FIG. 35(a), the sample table 521 may be made of ceramics, and the moving mirror 524mY (the moving mirror 534mX, too) may be made of ceramics equal to the material for the sample table 521. The moving mirror 524mY is fixed to the side surface of the sample table 521 through a fixing screw, although not shown. On the other hand, the wafer W is held on the sample table 521 through the wafer holder 520, so that the position of the wafer W is deviated in the Z-direction with respect to the positions of the light axes of the laser beams LBY1 and LBY2 from the respective laser interferometer 524Y. If problems such as pitching or otherwise would occur in the sample table 521 due to this deviation, the positional deviation is caused to due to the so-called Abbe's error by an amount AY between the Y-coordinate measured by the laser interferometer 524Y and the actual Y-coordinate of the sample table 521 (more precisely, the wafer W). Therefore, in this embodiment, an inclination angle Δθ around the X-axis of the sample table 521 is computed from a difference between an average value (Y1+Y2)/2 of the Y-coordinates Y1 and Y2 to be measured by the laser beams LBY1 and LBY2 and the Y-coordinate Y3 to be measured by the laser beams LBY3 passing through the position deviated in the Z-direction with respect to the laser beams LBY1 and LBY2, respectively. Then, the Abbe's error resulting from the difference between the height of the wafer W and the height of the laser beams LBY1 and LBY2 is corrected by correcting the average value of the Y-coordinates to be measured by the laser beams LBY1 and LBY2 on the basis of the inclination angle Δθ.

Likewise, for the X-axial laser interferometer 524X, the Abbe's error contained in the measured values by the laser beams LBX1 and LBX2 is corrected by using the measured value of the third-axial laser beams.

By adopting the way of mounting the moving mirrors 524mY and 524mX on the side surfaces of the sample table 521, the space above the moving mirrors 524mY and 524mX can be effectively utilized, for instance, for locating an end portion of the wafer holder 520 therein, and so on. As a consequence, the entire size of the sample table 521 can be reduced and the entire weight thereof can be made lighter, so that performance for controlling the apparatus can be improved at the time of the scanning and aligning the wafer W.

Moreover, in usual cases, complicated processing for ceramic material requires a long time so that costs for manufacturing become very expensive. Therefore, in this embodiment, although the moving mirrors 524mY and 524mX as well as the sample table 521, each requiring a high precision on the plane, are made of the same ceramic material and each is manufactured separately, followed by uniting those parts together. This can simplify the shape of the individual part and consequently reduces costs for manufacturing those parts as a whole. Further, in the case where a management of temperature is rendered difficult, a material having a small expansion coefficient, such as ZERODURE, etc., yet lower in rigidity, may also be used as substitute for ceramics.

Although the alignment sensor 528 of an off-axis type as used in the modes of the embodiments as described above is of an image pickup type (FIA type), alignment sensors of other types may also be adopted, which type includes a laser step alignment (LSA) type for relatively scanning slit-shaped laser beams and a wafer mark arranged in dot line or a two-light flux interference type (LIA type) adapted so as to detect the position on basis of a phase of interference light composed of a pair of diffraction light generating in the identical direction from the wafer mark by irradiating two coherent light fluxes onto the wafer mark in the form of a diffraction grating. Further, in the modes of the embodiments as described above, imaging characteristics are corrected by driving the optical system in the projection optical system PL, however, instead of the such correction, the imaging characteristics can be corrected by using a variable mechanism for pressure of gases present among the given lenses within the projection optical system PL or a variable temperature mechanism.

Further, in the modes of the embodiments as described above, the illumination region 515 on the reticle R is formed of a rectangular shape, however, it is not restricted to such a rectangular shape, and it may be of an arc-shaped shape or any appropriate shape. As in the modes of the embodiments as described above, however, in the case where the illumination region 515 is of a rectangular shape that is nearly in contact with the effective illumination vision field, the pattern region of the reticle R has to be of a rectangle shape, too, so that this configuration can provide the advantage that the length of scanning the reticle R can be shortened.

Moreover, in the modes of the embodiments as described above, the scanning type projection exposure apparatus is used. It should be noted, however, that a projection exposure apparatus of a type (a so-called stepper) for exposing the reticle and the wafer in a state they are stayed still. Furthermore, the projection optical system PL is not restricted to a reflection-refraction type and may include an optical system of a refraction type or of a reflection type.

As described above, it should be understood that the present invention is not restricted to the modes of the embodiments as illustrated above and encompasses any modifications and variations not departing from the scope and spirit of the present invention.

What is claimed is:

1. An exposure method for irradiating a mask with an illumination light through an illumination optical system and exposing photosensitive substrate to the illumination light through a projection optical system; comprising the steps of:

supplying gas having less absorption of the illumination light to a light path of the illumination light, at least a portion of the illumination optical system and the projection optical system; and changing an exposing condition for the photosensitive substrate in accordance with a variation in transmittance or in reflectance of at least one of the illumination optical system and the projection optical system, resulting from irradiation of the illumination light and attenuation of the illumination light in the light path.

2. The method as claimed in claim 1, wherein an image characteristic of a pattern on the mask is further adjusted in accordance with a variation in an imaging characteristic of the projection optical system attendant upon the variation in transmittance or reflectance.

3. The method as claimed in claim 1, wherein the gas having less absorption of the illumination light is nitrogen or helium gas.

4. The method as claimed in claim 3, wherein the gas having less absorption of the illumination light flows forcedly into the light path.

5. The method as claimed in claim 1, wherein attenuation of the illumination light is caused by substrates present in the light path, which absorb the illumination light.

6. An exposure method comprising:

supplying gas having less absorption of an exposure light to a housing which forms a light path of an exposure light between a light source and a photosensitive substrate and which houses optical elements disposed in the light path;

filling the light path with the gas; and changing an exposing condition for the substrate in accordance with an energy of the exposure light passed through the light path, which varies according to substances present in the light path which absorb the exposure light, and to a variation in the characteristics of the optical elements or a membrane material deposited on a surface of the optical element.

7. The method as claimed in claim 6, wherein the substances which absorb the exposure light include a material which differs from the membrane material deposited on the surface of the optical elements.

8. The method as claimed in claim 7, wherein the substances which absorb the exposure light result from a substance present in the light path.

9. The method as claimed in claim 6, wherein the housing houses an illumination optical system, comprised of a combination of the optical elements, which irradiates the mask on which a pattern is formed with the exposure light from the light source; and wherein the gas having less absorption of the exposure light is supplied to a space between the optical elements.

10. The method as claimed in claim 9, wherein the variation in the energy includes a variation in attenuation factor of the illumination optical system.

11. The method as claimed in claim 9, wherein the illumination optical system comprises at least one of reflection optical elements which reflect the exposure light and transmission optical elements which transmit the exposure light, as the optical elements.

12. The method as claimed in claim 6, wherein the housing houses a projection optical system, comprised of a combination of the optical elements, which projects a patten formed on the mask onto the substrate, and wherein the gas having less absorption of the exposure light is supplied to a space between the optical elements.

13. The method as claimed in claim 12, wherein the variation in the energy includes a variation in attenuation factor of the projection optical system.

14. The method as claimed in claim 12, wherein the projection optical system comprises at least one of reflection optical elements which reflect the exposure light and transmission optical elements which transmit the exposure light, as the optical elements.

15. The method as claimed in claim 6, wherein the variation in the energy is computed on the basis of the energy prior to passing through the housing and the energy after passing through the housing.

16. The method as claimed in claim 6, wherein the gas having less absorption of an exposure light flows into the lightpath.

17. The method as claimed in claim 16, wherein the gas having less absorption of an exposure light is an inert gas.

18. The method as claimed in claim 6, wherein the exposure light comprises an ultraviolet, and wherein the substances which absorb the exposure light comprise impurities which contain at least one of water molecules and hydrocarbon molecules.

19. The method as claimed in claim 6, wherein the substrate and the mask are scanned relative to a field of the projection optical system.

20. The method as claimed in claim 19, wherein the exposing condition comprises at least one of an intensity of the exposure light on the substrate, a velocity for scanning the substrate, and a width of an illumination region of the exposure light relating to a scanning direction of the substrate.

21. The method as claimed in claim 19, wherein the exposure light is a pulse light, and wherein the exposing condition is set by adjusting at least one of an oscillating frequency of the pulse light, and intensity of the exposure light on the substrate, a velocity for scanning the substrate, and a width of an illumination region of the exposure light relating to a scanning direction of the substrate.

* * * * *